(12) United States Patent
Sieber et al.

(10) Patent No.: US 9,711,333 B2
(45) Date of Patent: Jul. 18, 2017

(54) NON-PLANAR RADIAL-FLOW PLASMA TREATMENT SYSTEM

(71) Applicant: Eastman Kodak Company, Rochester, NY (US)

(72) Inventors: Kurt D. Sieber, Rochester, NY (US); Ronald Steven Cok, Rochester, NY (US); Gary Alan Kneezel, Webster, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 78 days.

(21) Appl. No.: 14/704,317

(22) Filed: May 5, 2015

(65) Prior Publication Data
US 2016/0329191 A1 Nov. 10, 2016

(51) Int. Cl.
*H01J 37/32* (2006.01)
*C23C 16/455* (2006.01)
*H05H 1/24* (2006.01)
*H05H 1/46* (2006.01)

(52) U.S. Cl.
CPC ...... *H01J 37/32449* (2013.01); *C23C 16/455* (2013.01); *H01J 37/32082* (2013.01); *H01J 37/32348* (2013.01); *H01J 37/32357* (2013.01); *H01J 37/32825* (2013.01); *H05H 1/2406* (2013.01); *H05H 1/46* (2013.01); *H05H 2001/2481* (2013.01); *H05H 2001/4652* (2013.01)

(58) Field of Classification Search
None
See application file for complete search history.

(56) References Cited

U.S. PATENT DOCUMENTS

| 5,198,724 A | 3/1993 | Koinuma et al. |
| 5,961,772 A * | 10/1999 | Selwyn ............ H01J 37/32192 118/723 ER |
| 5,977,715 A * | 11/1999 | Li .................. H05B 41/28 219/121.36 |
| 6,730,238 B2 | 5/2004 | Li et al. |

(Continued)

OTHER PUBLICATIONS

Bardos, L. et al., "Radio Frequency Hollow Cathode Source for Large Area Cold Atmospheric Plasma Applications", *Surface and Coatings Technology*, 133-134 (2000) pp. 522-527.

(Continued)

*Primary Examiner* — Douglas W Owens
*Assistant Examiner* — Srinivas Sathiraju
(74) *Attorney, Agent, or Firm* — David A. Novais; William R. Zimmerli

(57) ABSTRACT

An atmospheric-pressure plasma treatment system includes a plasma source including at least one electrode, a gas in a gas chamber, and an AC power supply that supplies power to the at least one electrode to form a plasma in the gas. A radial-flow surface has a jet nozzle through which the gas flows and the radial-flow surface has a surface profile that conforms to a nonplanar treatment surface of an object. The radial-flow surface is separated from the nonplanar treatment surface by a gap that is less than 2 times a diameter of the jet nozzle so that the gas flows radially outward from the nozzle and between the radial-flow surface and the nonplanar treatment surface.

26 Claims, 21 Drawing Sheets

(56) References Cited

U.S. PATENT DOCUMENTS

| | | | | |
|---|---|---|---|---|
| 7,633,231 | B2* | 12/2009 | Watson | H05H 1/46 219/121.36 |
| 8,328,982 | B1 | 12/2012 | Babayan et al. | |
| 8,329,982 | B2 | 12/2012 | Kyle et al. | |
| 8,552,335 | B2* | 10/2013 | Rego | H05H 1/2406 219/121.52 |
| 8,643,173 | B1* | 2/2014 | Rau | H05K 7/2029 165/80.4 |
| 2002/0129902 | A1* | 9/2002 | Babayan | C23C 16/402 156/345.45 |
| 2009/0122941 | A1* | 5/2009 | Engemann | H01L 41/107 376/145 |
| 2014/0123897 | A1* | 5/2014 | Tabata | H01J 37/32348 118/723 E |
| 2014/0162338 | A1* | 6/2014 | Schaefer | H05H 1/2406 435/173.1 |
| 2016/0040293 | A1* | 2/2016 | Wainwright | C23C 18/1675 427/8 |

OTHER PUBLICATIONS

Baydar, E., "Confined Impinging Air Jet at Low Reynolds Numbers", *Experimental Thermal and Fluid Science*, 19 (199) pp. 27-33.
Baydar, E. et al., "An Experimental Investigation on Flow Structures of Confined and Unconfined Impinging Air Jets", *Heat Mass Transfer* (2006) 42, pp. 338-346.
Cavadas, A.S. et al., "Laminar Non-Newtonian Impinging Jet Flow Confined by Sloping Plane Walls", *Journal of Non-Newtonian Fluid Mechanics* 169-170 ('2012) pp. 1-14.
Chen, F.F., *Introduction to Plasma Physics and Controlled Fusion*, Second Edition, 1984 Plenum Press, New York.
Donaldson, C.D. et al., "A Study of Free Jet Impingement. Part 1. Mean Properties of Free and Impinging Jets", *J. Fluid Mech.* (1971), vol. 45, part 2, pp. 281-319.
Eliasson, B., "Nonequilibrium Volume Plasma Chemical Processing", *IEEE Transactions on Plasma Science*, vol. 19, No. 6, Dec. 1991.
Fitzgerald, J. A. et al., "A Study of the Flow Field of a Confined and Submerged Impinging Jet", *Int. J. Heat Mass Transfer*, vol. 41, Nos. 8-9 (1998), pp. 1025-1034.
Foest, R. et al., "Microplasmas, an Emerging Field of Low-Temperature Plasma Science and Technology", *International Journal of Mass Spectrometry* 248 (2006) pp. 87-102.
Garimella, S. V., "Heat Transfer and Flow Fields in Confined Jet Impingement", *Annual Review of Heat Transfer*, vol. 1 (2000), pp. 413-494.
Gillespie, D. R. H. et al., "A Comparson of Full Surface Local Heat Transfer Coefficient and Flow Field Studies Beneath Sharp-Edged and Radiused Entry Impinging Jets", Paper No. 96-GT-428, *International Gas Turbine and Aeroengine Congress and Exhibition*, Birmingham, UK, Jun. 10-13, 1996.

Glauert, M. B., "The Wall Jet", *J. Fluid Mech.* 1, 625, (1956).
Glynn, C., et al., Jet Impingement Cooling, (http://home.eps.hw.ac.uk/~tsol/Papers/417.pdf).
Itoh, H., "Discharge Plasmas Generated by Piezoelectric Transformer and Their Applications", 2005 (*XXVIIth ICPIG* Eindhoven, Netherlands, Jul. 18-22, 2005—web address: http://event.cwi.nl/icpig05/cd/D:/pdf/00-350.pdf).
Iza, F. et al., "Microplasmas: Sources, Particle Kinetics, and Biomedical Applications", *Plasma Process. Polym.* 5 (2008), pp. 322-344.
Kovaleski, S. D. et al., "Ultra-Compact Piezoelectric Transformer Charged Particle Acceleration", *Power MEMS* 2009, Washington, DC, USA Dec. 1-4, 2009.
Lieberman, M. A. et al., *Principles of Plasma Discharges and Materials Processing*, John Wiley & Sons, Inc., 1994.
Lytle, D. et al., "Air Jet Impingement Heat Transfer at Low Nozzle-Plate Spacings", Int. J. Heat Mass Transfer, vol. 37, No. 12, (1994) pp. 1687-1697.
Mukhopadhyay, S. et al., "Nanoscale Surface Modifications to Control Capillary Flow Characteristics in PMMA Microfluidic Devices", *Nanoscale Research Letters* (2011), 6:411.
Nehra, V. et al., "Atmospheric Non-Thermal Plasma Sources", *International Journal of Engineering*, vol. (2): Issue (1).
Papadakis, A. P. et al., "Microplasmas: A Review", *The Open Applied Physics Journal*, (2011), 4, 45-63.
Roth, J. R., *Industrial Plasma Engineering*, vol. 1: Principles, Institute of Physics Publishing, 1995.
Reuter, S. et al., "Controlling the Ambient Air Affected Reactive Species Composition in the Effluent of an Argon Plasma Jet", *IEEE Transactions on Plasma Science*, vol. 40, No. 11, Nov. 2012.
Rosen, C. A., "Ceramic Transformers and Filters", *Proc. Electronics Component Symp.* (1957) pp. 205.
Schutze, A., et al., "The Atmospheric-Pressure Plasma Jet: A Review and Comparison to Other Plasma Sources", *IEEE Transactions on Plasma Science*, vol. 26, No. 6, Dec. 1998, pp. 1685-1694.
Siow, K. S. et al., "Plasma Methods for the Generation of Chemically Reactive Surfaces for Biomolecule Immobilization and Cell Colonization—A Review", *Plasma Process. Polym.* (2006), 3, pp. 392-418.
Stark, R. H. et al., "Direct Current Glow Discharges in Atmospheric Air", *Applied Physics Letters*, vol. 74, No. 25 (1999), pp. 3770-3772.
Teranishi, K. et al., "High Efficiency Ozone Production by a Compact Ozoniser Using Piezoelectric Transformer", *International Conference on Phenomena in Ionized Gases, Proceedings*, 26th, Greifswald, Germany, Jul. 15-20, 2003 (2003), 3, pp. 191-192.
Goldman et al., "Corona Discharges", Gaseous Electronics, vol. 1, (Edited by Hirsh and Oskam) Academic Press, New York (1978).
Tong, X. C., Advanced Materials for Thermal Management of Electronic Packaging, chapter 10.

* cited by examiner

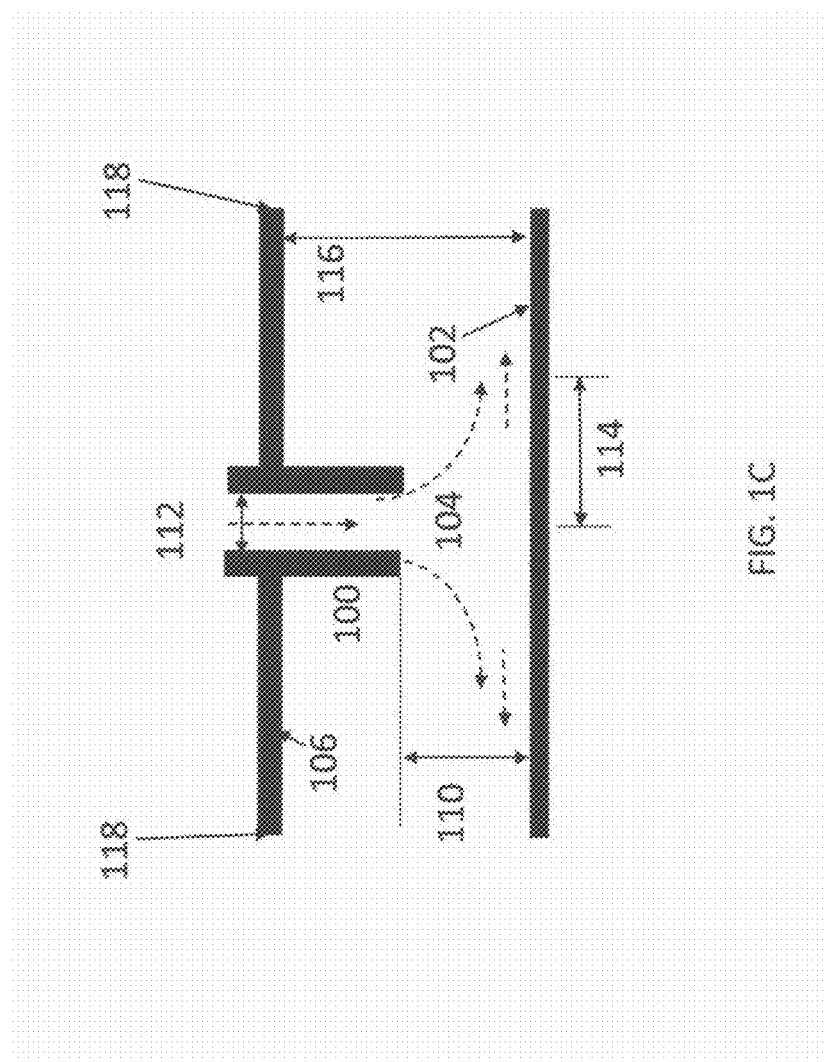

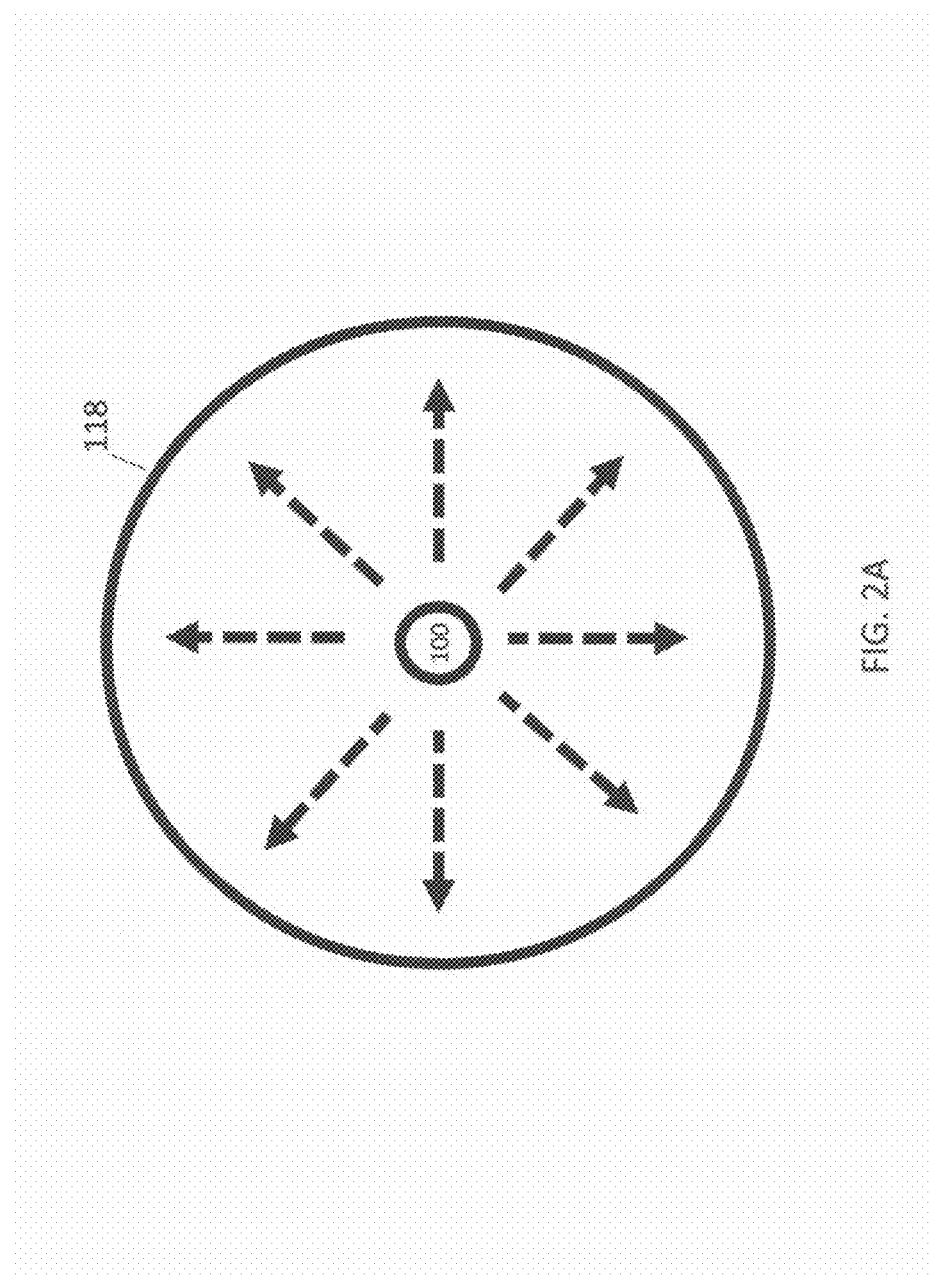

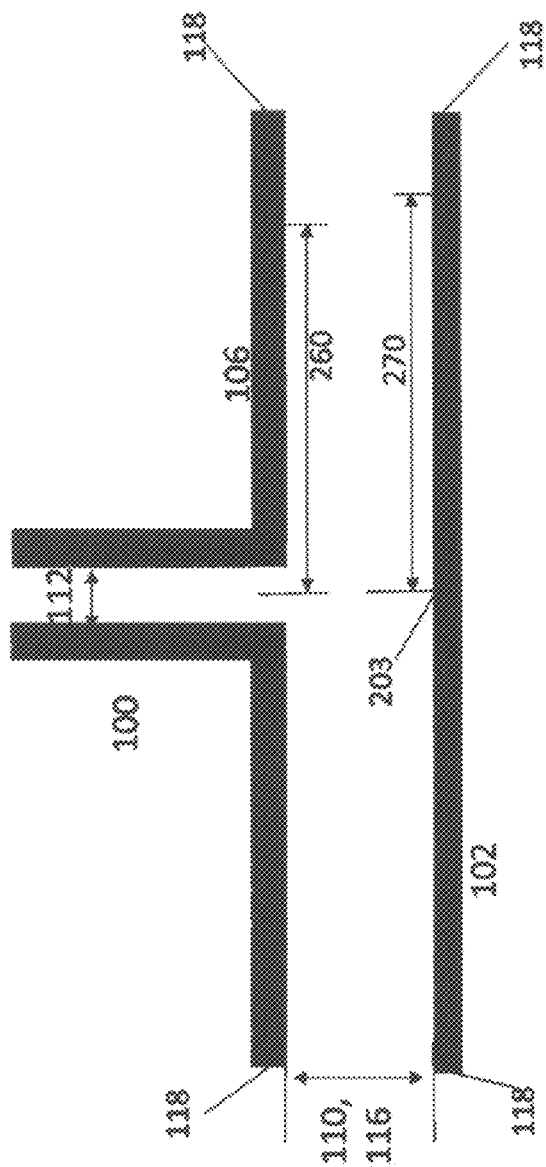

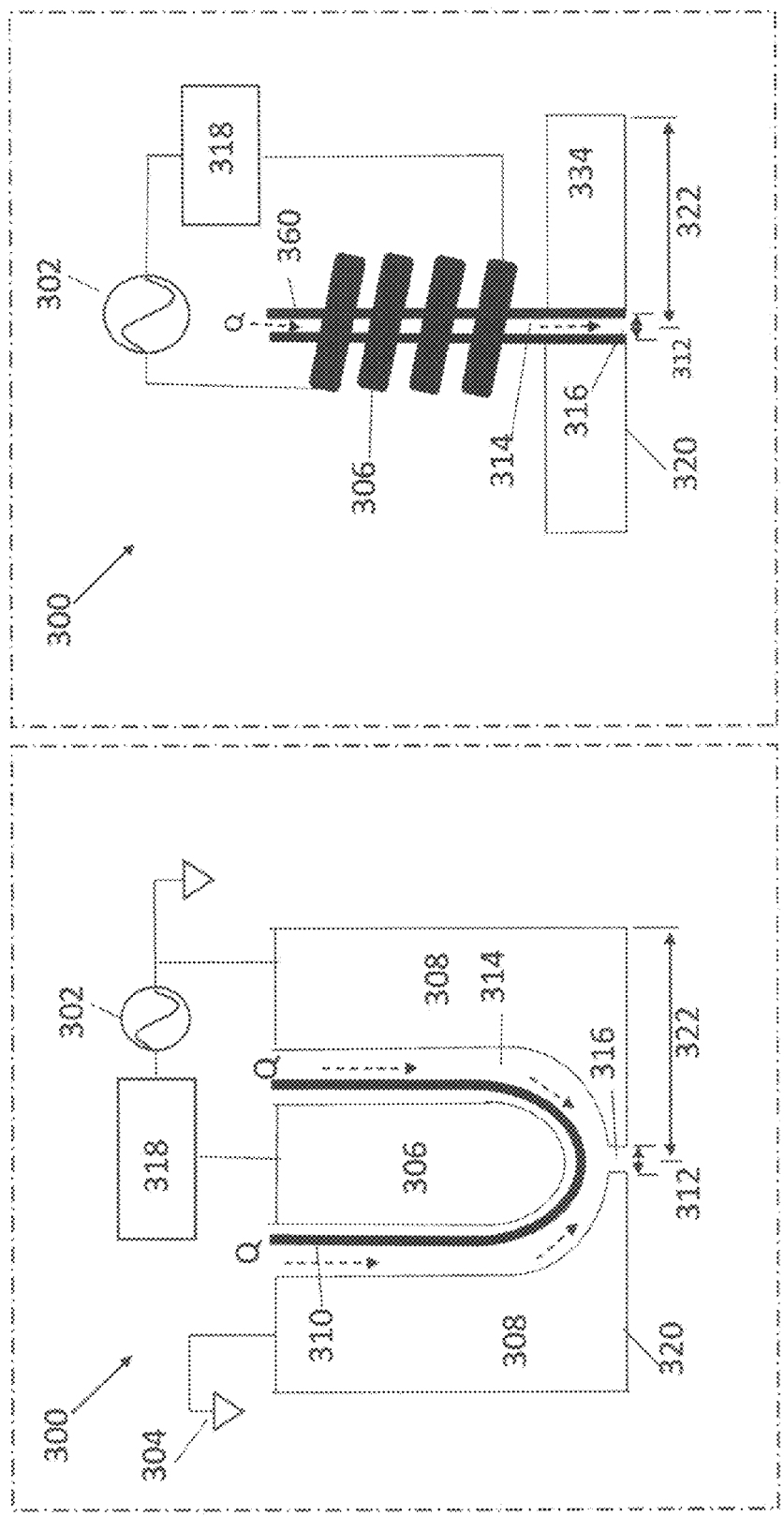

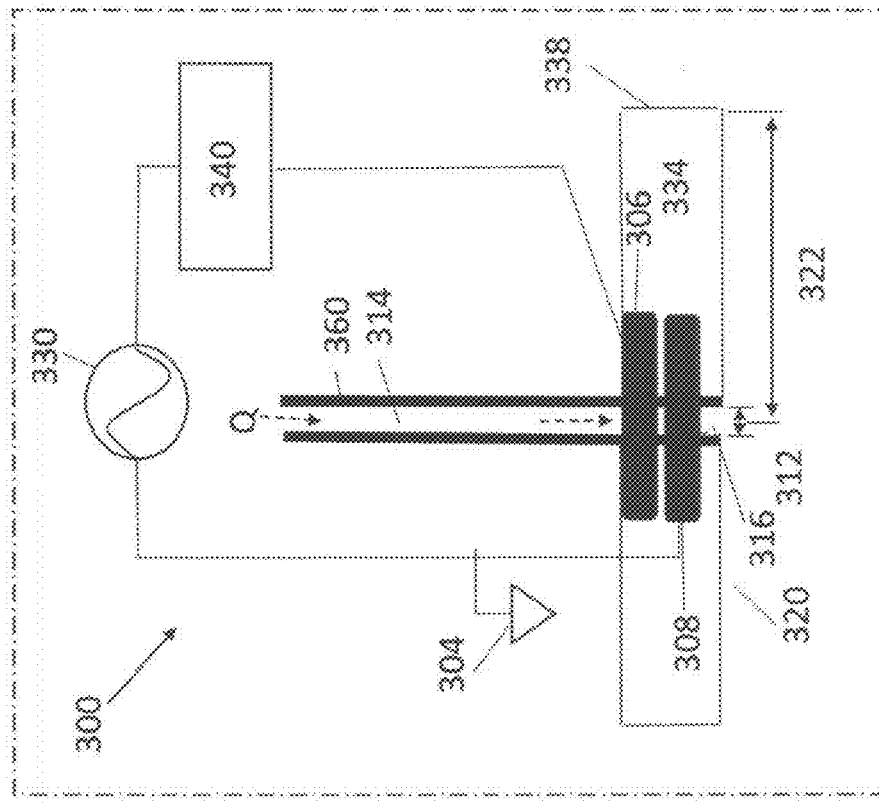
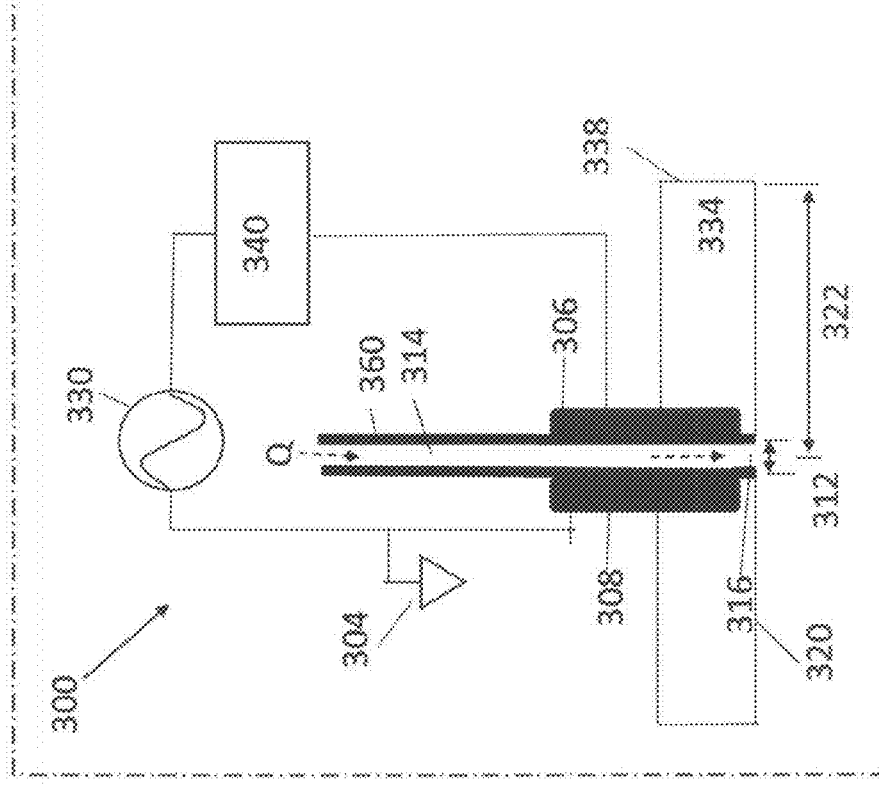

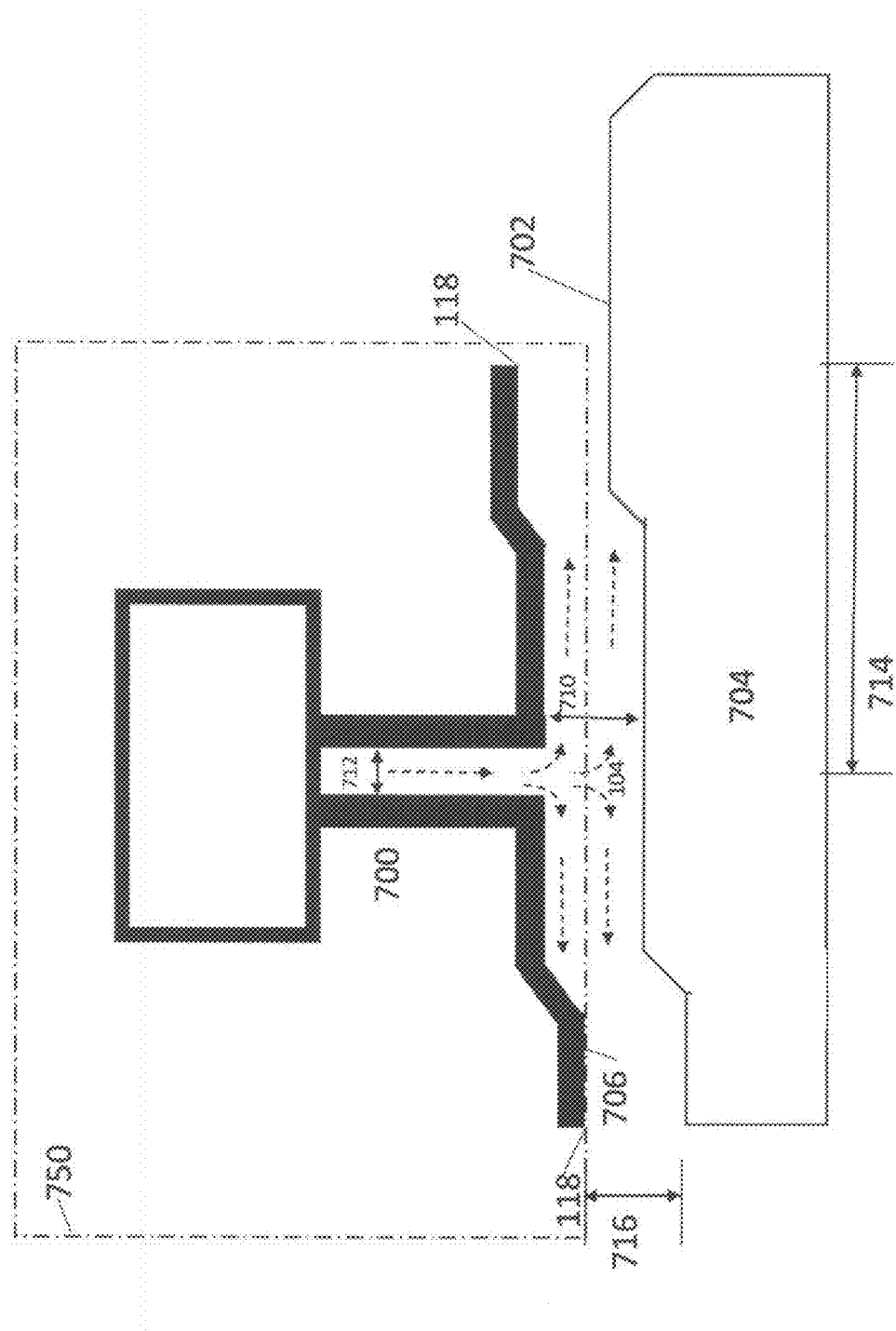

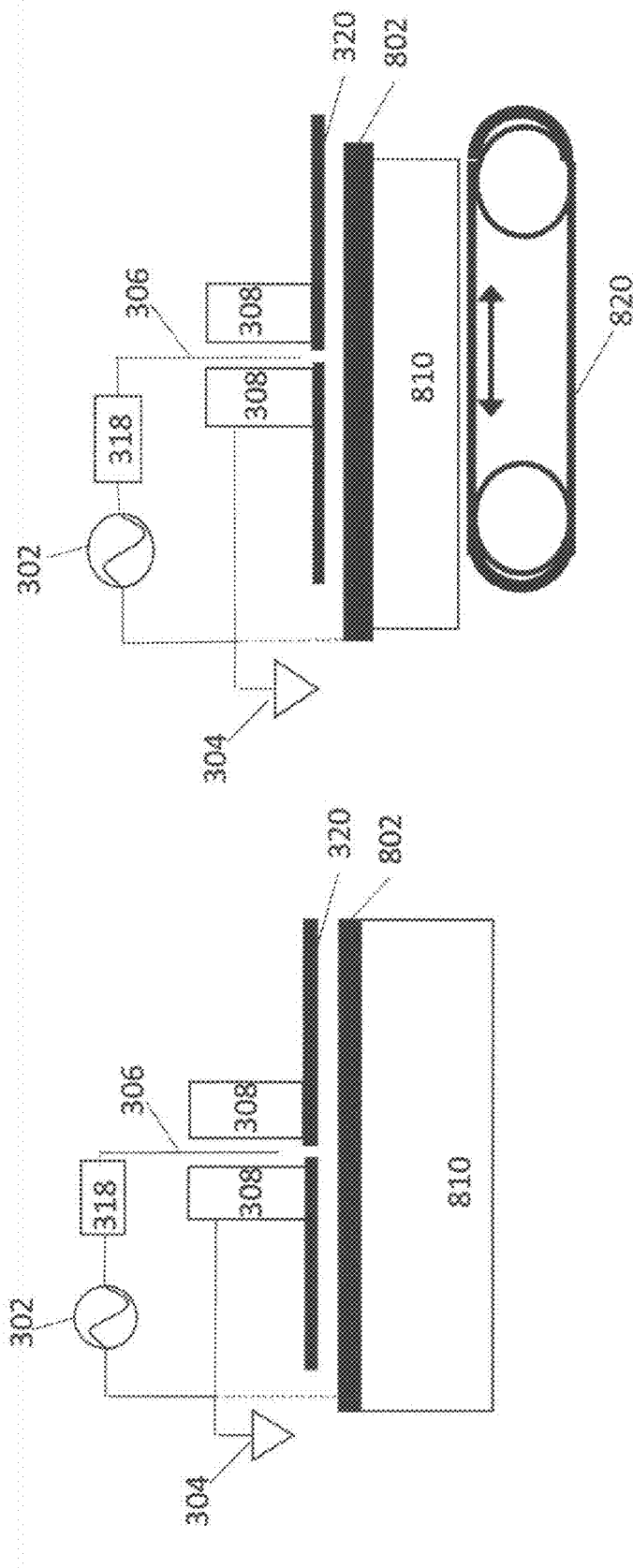

(12A) – Before any plasma cleaning (12B) – After 1st round of plasma cleaning (12C) – After 2nd round of plasma cleaning (12D) – After 3rd & 4th rounds of plasma cleaning

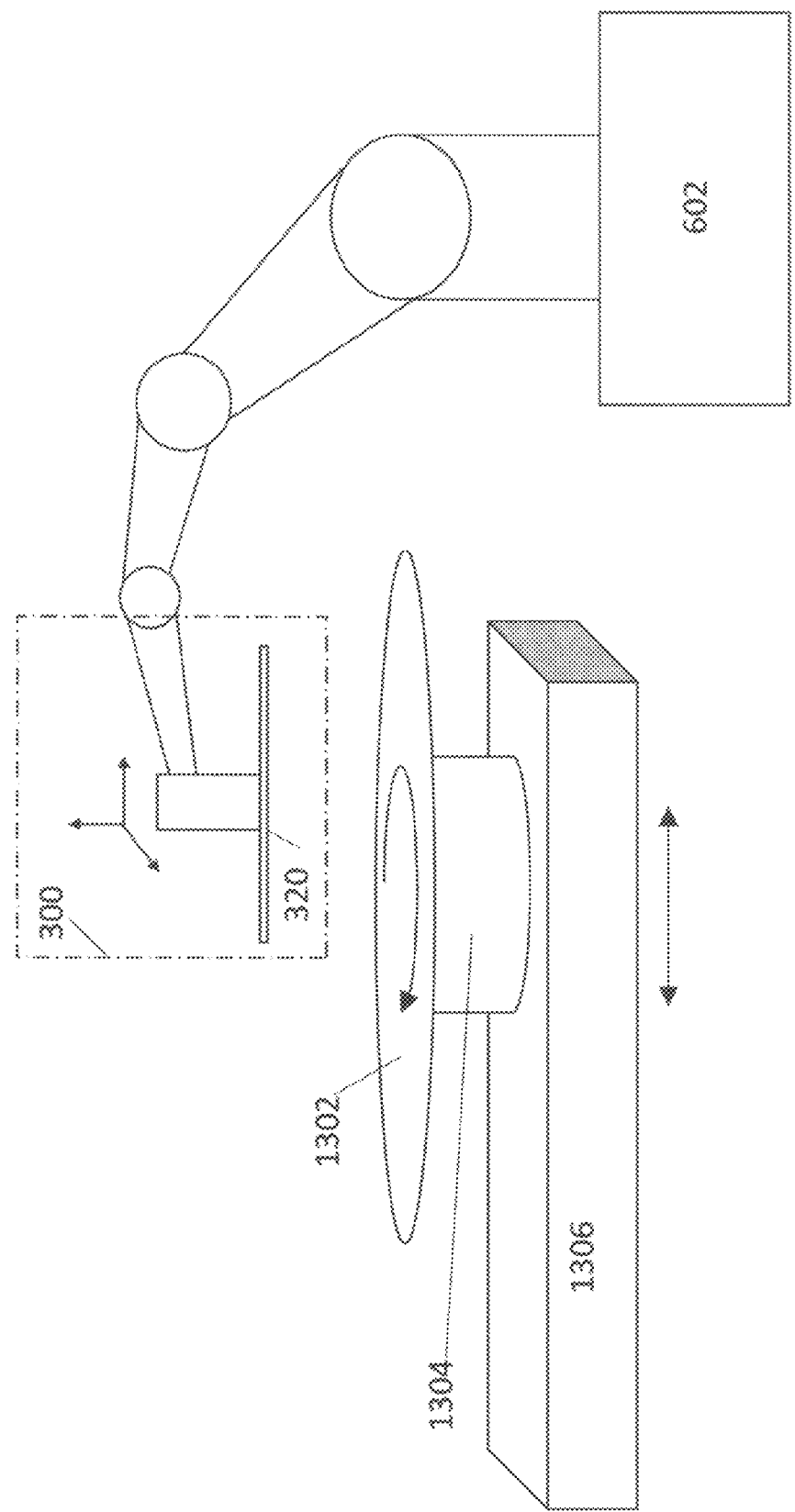

NON-PLANAR RADIAL-FLOW PLASMA TREATMENT SYSTEM

CROSS REFERENCE TO RELATED APPLICATIONS

Reference is made to commonly-assigned co-pending U.S. patent application Ser. No. 14/704,351, entitled "RADIAL-FLOW PLASMA TREATMENT SYSTEM", and Ser. No. 14/704,373, entitled "ATMOSPHERIC-PRESSURE PLASMA TREATMENT SYSTEM", all filed May 5, 2015.

FIELD OF THE INVENTION

The present invention relates to an apparatus for generating an atmospheric-pressure plasma, and a method of use of the apparatus for surface treatment and for coating substrates.

BACKGROUND OF THE INVENTION

Plasmas are employed in materials manufacturing for a diverse range of processes, including surface activation, etching, cleaning, sterilization, decontamination, and thin-film deposition. For example, U.S. Pat. No. 8,029,105 describes treating a printer component with a plasma. Plasmas operate either at low pressure, for example <5 Torr, or at atmospheric pressure, for example about 760 Torr (see for example, Lieberman and Lichtenberg, "Principles of Plasma Discharges and Materials Processing," John Wiley & Sons, Inc., New York, 1994; Chen, "Introduction to Plasma Physics and Controlled Fusion," Plenum Press, New York, 1984; and Roth, "Industrial Plasma Engineering: Vol. I, Principles" Institute of Physics Publishing, Philadelphia, Pa., 1995). The low-pressure devices are operated in a batch mode, and find wide application in semiconductor fabrication. By contrast, atmospheric-pressure plasmas can be operated in a continuous mode on an assembly line, and are more common in web conversion, automotive, aerospace, and specialty materials industries.

Low-temperature, atmospheric-pressure plasmas are weakly ionized discharges for which only a small fraction of the gas molecules become ionized (see Schutze, et al., "The Atmospheric-Pressure Plasma Jet: A Review and Comparison to other Plasma Sources," IEEE Transactions in Plasma Science, vol. 26, page 1685 (1998)). These systems are not at equilibrium, because the temperature of the free electrons is several orders of magnitude higher than the temperature of the neutral species. Several types of non-equilibrium, atmospheric-pressure plasmas have been developed over the years. These include coronas, dielectric barrier discharges, micro-hollow cathode discharges, and radio frequency (RF) powered capacitive discharges. Nehra, Kumar, and Dwivedi divide atmospheric non-thermal plasma sources into four categories: corona discharges, dielectric barrier discharges (DBD), atmospheric-pressure plasma jets (APPJ), and micro-hollow cathode discharges (MHCD) (V. Nehra, A. Kumar, and H. K. Dwivedi in International Journal of Engineering 2008 Vol (2) issue (1) p. 53-68 CSC open access journal).

A corona is an electrical discharge in which ionization takes place in a region of high electric field. The most common type of corona is the point-to-plane design, where one of the electrodes is a narrow wire or a metal tip and the other electrode is planar (see Goldman and Goldman, "Corona Discharges" Gaseous Electronics, vol. 1, (Eds: Hirsh and Oakam), Academic Press, New York, 1978). Power, at frequencies ranging from 50 Hz to 20 kHz, is supplied to the pointed electrode, creating a high electric field that promotes breakdown of the gas in the vicinity of the electrode. A localized, luminous discharge is created around the tip of the powered electrode. Since the plasma density falls rapidly away from the sharp tip, one must pass the substrate very close to the electrode for the substrate to be processed at a suitable rate. Therefore, this device is for the most part restricted to treating plastic film or fabric that is continuously passed through the plasma in a roll-to-roll format.

Dielectric barrier discharges, also known as "silent" discharges, operate with two metal electrodes, in which at least one is coated with a dielectric material. The metal electrodes are separated by a uniform gap, and are powered by direct current (DC) or alternating current (AC) at frequencies up to 50 kHz. In most cases, dielectric barrier discharges operate in a "filamentary" or "micro-discharge" mode, where the plasma exhibits short-lived micro arcs that are randomly distributed in space and time (see Eliasson and Kogelschatz, IEEE Transactions in Plasma Science, vol. 19, page 1063, 1991). A uniform, diffuse glow mode can be obtained in a dielectric barrier discharge if an inert gas such as helium, argon, or nitrogen is used as a diluent. The electron density in these plasmas varies over a wide range depending on whether the gas is sampled inside or outside a streamer. Nevertheless, the average electron density is low, about $10^9$ $cm^{-3}$, which means that, as with a corona, one must insert the substrate into the plasma between the electrodes to obtain a suitable surface treatment rate. Dielectric barrier discharges are primarily employed in the surface activation of plastic films and paper surfaces.

Micro-hollow-cathode discharges are direct-current glow discharges sustained between two parallel metal electrodes with a center opening of 0.1 mm in diameter in either the cathode, or the cathode and the anode (see Stark and Schoenbach, Applied Physics Letters, vol. 74, page 3770, 1999; and Bardos and Barankova, Surface Coating Technologies, vol. 133-134, page 522, 2000). The electrodes are separated by a gap of 0.2 to 0.4 mm, which is often filled with a dielectric material. Gas, such as argon, xenon, or air is passed through the hole where it is ionized by application of DC, or in a few cases, RF power. The plasma density is highest inside the hole at $10^{14}$ $cm^{-3}$, and quickly decreases in density outside of this region. Hollow-cathode discharges are mostly used as light sources and processing materials with these devices has been limited.

Capacitive discharges are also called capacitively coupled atmospheric-pressure plasmas and this type of atmospheric discharge also relies on small inter-electrode gaps to reduce the operating voltage required to sustain the plasma; however, capacitively coupled plasmas are driven by AC voltage and the plasma characteristics depend on the operating frequency. Below about 500 kHz atmospheric plasmas generally will be extinguished, meaning become non-conductive, between voltage cycles, partly due to the small mean free path of gaseous species at atmospheric pressure and partly due to the accelerated recombination kinetics occurring at atmospheric pressure. Above about 500 kHz atmospheric-pressure plasmas remain conducting through the entire AC voltage cycle. These observations have driven the considerable interest in discharges at atmospheric pressure operating at frequencies higher than about 500 kHz.

A non-equilibrium, atmospheric-pressure discharge can be produced by flowing gas between two closely spaced metal electrodes that are driven with high-frequency power (see Koinuma et al., U.S. Pat. No. 5,198,724; Li et al., U.S. Pat. Nos. 5,977,715 and 6,730,238; and Selwyn, U.S. Pat. No. 5,961,772). These plasmas have been used to process materials placed a short distance downstream of the electrodes.

In U.S. Pat. App. Pub. No. 2002/0129902 A1 entitled "Low-Temperature Compatible Wide-Pressure-Range Plasma Flow Device," dated Sep. 17, 2002, Babayan and Hicks describe an apparatus that comprises a housing with two perforated metal electrodes, Gas flows through the electrodes and is partially ionized by applying radio frequency power to one of the electrodes at 13.56 MHz. Radicals produced in the plasma flow out of the device and can be used to treat substrates placed a short distance downstream. It was observed that the etch rate of photoresist with an oxygen and helium plasma at 760 Torr was between 0.4 and 1.5 microns per minute over a circular area 30 mm in diameter. U.S. Pat. No. 8,328,982 by Babayan and Hicks entitled "Low-Temperature, converging reactive gas source and method of use" describes the construction of atmospheric-pressure plasma sources with shaped gas chambers that produce an inward converging flow of gas between electrodes in the plasma generating region towards the gas chamber outlet. U.S. Pat. No. 8,328,982 also discloses a type of precursor distributor for feeding one or more precursors chemicals into the gas flow from the plasma to introduce new and unique reactivity to the exiting gas flow.

Atmospheric-pressure plasma sources are remote plasma sources which means that the gas-phase reactive species generated in the plasma zone create a reactive fluid flow that exits the plasma source as a fluid flow and are transported by the fluid flow to the substrate surface. The fluid flow that transports the plasma-excited reactive gas is usually called a jet. The jet is typically directed to impinge on the surface of an opposing workpiece or substrate to treat the surface with the plasma-excited reactive gas.

There is extensive scientific literature in the art of heat transfer concerning jet impingement of compressible and incompressible fluids on a surface because of numerous industrial processes using impinging gas jets for heat transfer. The vast majority of industrial applications involve the use of jet impingement for cooling and more recently micro-jet impingement has been investigated for microelectronics cooling applications. Jet impingement is cost effective and extremely efficient and provides a simple method for achieving high heat transfer coefficients. Heat transfer studies of impinging jets focus on spatial characterization of the Nusselt number for the flow. The Nusselt number is the ratio of convective to conductive heat transfer for the flow at any point and is a measure of the effectiveness of heat transfer across a boundary. The Nusselt number by itself does not describe gas entrainment or the decay of plasma chemical species. The available information in the heat transfer art yields therefore does not anticipate how jet impingement configuration will affect a plasma chemical process.

The art of aeronautics has extensive literature concerning jet propagation and impingement. Fluid flow studies of impinging jets are of some value because these studies attempt to characterize the velocities fields of the flow. Donaldson and Snedeker commented that those skilled in the art of fluid mechanics of impinging jets understand that "Each free jet in its own particular laboratory has its own special idiosyncrasies" (C. Du P. Donaldson and R. S. Snedeker in J. Fluid Mech. (1971) 45(2), pp 281-319 quote taken from page 281 Introduction section). From this comment made by experts in the art of jet impingement fluid mechanics, it is clear that, although some general comments about a particular jet impingement configuration can be made, specific characteristics of a jet configuration for an application are not obvious and a particular jet impingement configuration cannot be predicted and must be empirically tested for efficacy.

Some of the first analytical work concerning outward radial flow of impinging gas jets was published in 1956 by M. B. Glauert (M. B. Glauert, "The Wall Jet" J. Fluid Mech. 1, 625, (1956)). Glauert focused on analytically describing the behavior of a free unimpeded subsonic jet of gas when the jet strikes a surface at right angles then radially spreads outward over it. This is known as free jet impingement. As the jet impinges on a surface a stagnation zone is formed underneath the jet and the pressure at the stagnation zone is essentially that of the jet itself. The jet spreads and flows over the stagnation zone and begins to flow over the surrounding surface. The velocity of this spreading fluid is somewhat less than the jet itself. Glauert called the radially spreading fluid a "wall jet" and attempted to analyze the behavior of the fluid flow, focusing specifically on the velocity profile of the fluid normal to the wall as it propagates across the wall surface. As the fluid flows along the wall surface, boundary and shear layer interactions occur that eventually result in the detachment of the wall jet from the surface. The wall jet detachment is characterized by an increase in turbulence of the flow around the detachment point as the wall jet fluid mixes with the fluid above it. Glauert's analysis of free jet impingement and wall jet behavior is often thought of as a starting point for understanding the mass and heat transfer that result from free and confined jet impingement.

Garimella (S. V. Garimella, Annual Rev of Heat Transfer vol. 11, (2000), Chapter 7 on pp. 413-494, "Heat Transfer and Flow Fields in Confined Jet Impingement") characterized the heat transfer properties of confined jet impingement in various configurations. For example, Fitzgerald and Garimella (J. A. Fitzgerald and S. V. Garimella, Int. J. Heat Mass Transfer, 41 (8-9) (1998), pp. 1025-1034, "A study of the flow field of a confined and submerged impinging jet") used laser Doppler velocimetry of confined submerged jets to examine the turbulent toroidal recirculation patterns found in the transition zone that are a unique characteristic of incompressible confined submerged jets.

U.S. Pat. No. 8,643,173 describes the use of confined jet impingement in a cooling apparatus with surface enhancement features that are used to induce bubble nucleation of a cooling fluid for enhanced heat transfer integrated into power electronics modules.

Lytle and Webb (D. Lytle and B. W. Webb, Int. J. Heat Mass Transfer 37(12) (1994) 1687-1697, "Air jet impingement heat transfer at low nozzle-plate spacings") studied the heat transfer of free jet impingement using jets of air at low nozzle-plate spacings and used Doppler laser velocimetry to establish the characteristics of confined outward radial flow when the gas between the two flow confining surfaces is small relative to the nozzle diameter. The Reynolds number (Re) of the jet was between 3600 and 27600 and the fluid behavior was considered incompressible because the gas velocities used in the study are subsonic and significantly below Mach 1 (the speed of sound). Sonic and supersonic gas velocities found in underexpanded jets suggest that the fluid be treated as compressible to take into account the formation of shock.

Lytle and Webb studied the behavior of free jet impingement with respect to the dimensionless parameter z/d. The dimensionless parameter z/d is the ratio of the spacing between the confinement surfaces 101 to the diameter of the jet emitting nozzle 112. The geometry used by Lytle and Webb was identical to FIG. 1A. Lytle and Webb made several important observations:

1) Gas entrainment occurs due to accelerated flow outward at the nozzle edge that is especially pronounced at z/d<0.25.

2) Virtually no gas entrainment was observed at z/d>0.5 for Re<15000.

3) Sub-atmospheric-pressure regions are formed just outside the nozzle edge at low nozzle plate spacing (z/d=0.1) with high Re numbers (13000). The radial dependence of the static pressure of the radial flow shows that as z/d is decreased the radial dependence of the pressure drop becomes more pronounced. The investigators attribute this to a vena contracts effect where the fluid emerging from the jet nozzle accelerates as it propagates into the surrounding free space and the local acceleration of the jet causes the jet to temporarily decrease in volume because the fluid pressure drops during the acceleration. There is also a further local acceleration of the fluid during outward radial expansion after impingement. The sub-atmospheric-pressure regions formed at high Reynolds numbers are associated with gas entrainment into the core of the jet.

4) Increased heat transfer efficiency at nozzle to plate spacings that are less than 1 nozzle diameter are associated with localized flow acceleration near the nozzle edge and with increased turbulence at radial positions outside the nozzle edge that are likely associated with detachment of the wall jet from the impingement surface.

Lytle and Webb's observations of free jet impingement fluid flow suggest that free jet impingement is disadvantaged for delivery of reactive species in a fluid flow to an object surface—primarily because of gas entrainment. Decreasing the nozzle to object surface distance should improve transport of reactive species to the surface but Lytle and Webb's study show that the same conditions lead to increased gas entrainment into the jet. Gas entrainment into a jet containing reactive species is highly undesirable because secondary reactions can decrease the concentration of reactive species in the fluid flow. Although no gas entrainment is observed at larger z/d for low Reynolds numbers, at the lower Reynolds number (Re) the mass transport of a reactive species to the surface is slower and the distance the reactive species must traverse to the impingement surface is high. As a result, secondary reactions between reactive species in the jet can decrease the concentration of the reactive species in the fluid flow. As expected, experimental observations reported in the scientific literature show that etching and the surface modification effectiveness for free jet configurations of atmospheric-pressure plasma sources is low for large z/d and low Re. As mentioned previously, although the sub-atmospheric-pressure region observed outside the nozzle edge is indicative of enhanced mass transport of the wall jet, the rapid pressure drop associated with radial expansion of the free jet impingement is experimentally demonstrated to be turbulent and subject to gas entrainment of the surrounding air. Under these conditions, the enhanced mass transport provided by the wall jet is tempered by the enhanced secondary reactions of the reactive species with entrained gas and the latter reactions dominate the reactive gas chemistry when turbulence is present. Moreover, the improved heat transfer observed at radial positions outside the nozzle edge indicates increased mass transport to and from the surface but the mass transport enhancement is due to turbulent mixing of the shear layer above the wall jet as the wall jet detaches from the surface. As a result, the transport of reactive species to the surface is not favored. Virtually all known atmospheric-pressure plasma sources in the prior art employ a free jet impingement configuration.

Gillespie et al reported a flow field and heat transfer study of confined jet impingement of air jets using an experimental configuration that modeled the impinging jets at higher Reynolds numbers used for cooling in jet turbine engines (D. R. H. Gillespie, S. M. Guo, Z. Wang, P. T. Ireland, and S. T. Kohler, paper number 96-GT-428, International Gas Turbine and Aeroengine Congress and Exhibition, Birmingham, UK, Jun. 10-13, 1996, "A comparison of full surface local heat transfer coefficient and flow field studies beneath sharp-edged and radiused entry impinging jets"). Gillespie et al used a fixed nozzle to plate distance (z/d) for the confined jet of approximately 1.25 and investigated the pressure and flow characteristic of outward radial flow at Reynolds numbers between 16000 and 40000. Heat transfer measurements indicated the presence of a transition region at r/d=1.2 that was interpreted as being associated with turbulence occurring during the transition from the stagnation zone to the wall jet. The static pressure distribution measurements indicated a sub-atmospheric-pressure region associated with the wall jet that is formed several nozzle diameters outside the edge of the nozzle, although there was no interpretation or commentary on these characteristics of confined jet impingement.

Baydar (E. Baydar, Experimental, Thermal, and Fluid Science 19(1999) 27-33, "Confined impinging air jet at low Reynolds numbers") investigated confined jet impingement of air jets at low Reynolds numbers. Baydar investigated confined jet impingement over a Reynolds number range of 300 to 10000 and a nozzle diameter-to-plate spacing ratios ranging from 0.5 to 4. The report documents the observation of sub-atmospheric-pressure region on the impingement plate for z/d<2 for Reynolds numbers greater than about 2700. This work established a lower limit for the conditions under which sub-atmospheric-pressure regions can be observed during confined jet impingement.

Baydar and Ozmen (E. Baydar, Y. Ozmen; Heat and Mass Transfer, February 2006, Volume 42, Issue 4, pp 338-346, "An experimental investigation on flow structures of confined and unconfined impinging air jets") investigated the flow characteristics of both confined and unconfined air jets impinging normally onto a flat plate using a smoke-wire technique to visualize the flow behavior. The mean and turbulence velocities and surface pressures were measured for Reynolds numbers ranging from 30,000 to 50,000 and nozzle-to-plate spacings in the range of 0.2-6. They concluded that confined impingement jets always show a flow region with sub-atmospheric pressure whilst there is no evidence of the sub-atmospheric region in unconfined impinging jet in the experimental space examined.

Cavadas et al (A. S. Cavadas, F. T. Pinho, J. B. L. M. Campos, Journal of Non-Newtonian Fluid Mechanics, 169-170 (2012), 1-14) studied the impinging jet flow confined by sloping plane walls and showed that the essential features of the impinging jet are retained even in the presence of non-uniform spacing between the confining surfaces.

All known atmospheric-pressure plasma and microplasma sources appear to use unimpeded free flowing jets as a method to deliver the reactive species from the plasma to the surface of the object to be treated. However, such free flowing jets are subject to severe gas entrainment that often require the use of a supplemental barrier such as an inert gas curtain or a physical enclosure in order to ensure that the plasma-excited reactive gas flow has sufficient reactive species present when impinging on a surface. Furthermore, ambient gas entrainment into the plasma-excited gas flow is a serious problem for atmospheric-pressure plasma sources and known solutions, such as physical enclosures and gas curtains, are cumbersome. At present there is no other known method for addressing gas entrainment for atmospheric-pressure plasma sources. Thus, simple, realistic solutions to the gas entrainment problem and to improving the mass transport of plasma-excited reactive gases to a substrate surface at atmospheric pressure are lacking.

There is a need for an atmospheric-pressure plasma source with an improved jet impingement configuration that enables more effective delivery of a plasma-generated reactive species to the surface of an object. There is also a need for a low-temperature, atmospheric-pressure plasma source that generates an uncontaminated flux of reactive gas that can be delivered to a surface in an efficient manner so that the plasma-generated species can be used to rapidly treat both flat and 3-dimensional substrates of any size or shape. Furthermore, inefficient mass transport of plasma-excited reactive gases to a substrate surface is a hindrance to the further development of atmospheric-pressure plasma technology.

SUMMARY OF THE INVENTION

According to an embodiment of the present invention, an atmospheric-pressure plasma treatment system comprises:

a plasma source including at least one electrode, a gas in a gas chamber, and an AC power supply that supplies power to the at least one electrode to form a plasma in the gas; and a radial-flow surface having a jet nozzle through which the gas flows, the jet nozzle having a nozzle diameter, wherein the radial-flow surface has a surface profile that conforms to a nonplanar treatment surface of an object, the radial-flow surface separated from the nonplanar treatment surface by a gap that is less than two times the nozzle diameter so that the gas flows radially outward from the nozzle and between the radial-flow surface and the nonplanar treatment surface.

The present invention provides improved structures and methods for applying plasma treatments to nonplanar surfaces.

BRIEF DESCRIPTION OF THE DRAWINGS

The above and other features and advantages of the present invention will become more apparent when taken in conjunction with the following description and drawings wherein identical reference numerals have been used to designate identical features that are common to the FIGS., and wherein:

FIGS. 1A-1C are cross sections illustrating different embodiments of the present invention;

FIGS. 2A-2E illustrate various views of radial flow in an embodiment of the present invention;

FIGS. 3A-3D are cross section of plasma sources for different embodiments of the present invention;

FIG. 7 is a cross section illustrating an embodiment of the present invention;

FIGS. 8A-8C are schematic cross sections illustrating various embodiments of the present invention;

FIG. 13 is a perspective illustrating an embodiment of the present invention;

Figure 1B:
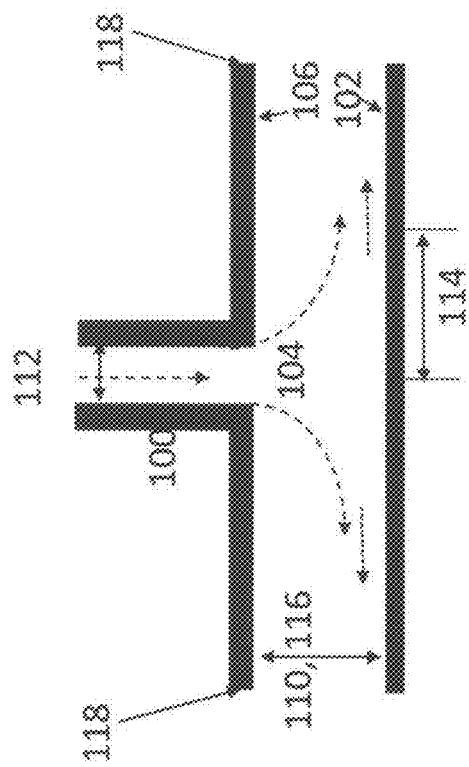

The figures are not drawn to scale since the variation in size of various elements in the figures is too great to permit depiction to scale.

DETAILED DESCRIPTION OF THE INVENTION

To overcome the limitations in the prior art, and to overcome other limitations that will become apparent upon reading and understanding the specification, the present invention can be directed to new devices, systems, and methods for generating plasmas and treating surfaces of objects at atmospheric pressure and temperatures below 600 degree C.

In general, atmospheric-pressure plasma and microplasma sources use unimpeded free flowing jets as method to deliver reactive species from the plasma to the surface of the object to be treated. Although there is a recognition that jet nozzle design can affect the performance of atmospheric-pressure plasma and micro-plasma sources, it is not recognized by those skilled in the art that there are different configurations of fluid jet impingement that can be employed to improve heat transfer, mass transfer, and eliminate gas entrainment. The present invention is directed to the design and use of atmospheric-pressure plasma sources with confined jet impingement and confined outward radial flow of wall jets that produces improved surface treatment performance and reduced gas entrainment due to the integration of a radial-flow surface into the design of the atmospheric-pressure plasma or micro-plasma system.

In particular, the invention is related to an apparatus for generating a low-temperature, atmospheric-pressure plasma and a method of use, wherein the plasma source geometry is suitable for confined jet impingement of a jet of plasma-excited reactive gas and for producing an outward radial flow of reactive gas species at the substrate surface as a result of a confined jet impingement of the plasma source effluent. The fluid flow produced by the confined jet impingement eliminates ambient gas entrainment and results in fast transport of reactive species to the surface and is therefore well suited for plasma processing substrate surfaces. The confined jet impingement is produced by integrating a radial-flow surface and a jet nozzle into the atmospheric-pressure plasma source so that, when the plasma source is brought proximate to the surface of an object, the fluid flow from the jet nozzle is confined between the radial-flow surface and the object surface.

As has been demonstrated, confined jet impingement is most effective when the distance separating the radial-flow surface and the object surface is less than two times the jet nozzle diameter and when the continuous surface area of radial-flow surface is larger than or equal to a circle with radius, also called an effective minimum radius, of ten times the nozzle diameter. The invention is further related to an atmospheric-pressure plasma source with a precursor distributor for injecting volatile chemical precursors into a plasma excited gas jet during confined jet impingement of the jet for the purpose of surface modification and/or plasma treatment of an object. The invention is further related to specialized products and processes that employ the atmospheric-pressure plasma system for generating the low temperature, atmospheric-pressure plasma for plasma processing.

A typical embodiment of the inventive atmospheric-pressure plasma treatment system, comprises: a plasma source including at least one electrode, a gas in a gas chamber, and a tunable AC power supply that supplies electrical power to the at least one electrode to form a plasma in the gas; a radial-flow surface having a jet nozzle with a diameter through which the gas flows that enables confined jet impingement of the gaseous fluid from the plasma, wherein the radial-flow surface has a surface profile that conforms to a treatment surface of an object. The radial-flow surface has an effective minimum radius that is at least ten times greater than the jet nozzle diameter. The radial-flow surface is separated from the treatment surface by a substantially constant gap that is less than or equal to two times the jet nozzle diameter to form a confining channel so that the gas flows radially outward from the jet nozzle in the confined narrow channel volume between the radial-flow surface and the nonplanar treatment surface during confined jet impingement of the gas from the plasma on the surface of the object.

In another embodiment, the inventive atmospheric-pressure plasma treatment system, comprises: a plasma source including at least one electrode, a gas in a gas chamber, and a tunable AC power supply that supplies power to the at least one electrode to form a plasma in the gas; a planar radial-flow surface having a jet nozzle through which the gas flows that enables confined jet impingement of the gaseous fluid from the plasma, wherein the planar radial-flow surface has a surface profile that substantially conforms to a planar treatment surface of an object, the radial-flow surface being separated from the treatment surface by a substantially constant gap to form a confining channel so that confined jet impingement of the gas from the plasma takes place on the surface of the object and the gas flows radially outward from the jet nozzle in the confined narrow channel volume between the radial-flow surface and the planar treatment surface.

In one embodiment, the inventive atmospheric-pressure plasma treatment system, comprises: a plasma source including at least one electrode, a gas in a gas chamber, and a tunable AC power supply that supplies power to the at least one electrode to form a plasma in the gas; a non-planar radial-flow surface having a jet nozzle through which the gas flows that enables confined jet impingement of the gaseous fluid from the plasma, wherein the non-planar radial-flow surface has a surface profile that substantially conforms to a non-planar portions of the treatment surface of an object, the non-planar radial-flow surface being separated from the non-planar treatment surface by a substantially constant gap to form a confining channel so that confined jet impingement of the gas from the plasma takes place on the surface of the object and the gas flows radially outward from the jet nozzle in the confined narrow channel volume between the non-planar radial-flow surface and the non-planar treatment surface. In a further embodiment the confined radial flow of the gas extends over only a portion of the nonplanar treatment surface.

In one embodiment the radial-flow surface having the radial flow is a disk. In another embodiment the radial-flow surface having the radial flow is not a disk. The radial-flow surface having the radial flow can be arbitrarily shaped as long as it has surface continuity and discontinuities do not disrupt the radial flow.

In one embodiment the object with a treatment surface is rigid. In one embodiment the object with a treatment surface is not rigid. In one embodiment the object with a treatment surface is a web. In one embodiment the object with a treatment surface is a polymer. In one embodiment the object with a treatment surface is electrically conducting. In one embodiment the object with a treatment surface is electrically non-conducting.

The gas chamber of the plasma source includes a housing with an inlet and outlet and a tunable high-frequency power source that is connected to a first electrode, the first electrode being located internal to the gas chamber, or optionally external to the gas chamber. In one embodiment the first electrode is electrically isolated from the housing. In another embodiment the first electrode is part of the housing. Gas flows into the gas chamber proximate to the first electrode, and then out through the outlet of the device. The outlet of the gas chamber is in fluid communication with a jet nozzle. In various embodiments the jet nozzle diameter is less than or equal to 4 mm, 1 mm, 100 microns, 1 micron, or 100 nm. The high-frequency electrical power is applied to the first electrode to excite the gas that is proximate to the first electrode and form a plasma. In one embodiment the AC power supply is tunable and operates between 1 kHz and 1 GHz. In an embodiment, a load match between the electrode and the high-frequency power supply is used to improve the efficiency of electrical power transfer when the plasma is lit. In another embodiment, the high-frequency electrical power is applied to the first electrode to excite the gas that is proximate to the first electrode and form a micro-plasma. When more than one electrode or a plurality of electrodes is used, at least one of the additional electrodes is grounded. In an embodiment the atmospheric-pressure plasma system includes three electrodes. In one embodiment, a second electrode forms a radial-flow surface with a jet nozzle in fluid communication with the gas chamber, the radial-flow surface being used to provide a confinement surface for confined jet impingement. In a further embodiment, the second electrode has a potential that is either earth ground or different from earth ground.

The outlet end of the housing is configured in such a way as to form a radial-flow surface with a jet nozzle in fluid communication with the gas chamber outlet, the jet nozzle being located within the radial-flow surface and providing a means through which gas from the gas chamber can flow to form a fluid jet. Upon applying electrical power to the first electrode, the gas breaks down, forming a uniform, low-temperature plasma. The plasma gas flows out through the outlet of the gas chamber and through the jet nozzle of the radial-flow surface. In one embodiment, the radial-flow surface has a surface profile that conforms to a nonplanar treatment surface of an object and the radial-flow surface is separated from the nonplanar treatment surface by a substantially constant gap so that the gas flows radially outward from the jet nozzle in the confined narrow channel volume between the radial-flow surface and the nonplanar treatment surface. In an embodiment, the radial-flow surface has a surface profile that conforms to a planar treatment surface of an object and the radial-flow surface is separated from the planar treatment surface by a substantially constant gap so that the gas flows radially outward from the jet nozzle in the confined narrow channel volume between the radial-flow surface and the planar treatment surface.

In one embodiment, the AC power supply for the atmospheric-pressure plasma or micro-plasma source is tunable and operates between 1 kHz and 1 GHz. Radio frequency power at frequencies of 400 kHz and higher is well suited for this invention, although other frequencies can be employed for specific applications, as would be obvious to those skilled in the art of plasma treatment.

The present invention is further embodied in a method of treating the surfaces of objects of any size and shape with the low-temperature, atmospheric-pressure plasma. The method comprises flowing a gas through a gas chamber in fluid communication with an jet nozzle in a radial-flow surface, the gas chamber being proximate to at least one electrode, applying high-frequency electrical power to the electrode so as to strike and maintain a low-temperature, atmospheric-pressure plasma, flowing the plasma-excited reactive gas through the gas chamber and jet nozzle located in a radial-flow surface and positioning a substrate proximate to the radial-flow surface so that jet of gas from the jet nozzle impinges on the substrate in a confined manner known as confined jet impingement, the reactive gas flowing out of the jet nozzle in the radial-flow surface being forced into confined outwardly expanding divergent radial flow such that the reactive gas contacts the substrate and treats its surface. The invention is further embodied in a method of treating surfaces with the low-temperature, atmospheric-pressure plasma, wherein the treatment causes the surface to be activated, chemically modified with the incorporation of new chemical functional groups and moieties, cleaned, sterilized, etched, or coated with a film having a different chemical composition from that of the untreated object surface.

In an embodiment of the plasma device the housing has one or more electrodes as part of the gas chamber. One embodiment comprises a plasma device having a first electrode having an inlet for a gas, a second electrode having an outlet for the gas and disposed proximate to the first electrode to form a gap in between the first and second electrode that forms a gas chamber. Another embodiment comprises a plasma device having a first electrode and a second electrode, the second electrode having an inlet and an outlet for the gas and disposed proximate to the first electrode to form a gap therebetween that forms a gas chamber. The gas flows into the gas chamber formed by the gap between the first and second electrodes and flows out the outlet. A variety of electrode configurations can be employed for capacitively coupled atmospheric-pressure plasma sources. For example, Babayan and Hicks in U.S. Pat. No. 8,328,982 describe different electrode configurations that are useful in the design of capacitively coupled atmospheric-pressure plasma sources. In an embodiment of the atmospheric-pressure plasma system one or more of the electrodes are covered by an insulating dielectric layer and the gap between the two electrodes is stabilized by physical spacers. Capacitively coupled high-frequency electrical power is applied between the first electrode and the second electrode to generate a plasma within the gas flow and form a plasma-excited reactive gas with plasma-generated gas species. The outlet of the second electrode is in fluid communication with a jet nozzle in a radial-flow surface located proximate to an object at a substantially constant distance over the entire radial-flow surface to form a confined jet impingement so that the plasma-excited reactive gas jet with plasma-generated gas species is a confined impingement jet on the opposing surface that produces confined outwardly expanding divergent radial flow that allows impingement of the reactive gas from the plasma on a surface of the opposing object. The opposing object is also called a substrate or a workpiece.

Another embodiment of the present invention comprises a plasma device including a non-electrically conducting gas chamber having an inlet for a gas, an outlet for the gas and an electrode disposed proximate to the gas chamber. In one embodiment the electrode is coil shaped and surrounds the gas chamber. The gas flows into the gas chamber and flows out the outlet. Inductively coupled high-frequency electrical power is applied to the electrode to generate a flowing plasma-excited reactive gas in the gas chamber. The outlet of the gas chamber is in fluid communication with a jet nozzle in a radial-flow surface located proximate to the surface of an object at a substantially constant distance over the entire radial-flow surface to form a confined jet impingement so that the plasma-excited reactive gas jet with plasma-generated gas species is a confined impingement jet on the opposing surface that produces confined outwardly expanding divergent radial flow that allows impingement of the reactive gas from the plasma on a surface of the opposing object wherein the radial-flow surface and the treatment surface maintains a radial flow of plasmas-generated gas species.

Another embodiment of the present invention comprises a plasma device including an electrically non-conducting gas chamber having an inlet for a gas, an outlet for the gas in fluid communication with a nozzle in a radial-flow surface, a first electrode and a second electrode located proximate to the gas chamber, and a piezoelectric electric element that is a transformer. The piezoelectric transformer can optionally be an integral part of the gas chamber as described by Engemann and Tesche in U.S. Pat. Pub. No. 2009/0122941. Piezoelectric transformers or piezo-transformers are also known as Rosen piezo-transformers and are described in numerous publications including the article by C. A. Rosen in Proc. Electronics Component Symp. (1957) pp 205. The Rosen piezo-transformer provides a compact means for stepping up an AC input voltage that is generally less than or equal to 50 V in amplitude or less than 100V peak-to-peak to a high voltage when the power requirements on the high-voltage secondary side are not excessive. The large electric field generated at the piezo-transformer high voltage secondary electrode is sufficient to light a plasma within the gas flow. A gas flows into the gas chamber, is excited by the electric field supplied by the high voltage on the secondary side of the piezoelectric transformer element to form a plasma-excited reactive gas with plasma-generated gas species, and flows out the gas chamber outlet. The gas chamber outlet is in fluid communication with a jet nozzle in a radial-flow surface located proximate to the surface of an object at a substantially constant distance over the entire radial-flow surface to form a confined impingement jet of the plasma-excited reactive gas with plasma-generated gas species emanating from the jet nozzle onto the opposing treatment surface producing confined outwardly expanding divergent radial flow that allows impingement of the reactive gas from the plasma on a surface of the opposing object. The radial-flow surface and the treatment surface maintain a radial flow of plasma-generated gas species.

In another embodiment, the atmospheric-pressure plasma system incorporates a micro-plasma. In a further embodiment, the atmospheric-pressure plasma system incorporates a precursor distributor in fluid communication with the gas chamber outlet and jet nozzle for feeding one or more precursor chemicals into the gas flow proximate to the gas chamber outlet and the radial-flow surface such that the plasma excited reactive species with plasma-generated gas species in the gas flow from the plasma causes the one or more precursor chemicals to decompose and deposit a film on the surface of an object after the reactive gas with precursor chemicals impinges on the surface of the object as a confined impinging jet in a confined jet impingement on an opposing surface with confined outward radial flow thereby allowing film deposition on the object.

In one embodiment, a method of surface treatment includes: 1) positioning the radial-flow surface of the plasma device with radial-flow surface proximate to the surface of an object at a substantially constant distance over the entire radial-flow surface, for example within 10%, 5%, or 1%; 2) flowing a gas through an inlet of a gas chamber, flowing the gas through the gas chamber proximate to at least one electrode; and 3) applying high-frequency electrical power to at least one electrode while the gas is flowing through the gas chamber to generate a plasma within the gas flow such that a plasma-excited reactive gas with plasma-generated gas species from the plasma flows through a jet nozzle located in a radial-flow surface that is in fluid communication with the gas chamber outlet the gas flow emanating as a confined impinging jet onto the opposing surface of the proximate object. The radial-flow surface is proximate to the object surface and produces a confined jet impingement configuration and the confined impingement jet of the reactive gas of the plasma impinges on the opposing surface and then flows outward with a confined radial-flow pattern in the narrow channel between the radial-flow surface and the treatment surface of the object to be treated so that the reactive gas impinges on the object surface proximate to and opposite the radial-flow surface, thereby enabling surface treatment of the surface of the proximate object. The radial-flow surface and the treatment surface maintains a radial flow of plasmas-generated gas species. Typically, the surface treatment is carried out at substantially atmospheric pressures and/or at temperatures below 500 degree C.

In an embodiment the method includes feeding one or more precursor chemicals into the gas flow proximate to the jet nozzle located in the radial-flow surface while the plasma is lit such that the reactive gas from the plasma causes the one or more precursor chemicals to decompose when confined jet impingement of the reactive gas mixture produces confined outward radial flow so that a thin film comprising at least one element from the one or more decomposed precursor chemicals is deposited on the surface opposing the radial-flow surface and on the object opposite and proximate to the radial-flow surface.

In applying the surface treatment or surface deposition, the plasma-generating device with its radial-flow surface can be manipulated with a robotic stage while in operation to change the position of the confined radial flow on the surface of the object proximate to the radial-flow surface while maintaining confined jet impingement so that the reactive gas of the plasma comes in contact with different parts of the surface of the object. Alternatively, in another embodiment, the surface of the object proximate to the radial-flow surface is translated or rotated relative to the atmospheric-pressure plasma source while maintaining confined jet impingement so that the reactive gas of the plasma comes in contact with different parts of the surface of the object. In a further embodiment, both the atmospheric-pressure plasma source and the surface of the object proximate to the radial-flow surface can be translated or rotated relative to each other while maintaining confined jet impingement so that the reactive gas of the plasma comes in contact with different parts of the surface of the object. The applied surface treatment under the method can be selected from the group consisting of surface activation, surface modification, cleaning, etching, sterilization, decontamination and deposition of thin films. The method embodiment of the invention can be further modified consistent with the apparatus embodiments described herein.

Remote atmospheric-pressure plasma sources use flowing gas as a method to transport the reactive species to the substrate surface. Generally, the flowing gas exiting the plasma source is unrestricted in all directions along the length of the jet until the jet impinges on an opposing surface at some distance from the source. This configuration is known as free jet impingement. Free jet impingement means that the unconfined jet from the atmospheric-pressure plasma source is simply pointed at the surface of the substrate or object. Although there is a recognition that jet nozzle design can affect the performance of atmospheric-pressure plasma and micro-plasma sources by affecting the velocity of free jet, it has not been recognized by those skilled in the art that there are different configurations of plasma fluid jet impingement that can be employed to improve heat transfer, mass transfer, and eliminate gas entrainment. Gas entrainment refers to the trapping of surrounding gas by the jet as the jet propagates.

The effect of free jet impingement of a gas jet comprised of a plasma-excited reactive gas with plasma-generated gas species on an impingement surface of a substrate or workpiece is determined by several factors, including the nozzle to impingement surface distance, the Reynolds number of the gas, the concentration and chemistry of the plasma excited reactive species in the gas, and the chemical nature of the ambient fluid surrounding the free jet during impingement. The time interval required for the reactive species in the fluid flow to move from the plasma source to the substrate is a function of the fluid velocity or jet velocity profile and the separation distance between the plasma source and the substrate. The Reynolds number of the jet flow is important because the Reynolds number of the jet describes the type of flow present in the jet as well as attempting to describe the point at which the fluid velocity transitions from laminar flow to turbulent flow. The flow characteristics of the free jet as described by the Reynolds number determine the level of surrounding ambient fluid that is entrained into the impinging jet core at any point as the jet propagates towards the impingement surface. The plasma-generated gas species in the plasma-excited reactive gas jet are in non-equilibrium concentrations as they exit the plasma region and their concentrations decay with time. The concentration of reactive species ion in the fluid flow at any point in time after the jet exits the plasma source is affected by a number of factors including the time constants for radiative and non-radiative de-excitation, the kinetics of chemical reactions involving plasma chemical species including unimolecular decompositions together with bimolecular and termolecular collision reactions of plasma generated reactive species, and secondary reactions of plasma generated reactive species with external chemical species that diffuse or are entrained into the fluid flow as the reactive fluid flow containing the reactive species moves towards the substrate. The secondary reactions of the plasma excited chemical species in the jet with gaseous compounds from the surrounding ambient environment is a significant effect and is attributed to gas entrainment.

Without wishing to be bound by theory, it is thought that as a jet propagates through its surrounding environment it slows down due to a thickening of the shear layer around the jet. As the shear layer thickens and the jet slows down, there is mixing of gases at the interface between the shear layer and the jet. Turbulence at the shear layer interface enhances gas mixing, gas entrainment and jet contamination by the surrounding ambient gasses and becomes more pronounced at high fluid velocities that characteristically have higher Reynolds numbers. Often significant concentrations of reactive species are destroyed before coming into contact with the substrate. As a consequence of these observations, much work in atmospheric-pressure plasma source design focuses on improving the generation of plasma produced reactive species with the aim of increasing the initial concentration of the reactive species in the fluid flow impinging on the substrate surface in order to increase the flux of reactive species at the substrate surface and compensate for loss processes. In contrast, the mass transport properties of the plasma-excited fluid jet that relate to transporting plasma chemical species to the surface of an object to be treated by a remote atmospheric-pressure plasma or plasma jet have previously not received much attention.

The fluid mechanics associated with the heat and mass transfer associated with jet impingement has been the subject of numerous research articles and patents. A jet is a moving, propagating column of fluid. The moving column of fluid can have a velocity below the speed of sound in the surrounding fluid, in which case the jet is called a sub-sonic jet. The velocity of the jet can be equal to the speed of sound in the surrounding fluid, in which case the jet is called a sonic jet. The velocity of the jet can exceed the speed of sound in the surrounding fluid, in which case the jet is called a supersonic jet. A jet is considered to be comprised of several regions: the core of the jet is the innermost portion of the jet that is formed when the fluid exits the nozzle. When the jet exits the nozzle the diameter of the jet is considered to be essentially equal to the diameter of the nozzle.

The jet core, near the center of the jet, is the fastest moving part of the jet and is surrounded by a region of developed flow that is often turbulent. As the jet propagates the velocity of the jet core decreases because the interaction between the jet core and the surrounding fluid dissipates the kinetic energy of the jet as the shear layer of the developed flow that surround the core thickens. The developed flow of fluid surrounding the jet plays a key role in gas entrainment into the jet as it propagates. As the jet propagates the jet velocity decreases and the core of the jet eventually dissolves due to entrainment of fluids from the developing flow that surrounds the jet as it propagates. The length of the jet core is defined different ways by different investigators and often characterized by a potential core length that is taken as the distance from the nozzle over which the jet core velocity decreases by 5%. Typically the potential core length is between 2 and 10 times the diameter of the jet.

A jet that flows into a surrounding fluid volume at ambient pressure in an unrestricted manner is called a "free jet". Ambient pressure is defined as the prevailing environmental pressure surrounding the jet. As the free jet propagates from the nozzle exit it is characterized by several parameters, including pressure, velocity, and potential core length. As used here the term "free jet" refers to a jet of fluid emanating from a nozzle structure into an unrestricted volume that is sufficiently large so that the propagating jet core is not influenced by and has no physical contact with obstacles like walls or other surfaces while the jet core velocity decays to 95% or more of its original velocity. Fluid entrainment of ambient pressure fluid into a free jet occurs regardless of jet velocity. A free jet can emanate or flow from a nozzle in a surface or from a nozzle at the distal end of a tube.

Jet impingement occurs when a jet is influenced by or has physical contact with a surface like a wall or a substrate. As used here the term "impingement" refers to the process that occurs when a jet emanating from a nozzle is close enough to the surface of an object so that the fluid flow of the jet interacts with the surface of the object. The core of the jet can be intact when the fluid from the jet strikes a surface of an object during any jet impingement. Whether the jet core is present depends on the distance between the jet nozzle and the object surface. The flow of the jet is disrupted during impingement by the interaction between the jet and the object surface.

The interaction of a jet with a surface is characterized by the formation of an initial "impingement zone" where the fluid flow from the jet first contacts the surface and the pressure and flow of the jet fluid begin to change as the fluid approaches the surface. Outside the "impingement zone" a "wall jet" is formed as the fluid from the jet flows along the surface. When a fluid jet impinges perpendicular and normal to the surface then a "stagnation zone" is formed inside the impingement zone. The stagnation zone is characterized by a near zero jet velocity in all directions at the object surface that is accompanied by an elevated pressure at the stagnation zone that, depending on the nozzle to surface separation, can equal the pressure of the jet at the nozzle exit. The stagnation zone at the surface is often located directly under the jet when the jet impinges normal to the object surface—that is, when the angle of jet impingement at the impingement position is 90 degrees with respect to the tangent plane at the impingement position on the surface. As the fluid of the jet deflects from the stagnation zone it spreads outwards in a radially symmetric fashion, following the topographical contours of the object surface. The spreading fluid along the surface is called a "wall jet". The velocity of the wall jet depends strongly on the configuration of the jet impingement.

Jet impingement configurations are classified as either free jet impingement or confined jet impingement. Those skilled in the art of fluid mechanics of jet impingement acknowledge that there are varying degrees of confinement associated with confined jet impingement.

Free Jet Impingement

As used herein the term "free jet impingement" refers to a configuration of jet impingement on a surface of an object wherein both the jet and the fluid from the jet can interact extensively with fluid from the surrounding ambient environment during impingement. The term "free jet impingement" implies that the interaction between the fluid flow of the jet and the surface of the object is determined mainly by the impinged surface of the object and the surrounding ambient fluid environment whilst any other non-impinged surfaces proximate to the jet have only negligible influence on the fluid flow. In the case of "free jet impingement" the wall jet propagating outward in a radially symmetric fashion interacts with the surface of the object and the fluid from the surrounding environment. The interaction between the wall jet and the fluid from the surrounding environment results in the formation of a shear layer containing fluid from the surrounding environment that thickens as the wall jet propagates. As the velocity of the wall jet decreases during radial jet expansion, the wall jet detaches from the surface of the object and turbulently mixes with fluid from the surrounding environment. When free jet impingement occurs, the fluid flow during jet impingement is restricted mainly by the solid impingement surface of the object and disturbances in the jet at one location are not necessarily propagated to other parts of the fluid flow because the jet is only constricted by the topographical features on the surface of the object.

Confined Jet Impingement

In contrast to "free jet impingement", the jet can be confined in various ways during impingement on a surface. As used herein the term "confined jet impingement" or "confined impingement jet" refers to the impingement of a jet on a surface wherein the fluid from the jet interacts primarily with itself and the confining surfaces, and cannot interact extensively or at all with fluid from the surrounding ambient environment during impingement due to the presence of physical barriers. During "confined jet impingement" the interaction between the fluid flow of the jet and the surface of the object involves only the fluid flow from the jet itself with negligible contributions from the surrounding ambient environment fluid outside the confinement region. The interactions of the fluid jet with the impingement surface is similar to that of a free jet because there is a stagnation zone and a wall jet but the behavior of the wall jet is affected by the presence of confining surfaces. Confined jet impingement can be achieved by means of baffles, walls, or other surfaces that are positioned proximate to the impinging jet so that the interaction of the jet and its associated radial spreading wall jet with the surrounding ambient environment during jet impingement is reduced. The jet of fluid in confined jet impingement can emanate from a nozzle in a surface or from a nozzle at the distal end of a tube. In one embodiment, one of the surfaces used to minimize the interaction of the jet with the surrounding environment can contain the jet emitting nozzle. A surface containing a jet emitting nozzle is also called an orifice plate. According to Glynn, O'Donovan, and Murray in the article "Jet Impingement Cooling" (http://home.eps.hw.ac.uk/~tsol/Papers/417.pdf) an impinging jet is said to be "confined" or "semi-confined" if the radial spread of the wall jet is restricted to a narrow channel between the impingement surface of an object and the impinging jet orifice plate. (This same definition is also given in Advanced Materials for Thermal Management of Electronic Packaging by Xingcun Colin Tong, chapter 10, Liquid cooling devices and their material selections pg. 433). In one embodiment "confined jet impingement" of an atmospheric-pressure plasma jet occurs when a jet emanating from the exit nozzle of an atmospheric-pressure plasma source is close enough to the surface of an object so that the fluid flow of the jet interacts with the surface of the object and the radial spread of the impinged fluid from the jet is restricted to a narrow channel between the impingement surface of an object and an orifice plate. The resulting flow of the radially spreading wall jet in the narrow channel fills the channel volume and the fluid from the jet has little or no interaction with the surrounding ambient environment during impingement because it is isolated from the surrounding environment by containment surfaces. Continuous confined jet impingement requires a fluid exit port so that fluid pressure does not build up inside the containment surfaces and stop the jet. Unlike free jet impingement, confined jet impingement can sometimes result in recirculation of the jet fluid and re-entrainment of jet fluid into the impinging jet. The behavior of confined jet impingement is determined by many different factors including Reynolds number, Prandtl number, jet diameter, and jet-to-object surface distance.

The scientific literature recognizes that a continuum of conditions exists between "free jet impingement" and "confined jet impingement". For example, in one embodiment the distance between an orifice plate and an impingement surface might be large enough that the confined jet mimics free jet impingement behavior. It is understood and acknowledged by those skilled in the art of fluid mechanics that the "confined jet impingement" has at least two distinguishing features: 1) confined jet impingement requires an orifice plate with a jet nozzle and 2) the radial spread of the wall jet formed during confined jet impingement is the restricted to a narrow channel between the impingement surface of an object and the impinging jet orifice plate, also called the radial-flow surface or radial flow confining surface, so that the outward radial flow of the wall jet is bounded by a two opposing surface—an orifice plate and the opposing surface of an object. Further, in the inventive method described here confined jet impingement has a unique radial pressure map exhibiting a self-generated sub-atmospheric-pressure region around the impinging jet that clearly distinguished confined jet impingement from free jet impingement.

Confinement Surfaces

As mentioned previously, a jet can emanate or flow from a jet nozzle in a surface. The surface containing the jet nozzle can be planar, curved, or have a portion of the surface that is planar and another portion of the surface that is curved or non-planar. The surface containing the jet nozzle is called the nozzle surface, nozzle-plate surface or orifice-plate surface. The surface proximate to the jet nozzle and containing the jet nozzle is also called the radial-flow surface or radial-flow-confining surface.

Two surfaces opposing each other that are separated by a substantially constant gap or distance produce a volume between them that is confined in at least one direction. The two opposing surfaces that provide a volume boundary in at least one direction for the volume between them are called confinement surfaces. In particular, there are confinement surfaces that are aligned so that at least one normal that is perpendicular to one surface is also perpendicular to the opposing surface when the normal is extended to contact the opposing surface. When at least three surface normals of the same length at three different equidistant neighboring locations, such as locations defining a triangle, each satisfy the condition that each normal is also perpendicular to the opposing surface then the confinement surfaces are said to be conformal confinement surfaces and the surfaces are considered parallel to each other in the region where the surface normals are located. Conformal confinement surfaces have a uniform distance between the opposing surfaces. Conformal confinement surfaces have a substantially constant gap between the opposing surfaces at all locations.

These conformal confinement surfaces are also called topographically conformal confinement surfaces. Confined jet impingement requires a minimum of two confinement surfaces that are proximate to each other to form a narrow channel-like volume through which fluid can flow. In an embodiment, one of the confining surfaces contains a jet nozzle, the jet nozzle providing a means of injecting a fluid jet into the volume between the confining surfaces. In another embodiment, the confinement surface are conformal confinement surfaces. In yet another embodiment, the confinement surfaces are conformal and oppose each other with a substantially constant gap such that radially symmetric outward flow of fluid from the jet nozzle can occur in the narrow channel between the confinement surfaces.

In an embodiment "confined jet impingement" occurs when two opposing and topographically conformal confinement surfaces, one of which is the surface of an object and the second of which is the nozzle surface or orifice plate, are proximate and a narrow channel is formed between the two conformal surfaces that is unrestricted in two directions and a jet emanating from the nozzle surface impinges on the opposing topographically conformal surface accompanied by the two dimensional radial spread of a wall jet of the impinged fluid from the jet on the opposing topographically conformal surface and the fluid flow from the jet and wall jet is restricted to volume defined between the two opposing topographically conformal surfaces comprised of the object surface and the nozzle plate surface.

Figure 1A:
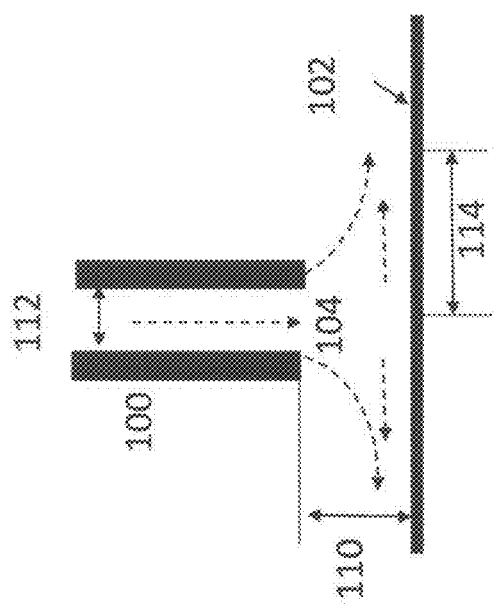

FIGS. 1A, 1B, and 1C show three embodiments of jet impingement. The arrows in FIGS. 1A, 1B, and 1C are intended to illustrate the flow of fluid in the cross-sectional diagrams.

FIG. 1A shows a cross-sectional view of an embodiment of free jet impingement where jet nozzle 100 with jet nozzle diameter 112 is positioned proximate to impingement surface 102 at a separation distance 110. Fluid flows through nozzle 100 to form a fluid jet that impinges on the surface 102 at the impingement zone 104 and flows radially outward. There are no additional surfaces proximate to nozzle 100 and the radially spreading wall jet that flows outward from impingement zone 104 can interact with all surrounding fluid. There is no confinement surface opposing surface 102 outside the nozzle 100. As the fluid jet radially spreads over the impingement surface 102, one side of the jet is restricted by the impingement surface of the object; however, the other side of the jet is unrestricted or "free". In the embodiment of free jet impingement shown in FIG. 1A the nozzle 100 is shown positioned so that the free jet impinges perpendicular to surface 102; however, those skilled in the art of jet impingement recognizes and understand that the impinging free jet emanating from nozzle 100 can impinge on surface 102 at angles other than 90 degrees.

FIG. 1B shows a cross-sectional view of an embodiment of confined jet impingement where jet nozzle 100 with jet nozzle diameter 112 is positioned proximate to impingement surface 102 at a separation distance 110. Fluid flows through nozzle 100 to form a fluid jet that impinges on the surface 102 at the impingement zone 104 and flows radially outward along radial distance 114. The radially spreading wall jet that flows outward from impingement zone 104 is constricted to flow in the narrow channel between impingement surface 102 and confinement surface 106. Impingement surface 102 and confinement surface 106 are separated by confinement surface gap 116 that is substantially constant between the two confinement surfaces. As the jet spreads down the narrow channel between the confining surface and the impingement surface of the object both sides of the jet are restricted by physical surfaces so that the radially spreading jet is confined within the gap between the two confining surfaces. In the embodiment of confined jet impingement shown in FIG. 1B the confinement surface gap 116 is equal to the nozzle separation distance 110. The fluid from the jet cannot interact with fluid outside the confinement surfaces until the fluid flow leaves the confinement surface boundary 118. In general, the confinement surface boundary 118 is typically the edge of one of the confinement surfaces like, for example, the edge of an orifice plate or the edge of an impingement surface. Generally, the height of the nozzle is essentially the same as the height of the channel in embodiments of confined jet impingement. The height of channel 116 is less than 20 times the jet nozzle diameter 112, less than 10 times the jet nozzle diameter 112, less than 2 times the jet nozzle diameter 112, or less than 1 times the jet nozzle diameter 112. In the embodiment of confined jet impingement shown in FIG. 1B the nozzle 100 is shown positioned so that the free jet impinges perpendicular to surface 102; however, those skilled in the art of jet impingement recognize and understand that in another embodiment of confined jet impingement the confined free jet emanating from nozzle 100 can impinge on surface 102 at angles other than 90 degrees. In FIG. 1B the confinement surfaces 102 and 106 are shown as planar topographically conformal confinement surfaces. In another embodiment of confined jet impingement the confinement surfaces 102 and 106 are non-planar topographically conformal confinement surfaces. In a further embodiment of confined jet impingement the confinement surfaces 102 and 106 are non-conformal confinement surfaces that do not contact each other and are separated by a variable confinement surface gap 116 as long as the variable confinement surface gap is less than or equal to 2 times the jet nozzle diameter.

FIG. 1C shows a cross-sectional view of another embodiment of confined jet impingement where the nozzle separation distance 110 between the jet nozzle and impingement surface 102 is different from the confinement surface gap 116. FIG. 1C shows an embodiment of confined jet impingement where confinement surface gap 116 is larger than the nozzle separation distance 110. Those skilled in the art of jet impingement recognized that FIG. 1C shows a submerged jet configuration wherein a fluid jet from jet nozzle 100 impinges on surface 102 and spreads radially outward. The jet nozzle 100 is surrounded by a fluid and the confinement surface gap 116 is large. The radially spreading jet is confined on one side by the solid impingement surface of the object (102) but is in contact with the fluid in the gap. The jet and wall jet flowing radially outward from the impingement zone 104 in FIG. 1C can freely interact with the surrounding fluid in the large confinement gap 116. If the fluid in the gap is the same as the fluid in the jet and the gap height 116 is large the jet impingement of the embodiment shown in FIG. 1C emulates the behavior of free jet impingement.

Figure 2B:
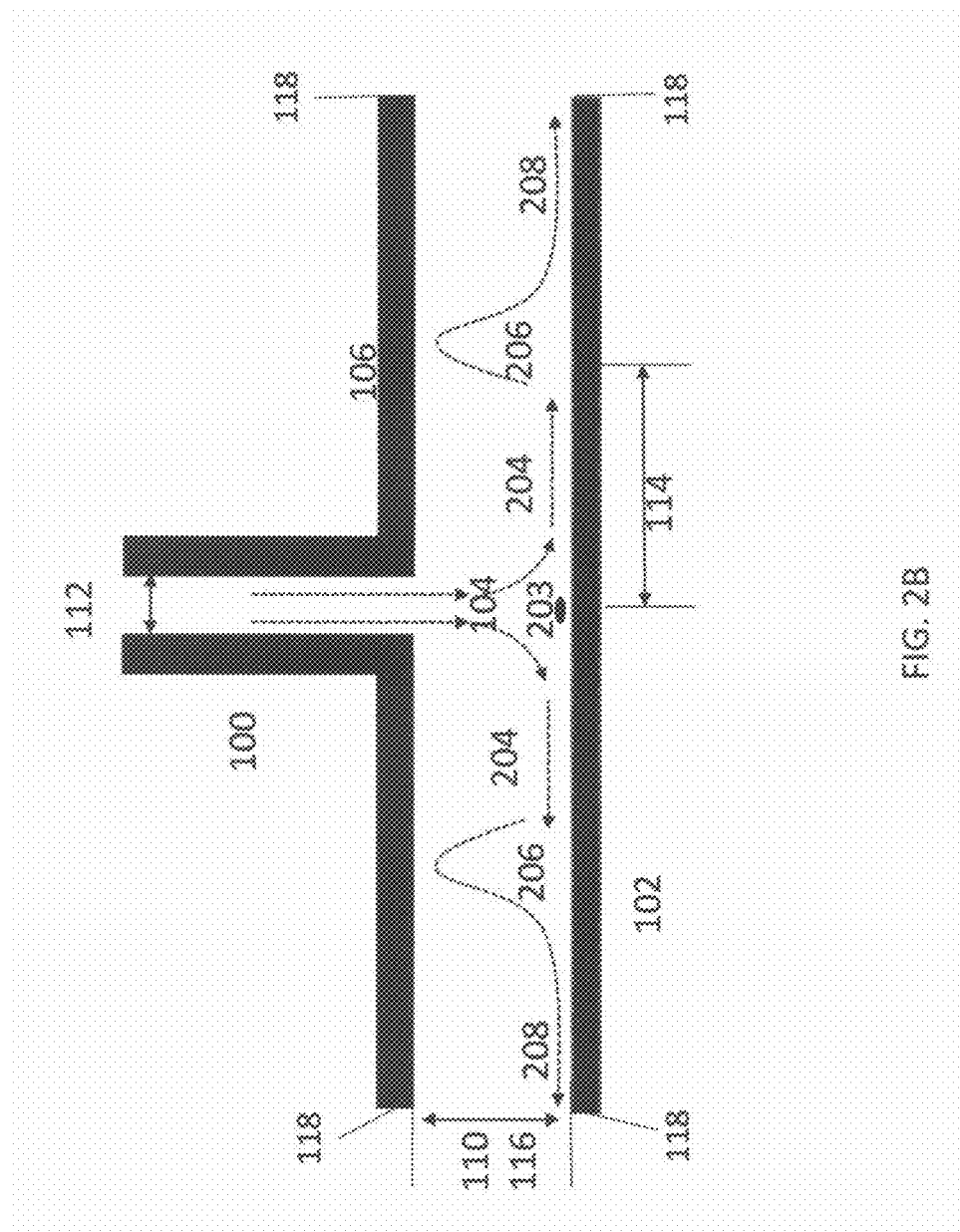

FIG. 2 shows a plan view and a cross-sectional view of the general fluid flow of an embodiment of confined jet impingement between two parallel conformal confining surfaces. FIG. 2A shows a plan view of the fluid flow looking through a top confinement surface 106. The fluid jet from jet nozzle 100 impinges on an underlying impingement surface 102 and flows outward in a radially symmetric fashion towards a confinement boundary 118. The flow of fluid in FIG. 2A is represented by dotted arrows. The fluid follows the radii extending from the center of the nozzle outward towards the circular confinements boundary 118. FIG. 2B shows a cross-sectional view of the fluid flow features associated with an embodiment of confined jet impingement between two parallel conformal confining surfaces. The fluid jet emanating from jet nozzle 100 flows to the impingement zone 104 which is the first zone of interaction between the jet fluid and surface 102. In the embodiment of confined jet impingement shown in FIG. 2B, the jet nozzle to surface separation distance 110 is the same as the confinement surface gap 116. There is a stagnation zone 203 located in the center of the impingement point of the jet where the fluid velocity is essentially zero and the pressure approaches that of the jet. The fluid from the jet flows over the stagnation zone, changing direction by 90 degrees and begins a radial expansion outward as wall jet 204. The wall jet follows along impingement surface 102. The wall jet slows down during outward expansion and detaches from surface 102 at transition zone 206. Laminar flow is then re-established in laminar flow zone 208 until the fluid exits the confinement volume between surfaces 102 and 106 at confinement boundary 118.

Fluid flow studies are often parameterized using dimensionless variables to enable comparison of flow characteristics taken under different conditions. Three dimensionless variables that are important to this discussion of jet impingement are 1) the Reynolds number of the fluid flow, 2) the jet nozzle-to-plate spacing expressed in terms of jet nozzle diameters for circular nozzles, and 3) the radial position on the confinement surfaces for fluid property measurement is also expressed in terms of jet nozzle diameters. Jet nozzle-to-plate spacings, which are also the spacing between the jet nozzle and the impingement surface, are described using the jet nozzle diameter as the unit of measurement. Referring to FIG. 1B, the jet nozzle to impingement surface spacing can be expressed as the ratio of separation distance 110 to nozzle diameter 112 using common length measurement units, where 110 is the separation distance between nozzle and the plate (element 110 in FIGS. 1B and 2B), 112 is the diameter of the nozzle (element 112 in FIGS. 1B and 2B), and 110 and 112 are measured with the same units of length. For confined jet impingement it is preferred that the jet nozzle to impingement surface distance be essentially equal to the height of the confinement surface above the impingement surface, that is the separation distance 110 is substantially equal to the confinement surface gap 116. The radial position of the fluid property measurement on the confinement surfaces or just a radial position on a confinement surface is described using the dimensionless ratio of radial distance 114 to nozzle diameter 112 where 114 is the radial distance from the center of the jet nozzle (element 114 in FIG. 2b), 112 is the diameter of the jet nozzle (element 112 in FIG. 2b), and 114 and 112 are measured with the same units of length. Last, the Reynolds number is a well-known dimensionless quantity in fluid mechanics that expresses the ratio of inertial forces to viscous forces in the fluid. The Reynolds number for a gas flow is defined here as:

$$\mathrm{Re} = \frac{U_j d}{v},$$

where $U_j$ is the velocity of the jet at the nozzle exit expressed in units of m/sec; d is the diameter of the nozzle expressed in m (element 112 in FIG. 2b); and v is the kinematic viscosity of the gas expressed in m²/sec.

Figure 2D:
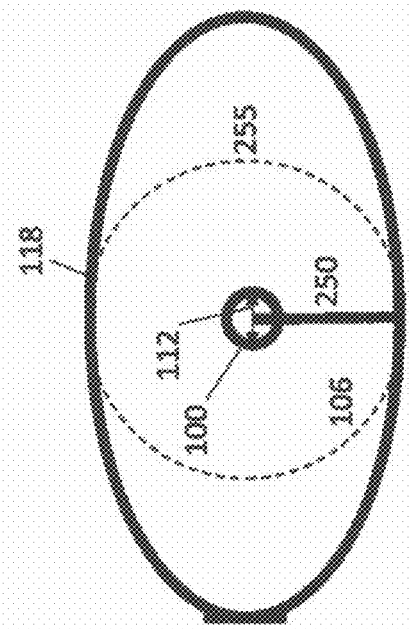
Figure 2C:
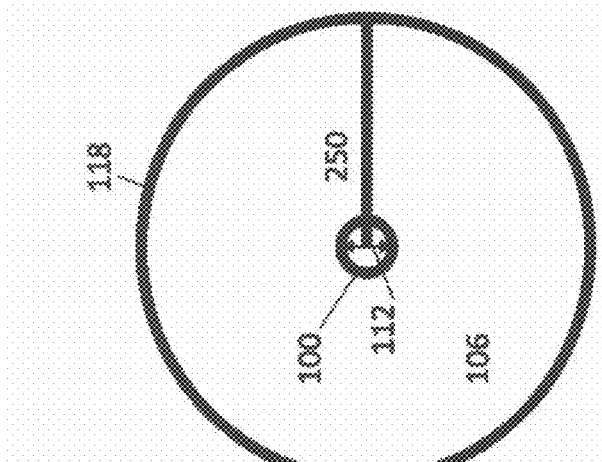

FIG. 2C shows a plan view of an embodiment of a circular top confinement surface 106. Confinement surface 106 is a radial-flow surface. The jet nozzle 100 having an internal diameter 112 is located in the center of the circularly shaped confinement surface 106. The confinement surface 106 has a confinement boundary 118. The effective minimum radius 250 of the confinement surface 106 is shown as the shortest line having minimum length that extends from the center of the jet nozzle 100 to the confinement surface boundary 118. In an embodiment, the effective minimum radius 250 of the confinement surface 106 for confined jet impingement is at least 2 times the diameter of nozzle 100. In a preferred embodiment the effective minimum radius 250 of the confinement surface 106 is greater than or equal to 10 times the internal diameter 112 of nozzle 100.

FIG. 2D shows a plan view of non-circular top confinement surface 106 that is a radial-flow surface. The radial-flow confinement surface 106 contains a jet nozzle 100 having an internal diameter 112 that is located in the radial flow surface. The effective minimum radius 250 of the confinement surface 106 is shown as the shortest line having minimum length that extends from the center of the jet nozzle 100 to the confinement surface boundary 118. The line 250 is also the effective minimum radius of the largest circular area that can be inscribed inside a continuous region of the radial-flow confinement surface 106. In an embodiment, the effective minimum radius 250 of the non-circular confinement surface 106 for confined jet impingement is at least 2 times the diameter of nozzle 100. In useful embodiments, the effective minimum radius 250 of the non-circular confinement surface 106 is greater than or equal to 10 times the internal diameter 112 of nozzle 100.

More generally, in an embodiment the effective minimum radius of a confinement surface for confined jet impingement is at least 2 times the internal diameter of a jet nozzle in the radial-flow confinement surface. In a preferred embodiment the effective minimum radius of a confinement surface is greater than or equal to 10 times the internal diameter of a jet nozzle in the radial-flow confinement surface. The confinement surface is either the radial-flow surface containing the nozzle or the opposing impingement surface.

Confinement surfaces that are employed in confined jet impingement cannot function to confine the flow from the jet if the surface area of either one, or both of the confinement surface is too small. This requirement is met by describing the continuity of a confinement surface in terms of radial positions on the confinement surface in units that are normalized with respect to the jet nozzle diameter with the provision that all diameter and radial measurement use the same units of length. FIG. 2E shows radial-flow confinement surface 106 with nozzle 100. Nozzle 100 has an internal diameter 112. Confinement surface 106 has a radial distance 260 extending from the center of the jet nozzle to a position less than or equal to the confinement surface boundary 118. Radial distance 260, which will also be designated as $r_{S1}$, is the length of an arc, curve, or series of line segments along continuous confinement surface 106, the arc, curve or series of line segments extending from the center of the jet nozzle in the confinement surface 106 to a position located on the confinement surface measured in the same units of length as the nozzle diameter. Similarly, opposing confinement surfaces 102 have a radial distance 270 extending from the stagnation zone 203 to a position less than or equal to the confinement surface boundary 118. Let $d_{JN}$ represent the internal diameter of the jet nozzle 112 used in confined jet impingement measured in a unit of length. Radial distance 270, which will also be designated as $r_{S2}$ is the length of an arc, curve or series of line segments extending radially outward from the stagnation zone 204 on the confinement surface 102 along a continuous confinement surface 102 to a position located on the confinement surface measured in the same units of length as the nozzle diameter.

A confinement surface employed for confined jet impingement is preferred if it is substantially continuous without significant flow disrupting discontinuities at all radial positions on the surface where $r_{S1}/d_{JN} \leq 2$, $r_{S2}/d_{JN} \leq 2$ and a confinement surface is further preferred if it is substantially continuous without significant flow disrupting discontinuities at all radial positions on the surface where $r_{S1}/d_{JN} \leq 10$ and $r_{S2}/d_{JN} \leq 10$. The confinement surfaces employed for confined jet impingement are preferred if they are substantially continuous at all positions that are within 2 nozzle diameters of the jet nozzle center or jet impingement center position. In a further embodiment, the confinement surfaces employed for confined jet impingement are substantially continuous at all positions that are within 10 or more nozzle diameters of the jet nozzle center or stagnation zone location. In practice, small discontinuities like holes or pits in the substantially continuous confinement surface are acceptable as long as the total area of the discontinuities do not comprise more than 25% of the overall surface area of the confinement surface. It is preferred that a single discontinuity in the confinement surface does not comprise more than 50% of the surface area of the jet nozzle. The discontinuities in the substantially continuous confinement surface must be small enough and few enough so that the divergent outward radial flow of the confined impingement jet and wall jet is not disrupted or significantly altered. In an embodiment, a radial-flow surface is a confinement surface.

Confined Jet Impingement Flow Characteristics

Returning to FIG. 1B and examining the cross-sectional view of an embodiment of confined jet impingement shown in FIG. 1B where jet nozzle 100 with jet nozzle diameter 112 is positioned proximate to impingement surface 102 at a separation distance 110, fluid flows through jet nozzle 100 form a fluid jet that impinges on the surface 102 at the impingement zone 104 that flows radially outward along radial distance 114. The radially spreading wall jet flowing outward from impingement zone 104 is constricted to flow in the narrow channel between impingement surface 102 and confinement surface 106 that are also separated by confinement surface gap 116. In the embodiment of confined jet impingement shown in FIG. 1B the surface gap 116 is equal to the jet nozzle separation distance 110. The confinement surface 106 is also called a radial-flow surface. An inventive aspect of the present invention is the integration of a radial-flow surface directly into an atmospheric-pressure plasma source. The integration of a radial-flow surface into an atmospheric-pressure plasma source or preferably an atmospheric-pressure plasma or micro-plasma jet source allows the plasma-excited reactive gas produced by the atmospheric-pressure plasma source to be used as the fluid source in confined jet impingement, thereby appropriating all the advantages associated with confined jet impingement. The advantages associated with confined jet impingement include 1) control and elimination of entrained ambient fluid in the plasma-excited reactive gas jet and 2) enhanced mass transport of the plasma-generated gas species as well as reactive precursors to the opposing confining surface, i.e. impingement surface 102. In one embodiment the opposing confining surface is the surface of an object or substrate to be plasma treated using either the plasma-excited reactive gas flow or the plasma-excited reactive gas flow combined with additional gas-phase reactive precursors. Gas entrainment of ambient fluid is minimized during confined jet impingement because the fluid from the jet cannot interact with fluid outside the confinement surfaces until the fluid flow leaves the confinement surface boundary 118 shown in FIG. 1B. The confinement surface boundary 118 is typically the edge of one of the confinement surfaces like, for example, the edge of an orifice plate or the edge of an impingement surface. Two factors that enhance the mass transport of reactive species to the impingement surface 102 are 1) the absence of gas entrainment and 2) an annular sub-atmospheric-pressure zone that forms directly outside the impingement zone and is associated with the outward divergent radial expansion of the high velocity wall jet 204 (FIG. 2B) that forms outside the impingement zone for jets with flows with Reynolds numbers above 2700 when the spacing between the confinement surfaces is less than 2 jet nozzle diameters. The sub-atmospheric-pressure zone is self-generated by the fluid flow characteristics of confined outward radial flow and requires no supplemental source of vacuum. The sub-atmospheric-pressure zone dramatically enhances mass transport to the opposing surface by both changing the character of the boundary layer and increasing the diffusion length and mean free path of all types of reactive gaseous species in the sub-atmospheric-pressure region.

The annular sub-atmospheric-pressure zone forming directly outside the impingement zone for flows with Reynolds numbers above about 2700 is a characteristic associated with confined jet impingement. Extensive studies of free and confined jet impingement have concluded that sub-atmospheric-pressure zones outside the impingement zone are not observed under free jet impingement conditions that are useful for atmospheric-pressure plasma processing. Note that Lytle and Webb (loc cit) observed that evidence of any sort of sub-atmospheric-pressure zone only occurs in free jet impingement under extreme conditions of extremely small jet nozzle to substrate spacings and extremely high flow velocities. Under the conditions of extremely small jet nozzle to substrate spacings there is a high risk of arcing to the surface of the opposing object if the object is conducting and so these conditions are avoided during atmospheric-pressure plasma processing. Baydar and Ozmen (loc cit) concludes with respect to unconfined or free jet impingement that "In contrast to the confined jet, no subatmospheric region is observed on the impingement surface for the Reynolds numbers and the spacings studied. This situation can be explained with the fluid velocity along the impingement surface is lower with respect to the confined jet, due to no flow confinement." The fluid velocity of the jet and wall jet at confinement surface 102 in the free jet of FIG. 1A is lower than that of the confined impinging jet and its associated wall jet in FIG. 1B primarily due to the jet velocity decreasing effects of gas entrainment on the free jet as it propagates towards surface 102.

Returning to FIG. 2B, which shows a cross-sectional view of the general fluid flow of an embodiment of confined jet impingement between two parallel conformal confining surfaces, some of the general flow characteristics of confined jet impingement will be discussed. Without wishing to be bound by theory, it is thought that the fluid jet emanating from jet nozzle 100 flows towards impingement surface 102 and a stagnation zone 203 is formed as the fluid interacts with the opposing surface 102. The stagnation zone 203 is located in the center of the impingement point of the jet where the fluid velocity slows as it is forced to flow over the stagnation zone 203. As it flows over the stagnation zone the fluid changes direction and begins an outward radial expansion as a wall jet 204. The initial velocity of the wall jet 204 is large as it undergoes radial expansion and follows along impingement surface 102. When the initial jet has sufficient velocity where the Reynolds number of the flow is greater than or equal to 2700 a sub-atmospheric-pressure annular zone is formed around the impingement zone during the outward divergent radial expansion of the wall jet in the confining channel between surfaces 106 and 102. The annular sub-atmospheric-pressure zone around the impingement zone is qualitatively described by the Bernoulli principle in that the divergent high-velocity radially expanding wall jet has a lower pressure than the impinging jet. Baydar and Ozmen (loc cit) reported that the sub-atmospheric-pressure zone fills the entire space between the two confining surfaces 102 and 106. If the confining surface was not present the sub-atmospheric-pressure zone could not form because surrounding ambient fluid would flow into the reduced-pressure region to equalize the pressure as the sub-atmospheric-pressure zone was forming. Thus, sub-atmospheric annular zones around the impinging jet are not observed in the free jet impingement method that is generally employed in atmospheric-pressure plasma systems. Returning to the confined jet impingement of FIG. 2B, as the wall jet 204 slows down during outward expansion, it eventually detaches from impingement surface 102 at transition zone 206. There is a portion of the flow that recirculates toward the impingement zone as the wall jet 204 detaches from surface 102. As the remainder of the fluid continues its outward divergent radial expansion, laminar flow is then re-established in laminar flow zone 208 until the fluid exits the confinement volume between surfaces 102 and 106 at confinement boundary 118. The detached fluid at the transition zone and subsequent establishment of radially outward laminar flow provides an effective fluid barrier that essentially acts as to impede gas outside the confinement surfaces from flowing into the sub-atmospheric-pressure zone from the confinement boundary 118.

The Bernoulli principle for compressible fluids states that a decrease in fluid pressure is accompanied by a fluid acceleration. Without wishing to be bound by theory, it is thought that one small contributor to the low pressure annular zone that is formed during confined jet impingement is a vena contracta effect associated with the fluid jet emanating from the jet nozzle; the fluid emerging from the jet nozzle accelerates as it propagates into the surrounding free space and the local acceleration of the jet due to the change in friction at the jet surface as soon as it emerges from the jet nozzle causes the jet of fluid to temporarily decrease in volume because of the fluid pressure drop that accompanies the acceleration of the fluid when it emerges from the jet nozzle. There is, however, a second and much more significant acceleration of the fluid during outward divergent radial expansion of the wall jet 204 after impingement that results in the formation of the low pressure annular zone during confined jet impingement as the fluid acceleration that occurs when the fluid from the jet passes over and through the stagnation zone expands radially and divergently outward as the wall jet 204 propagates along the impingement surface. The second pressure drop is characteristic of confined jet impingement for fluids with Reynolds number ≥2700 and confinement surface spacings of less than two jet diameters.

U.S. Pat. No. 8,328,982 discloses a "nozzle for accelerating the gas flow out of a single outlet". Such acceleration is due to the well-known and extensively documented vena contracta effect for a fluid jetting from a jet nozzle that was first observed by Torricelli in 1643 where the expansion of the fluid once it is released from the nozzle surface results in a fluid acceleration and a streamline contraction. In contrast to U.S. Pat. No. 8,328,982 the acceleration of the gas flow in the inventive atmospheric-pressure microplasma source with radial-flow surface is clearly distinguishable from the prior art because it is associated with the fluid mechanics of confined jet impingement and results in fluid acceleration at the impingement surface as the wall jet 204 expands in an outward divergent radial flow with the formation of a characteristic annular sub-atmospheric-pressure region around the impinging jet.

FIGS. 3A, 3B, 3C, and 3D show cross-sectional views of four embodiments of an inventive atmospheric-pressure plasma source with radial-flow surface. FIG. 3A shows one embodiment of an atmospheric-pressure plasma source 300 with a radial-flow surface 320 for producing confined jet impingement during plasma processing. AC power supply 302 is connected to two conducting electrodes 306 and 308. In the example shown in FIG. 3A the AC power supply 302 is connected to a matching network 318 to maximize the power dissipated power in the plasma and minimize the power reflected back to the AC power supply 302. Electrode 308 is grounded at earth contact 304. In this example electrode 306 is encapsulated by dielectric coating 310 and a gas chamber 314 through which gas flow Q can flow is formed by the volume space located between electrode 306 with dielectric coating 310 and grounded electrode 308. Ground electrode 308 has a radial-flow surface 320 with a jet nozzle 316 having diameter 312. Gas chamber 314 is in fluid communication with jet nozzle 316. The gas flow Q is sufficiently large so that gas exiting jet nozzle 316 has a Reynolds number greater than or equal to 2700. Radial-flow surface 320 of ground electrode 308 extends radially outward over distance 322 from the center of jet nozzle 316 to the confinement boundary edge of radial-flow surface 320. Distance 322 is at least as large as the effective minimum radius of radial flow surface 320. Radial-flow surface 320 functions as confinement surface 106 when atmospheric-pressure plasma source 300 is separated from an impingement surface by distance 110. In one embodiment the distance 322 is greater than two times the nozzle diameter 312. In another embodiment the distance 322 is greater than ten times the nozzle diameter 312.

FIG. 3B shows another embodiment of an atmospheric-pressure plasma source 300 with a radial-flow surface 320 for producing confined jet impingement during plasma processing. AC power supply 302 is connected to a single, spiral wound conducting electrode 306 using a matching network 318. A gas chamber 314 through which gas flow Q can flow is located inside the spiral structure of electrode 306 so that the alternating electric field generated inside the spiral structure of electrode 306 can be used to excite a plasma in the flowing gas Q in gas chamber 314. The housing of gas chamber 314 is preferably made of insulating dielectric. The gas chamber 314 is in fluid communication with jet nozzle 316. Jet nozzle 316 with nozzle diameter 312 is located in and extends to radial-flow surface 320. Gas flow Q is sufficiently large to produce a gas flow out of jet nozzle 316 with a Reynolds number greater than or equal to 2700. Radial-flow surface 320 extends radially outward over distance 322 from the center of jet nozzle 316 to the confinement boundary edge of surface 320. Radial-flow surface 320 functions as confinement surface 106 when atmospheric-pressure plasma source 300 is separated from an impingement surface 102 (FIG. 2B) by separation distance 110, which in the example of FIG. 2B is the same as the confinement surface gap 116.

FIGS. 3C and 3D show additional embodiments of an atmospheric-pressure plasma source 300 with a piezoelectric transformer 340 and a radial-flow surface 320 for producing confined jet impingement during plasma processing. Those skilled in the art of plasma source will recognize that an AC power supply with a piezoelectric transformer can be exchanged for an AC power supply with a matching network Piezo-electric transformers are known as an efficient method of generating high voltages. A piezoelectric transformer or piezo-transformer is a type of AC voltage multiplier. Rosen type piezo-transformers are described by C. A. Rosen in Proc. Electronics Component Symp. (1957) pp 205 and following. In one embodiment a piezo-transformer or piezo-electric transformer is comprised of a block of piezo-electric material having two adjacent poled regions, the two piezoelectric regions poled 90 degrees to one another, with one pole region being longitudinal and parallel to an axis of the block and the second adjacent region being poled transversely or perpendicularly the same axis. Two electrodes are attached to the second poled region that is poled perpendicular to the block axis, a first electrode and a second electrode, the two electrodes being located on opposite faces of the block that are normal to the transverse poling direction. A third electrode is located on one of the faces of the longitudinally poled portion of the piezoelectric element. When AC voltage at the resonant frequency of the piezoelectric block is applied between the first and second electrode and the second electrode is held at ground, then the amplitude of the AC voltage measured between the second and the third electrode is higher than the AC input voltage between the first and second electrode. Piezo-transformers use alternating voltages ranging from kilohertz to megahertz and can have voltage gains up to 50:1 or higher. Piezo-transformer are compact, highly efficient, and useful for miniaturization of plasma sources and in applications where power requirements are low.

U.S. Pat. No. 6,586,863 describes the use of a Rosen piezoelectric transformer to generate high voltage in order to light the low pressure plasma of a cold cathode fluorescent lamp. S. D. Kovaleski demonstrated the use of a Rosen piezo-transformer to induce field emission from the high-voltage side of the transformer. Atmospheric-pressure plasma sources based on piezoelectric transformers are known. Ternishi et al disclosed atmospheric-pressure dielectric barrier discharge plasmas in 2003 ("High efficiency ozone production by a compact ozonizer using piezoelectric transformer" by Teranishi, Kenji; Suzuki, Susumu; Itoh, Haruo; Edited by Meichsner, J.; Loffhagen, D.; Wagner, H.-E: From International Conference on Phenomena in Ionized Gases, Proceedings, 26th, Greifswald, Germany, Jul. 15-20, 2003 (2003), 3, 191-192.) Itoh disclosed atmospheric-pressure discharge plasmas generated by a piezoelectric transformer in 2005 (XXVIIth ICPIG Eindhoven, Netherlands, 18-22 Jul. 2005—web address: http:// event.cwi.nl/icpig05/cd/D:/pdf/00-350.pdf). Teschke and Engermann disclosed low-voltage atmospheric-pressure plasma generation devices employing ceramic based piezoelectric transformers in WO2007006298 A2 and US 2009/ 0122941 A1. None of the atmospheric-plasma devices reported above disclose or anticipate the use of confined jet impingement as a means of improving mass transport of the plasma-generated species to the surface of an object, which is essential to improve the performance of a low-power atmospheric-pressure plasma for plasma processing.

FIG. 3C shows one embodiment of an atmospheric-pressure plasma source 300 with a piezoelectric transformer 340 and an integrated radial-flow surface 320 for producing confined jet impingement during plasma processing. A piezotransformer compatible AC power supply 330 is connected to a piezoelectric transformer and drives the piezoelectric transformer 340 near the resonance frequency of the element. Electrode 306 is electrically connected to the secondary high voltage side of piezo-transformer 340. Electrode 308 is grounded at common earth contact 304. In one embodiment electrodes 306 and 308 are encapsulated by dielectric coating 310 (not shown) and inserted into gas chamber 314 with a space between them through which gas flow Q can flow. In one embodiment the housing 360 of gas chamber 314 is made out a dielectric material. The outlet of gas chamber 314 is in fluid communication with jet nozzle 316 in radial-flow surface 320. Jet nozzle 316 has a diameter 312. In one embodiment radial-flow surface 320 of block 334 is made of a dielectric and extends radially outward over distance 322 from the center of nozzle 312 to the confinement boundary edge of radial-flow surface 320 at distance 322 from the center of jet nozzle 316. Gas flow Q is sufficiently large to produce a gas jet which is a collimated flow of gas at jet nozzle 316 with a Reynolds number greater than or equal to 2700. Radial-flow surface 320 functions as confinement surface 106 (FIG. 2B) when atmospheric-pressure plasma source 300 is separated from an impingement surface 102 by separation distance 110. In another embodiment, radial-flow surface 320 of block 334 is made of a metallic electrical conductor and is connected to the ground electrode 308.

FIG. 3D shows an embodiment of an atmospheric-pressure plasma source 300 with a piezoelectric transformer 340 and a radial-flow surface 320 for producing confined jet impingement during plasma processing. A piezotransformer compatible AC power supply 330 is connected to a piezoelectric transformer and drives the piezoelectric transformer 340 near the resonance frequency of the element. The output of the AC power supply 330 is less than or equal to 50 V in amplitude or less than or equal to 100V peak-to-peak. Electrode 306 is electrically connected to the secondary high voltage side of piezo-transformer 340. Electrode 308 is grounded at common earth contact 304. In one embodiment the housing 360 of gas chamber 314 is made of an insulating dielectric material and electrodes 306 and 308 are annular cylinders separated by an annular cylinder of dielectric material. The gas chamber 314 through which gas flow Q can flow passes through the center regions of the two annular cylinder electrodes and the annular cylinder of dielectric separating the two electrodes. Gas-chamber housing 360 is made out a dielectric material. The outlet of gas chamber 314 is in fluid communication with jet nozzle 316 in radial-flow surface 320. Jet nozzle 316 has a diameter 312. Gas flow Q is sufficiently large to produce a gas flow with a Reynolds number greater than or equal to 2700 exiting jet nozzle 316. In one embodiment radial-flow surface 320 of block 334 is made of a dielectric and extends radially outward over distance 322 from the center of jet nozzle 316 to the confinement boundary edge of surface 320. Radial-flow surface 320 functions as confinement surface 106 (FIG. 2B) when atmospheric-pressure plasma source 300 is separated from an impingement surface 102 by separation distance 110. In another embodiment, radial-flow surface 320 of block 334 is made of a metallic electrical conductor and is connected to the ground electrode 308.

The improved mass transport of the present invention disclosed in FIGS. 3C and 3D allows effective use of low-power atmospheric-pressure plasma driven by piezo-transformer driven plasma discharges for surface treatment.

In various embodiments of the atmospheric-pressure plasma systems of 3A through 3D, the portion of the radial-flow surface 320 having the radial flow has an effective minimum radius greater than or equal to 5 cm, greater than or equal to 1 cm, greater than or equal to 1 mm, or greater than or equal to 10 microns. In various embodiments of the atmospheric-pressure plasma systems of 3A through 3D the portion of the radial-flow surface having the radial flow has an effective minimum radius less than or equal to 2 meters, less than or equal to 1 meter, less than or equal to 10 cm, or less than or equal to 1 cm.

Atmospheric-Pressure Plasma Sources

Atmospheric-pressure plasma sources have at least one electrode. The one or more electrodes used in an atmospheric-pressure plasma source are fabricated from materials that conduct electricity and it is preferable that the material be an excellent electrical conductor like a metal or a material having metallic-like electrical properties. Materials that are suitable for the construction of electrodes for atmospheric-pressure plasma source have high melting points above 600 degrees C. and include noble metals like platinum, silver, gold, ruthenium, osmium, rhodium, including admixtures and alloys of precious metals as well as more common metals like, for example, steel alloys, copper and its alloys, aluminum and its alloys, and titanium and its alloys. In one embodiment of an electrode for use in an atmospheric-pressure plasma source the materials for construction of an electrode is selected from one or more of the materials in the group of metals comprised of copper and its alloys, aluminum and its alloys, and titanium and its alloys. In one embodiment an electrode for use in an atmospheric-pressure plasma source is constructed or fabricated from conducting carbon including graphite, pyrolytic graphite, or other allotropic electrically conducting forms of carbon like, for example carbon fibers, carbon nanotube of all types, carbon nanowire of all types or other forms of electrically conducting carbon including composites. In one embodiment an electrode for use in an atmospheric-pressure plasma source is constructed or fabricated from one or more semi-metallic compounds including semi-metallic compounds like aluminum doped zinc oxide, doped tin oxides, and indium tin oxides. In another embodiment an electrode for use in an atmospheric-pressure plasma source is constructed or fabricated from one or more semiconducting compounds including semiconducting compounds like p- or n-doped silicon, and doped or undoped silicon carbide, p- or n-doped germanium, doped III-V and II-VI semiconductor compounds and the like. In one embodiment an electrode for use in an atmospheric-pressure plasma source is constructed or fabricated from a metal, semimetal or semiconductor that forms a passivating oxide layer on the surface of the electrical conductor like, for example, doped silicon, titanium, niobium, or tantalum. In one embodiment an electrode for use in an atmospheric-pressure plasma source is constructed or fabricated from an electrically conducting composite material. Atmospheric-pressure plasma sources utilizing more than one electrode do not have to have identical electrodes. It is preferred that the material of construction of an electrode employed in an atmospheric-pressure plasma source does not degrade or deteriorate in the presence of a plasma. In one embodiment the material of construction of an electrode employed in an atmospheric-pressure plasma source is chemically inert to the plasma chemistry generated by the plasma when the plasma is lit proximate to the electrode. In one embodiment the material of construction of an electrode employed in an atmospheric-pressure plasma source is passivated by the plasma chemistry generated by the plasma when the plasma is lit proximate to the electrode. An example of self-passivation of an electrode material is a titanium metal electrode whose surface is self-passivated by oxide in the presence of an atmospheric-pressure plasma containing oxygen. In another embodiment it is preferred that the material of construction of an electrode for an atmospheric-pressure plasma source have a large secondary electron emission coefficient.

In one embodiment an electrode in an atmospheric-pressure plasma source has a portion of the electrode that is electrically insulated and does not conduct electricity. The art of electrical insulation teaches the use of insulating and dielectric materials as coatings and films to provide electrical insulation to portions of electrically conducting materials. The art of plasma technology teaches the use of dielectric layers and coatings to provide spatial separation between one or more electrodes and to control electrical conduction between electrodes. In particular, the art of atmospheric-pressure plasma sources teaches the use of dielectric films and coatings to prevent arcing between electrodes at the voltages required to sustain atmospheric-pressure plasmas as well as to prevent contamination of the plasma by species sputtered off the electrode surfaces. In one embodiment a portion of one electrode of an atmospheric-pressure plasma source is covered by an electrically insulating dielectric film in order to eliminate uncontrolled dissipation of electrical energy by electrical current arcing to a lower potential surface when a voltage is present at the electrode. In one embodiment the electrode is metallic rod covered with a quartz dielectric sheath. The art of atmospheric-pressure plasma sources teaches the use of electrically insulating dielectric materials to contain atmospheric plasmas proximate to one or more electrodes. In one embodiment the electrically insulating dielectric material used to contain an atmospheric plasmas proximate to one or more electrodes is a tube made out of the dielectric insulating material and the plasma is generated inside of the tube.

Materials that are useful for the fabrication of insulating dielectric films, coatings, and spacers in the construction of atmospheric-pressure plasma sources include non-electrically conducting materials like ceramics, glasses, plastics, and composites. Oxide ceramics like aluminum oxide and its variants, and zirconium oxide as well as oxide glasses like vitreous silicon oxide and borosilicate glasses are frequently used as insulating elements in the construction of atmospheric-pressure plasma sources because of the high breakdown voltages of these materials and their easy availability or high chemical purity. Fluorocarbon polymers such as Teflon™ are used as a dielectric in some atmospheric-pressure plasma systems because of the exceptionally high dielectric strength of this polymer even though the fluorocarbon polymer is costly. Other useful polymers and plastics include Delrin™, PEEK™, Ultem™, Kapton™, and other polymeric materials. Useful composite dielectrics include glass filled ceramics, ceramic-filled glasses, glass-filled polymers, and other multiphase, multicomponent materials that are electrically insulating.

When the housing of the gas chamber does not also function as an electrode, then the housing can be either electrically conducting or electrically insulating. For atmospheric-pressure plasma sources using inductively coupled plasmas or microwave plasmas it is preferred that the housing of the gas chamber be fabricated from an electrical insulator like glass, ceramic, or a temperature resistant and chemically resistance polymer.

Power supplies that are useful for the construction of atmospheric-pressure plasma sources include both AC and DC power supplies with voltage output amplitudes up to 20 kV. DC power supplies are useful although some atmospheric-pressure DC plasma sources suffer from electrode degradation that is related to DC cathode sputtering. AC power supplies are useful and can be operated over a wide range of frequencies. In one embodiment of an AC power supply in an atmospheric-pressure plasma source the AC power supply operates at a frequency between 1 Hz and 10 GHz. In a preferred embodiment of an AC power supply in an atmospheric-pressure plasma source the AC power supply operates at a frequency between 500 kHz and 1 GHz. In a further embodiment of an AC power supply in an atmospheric-pressure plasma source the AC power supply operates at a frequency between 500 kHz and 20 MHz.

In one embodiment an atmospheric-pressure plasma source with integrated radial-flow surface includes an electrode cooling method because a portion of the electrical power dissipated in the plasma is dissipated as heat. Useful electrode and gas chamber housing cooling methods known in the art of atmospheric-pressure plasma generation include convective cooling of surface, forced convection cooling of surfaces, and heat exchange using circulating cooled fluids where a part of the circulation loop brings the heat exchange fluid in contact with an electrode to cool the electrode.

The flow of gas through the gas chamber of an atmospheric-pressure plasma source can be controlled using any means familiar to those skilled in the art of gas delivery. Means of gas flow control include mass flow meters with valves, mass flow controllers, rotometers, bubblers, calibrated orifices and nozzles in combination with controlled pressures, and the like. The temperature of the gas flow entering the gas chamber of an atmospheric-pressure plasma source can be controlled using heater or heat exchanger in combination with a feedback loop from a thermal sensor in contact with the gas flow so that the thermal load of the heater or heat exchanger can be controller so as to provide the desired temperature of the output gas.

The electrical connection between an electrode and a power supply of an atmospheric-pressure plasma source can be accomplished using an electrical lead. Inductively coupled or microwave-powered atmospheric-pressure plasma sources are powered by power supplies operating in the megahertz to gigahertz frequency window and often use a single electrode connected to the power supply through a matching network. The matching network is used to minimize power loss due to parasitic capacitances and inductances. Capacitively coupled atmospheric-pressure plasma sources have a minimum of two separate electrodes, called an electrode pair, that are connected to the power supply through a matching network. In one embodiment the matching network is a resonant load match comprised of an isolation transformer. In one embodiment, an electrode pair can have one electrode at ground potential and one electrode that has a driven potential. In another embodiment, one electrode in the electrode pair is driven against the other in an electrically floating configuration. In another configuration, one electrode of an electrode pair in a capacitively coupled atmospheric-pressure plasma source is covered with an electrically insulating dielectric material.

In one embodiment of an inductively coupled or microwave powered atmospheric-pressure plasma source the power dissipating electrode is shaped around an elongated gas chamber that allows the gas to be exposed to the inductive electric fields generated by the electrode so that a plasma forms in the tube. In one embodiment of a capacitively coupled atmospheric-pressure plasma source the gas chamber is a tube and at least one electrode pair is positioned on opposite sides of the tube so that when AC electrical power is applied to the electrodes a portion of the electric field between the electrodes is parallel to the cross-sectional diameter of the tube. In an embodiment of a capacitively coupled atmospheric-pressure plasma source the gas chamber tube is made from a glassy dielectric material like Pyrex™ or vitreous quartz. In another embodiment of a capacitively coupled atmospheric-pressure plasma source the electrode pair is cooperatively shaped so that the electrodes cannot touch each other and a gas chamber is formed in a volume located between the two electrodes. A gas inlet and a gas outlet are in fluid communication with the gas chamber of the cooperatively shaped electrodes. The gas outlet is also in fluid communication with a jet nozzle located in a surface. In one embodiment, one of the cooperatively shaped electrodes of the electrode pair of the capacitively coupled atmospheric-pressure plasma source is covered with an electrically insulating dielectric material. In one embodiment, one of the cooperatively shaped electrodes is a metallic rod and the electrically insulating dielectric material is a vitreous quartz tube that is closed at one end. The cooperatively shaped metallic rod electrode is inserted into the quartz tube.

In an embodiment of an inductively coupled or microwave-coupled atmospheric-pressure plasma source a plasma is formed in the gas in the gas chamber when power is applied to the electrode. In an embodiment of a capacitively coupled atmospheric-pressure plasma source a plasma is formed in the gas in the gas chamber when power is applied to the electrode pair proximate to the gas chamber.

An atmospheric-pressure plasma source operates with gas pressures in the gas chamber at, near, or above the surrounding ambient atmospheric pressure. As used herein, near-atmospheric pressure includes pressure between 400 and 1100 Torr, and preferably pressures between 560 and 960 Torr. Pressures in the higher portion of this range can be achieved by pressurizing the gas chamber at the inlet to the gas chamber. Gas flows into the inlet of the gas chamber, through the gas chamber, through the outlet of the gas chamber and through the jet nozzle to produce a gas flow out of the jet nozzle having a Reynolds number greater than or equal to 2700. In one embodiment the gas exiting the gas chamber flows to the surrounding ambient atmospheric pressure in the form of a jet. The type of gas used in an atmospheric-pressure plasma source is determined by the intended application of the plasma source. The gas is selected from one or more of the following gases: helium, neon, argon, krypton, oxygen, nitrogen, hydrogen or a mixture thereof. In one embodiment the gas used in an atmospheric-pressure plasma source is comprised of a mixture of argon gas and oxygen gas. In another embodiment the gas used in an atmospheric-pressure plasma source is comprised of a mixture of argon gas and nitrogen gas. It is known in the art of plasma processing that it is advantageous to add small amounts of additional reactive gasses to the main gas mixture in order to enhance the reactivity of the plasma-generated gas species or for the purpose of carrying out additional processing that benefits from the presence of a plasma-excited reactive gas. Additional gasses that are added to the main plasma-excited reactive gas flow are selected from but not limited to the following group of gasses: gasses containing volatile hydrocarbon compounds, gasses containing volatile fluorocarbon compounds, gasses containing volatile nitrogen containing compounds, gasses with volatile organometallic compounds, and gasses containing volatile halogen containing compounds. In one embodiment, gasses with a Joule-Thomson inversion temperature equal to or above 300 K are preferred. In another embodiment gasses with an inversion temperature below 300 K is preferred.

An atmospheric-pressure plasma is produced in an atmospheric-pressure plasma source when power is applied to the atmospheric-pressure plasma source and an electric field is produced in the gas chamber that is sufficient to maintain a plasma in the gas chamber. Although a plasma can be lit in an atmospheric-pressure plasma source when no gas is flowing through the gas chamber, it is preferred that gas be flowing through the gas chamber of the atmospheric-pressure plasma source when the plasma is lit. It is preferred that the flow of gas flowing through the gas chamber be sufficient to produce a gas flow having a Reynolds number greater than or equal to 2700 as the gas jet, which is a collimated flow of gas, leaves the jet nozzle in the radial-flow surface. The plasma that is produced in the gas flow contains reactive gasses that are produced by the non-thermal non-equilibrium electrical discharge through the gas in the gas chamber. As the gas flows from the inlet and through the gas chamber, a plasma-excited reactive gas with plasma-generated gas species is formed that flows out of gas chamber outlet and through the jet nozzle in the radial-flow surface of the atmospheric-pressure plasma source so that confined jet impingement occurs on the treatment surface of a proximate object. The radial-flow surface and the treatment surface maintains a radial flow of plasma-generated gas species. In one embodiment the plasma excited reactive fluid from confined jet impingement and outwardly divergent radial flow is exhausted and removed at the confinement surface boundaries by means of a gas exhaust port that is proximate to the edge of one of the confining surfaces.

A micro-plasma is a plasma discharge that is confined in at least one spatial dimension to a length of 2 mm or less. According to Iza et al (F. Iza, G. J. Kim, S. M. Lee, J. K. Lee, J. L. Walsh, Y. T. Zhang, and M. G. Kong, Plasma Processes and Polymers 2008, 5, 322-344) "the term micro-plasma is typically used to refer to discharges with dimensions that range from a few micrometers up to a few millimeters". Papadakis, Rossides, and A. C. Metaxas propose a similar classification and cites Foest et al that a micro-plasma is a plasma that is spatially confined to a cavities with dimension below 1 mm (A. A. Papadakis, S. Rossides, A. C. Metazas, The Open Applied Physics Journal, 2011, 4, 45-63 and R. Foest, M. Schmidt, and K. Becker, Int, J. of Mass Spectrom. 2006, 248, 87-102). In one embodiment the inventive atmospheric-pressure plasma source with integrated radial-flow surface and confined impingement jet is an atmospheric-pressure micro-plasma source wherein at least one dimension of the gas chamber is less than 2 mm. Iza et al (loc cit) classify micro-plasma sources according to type: DC and hollow-cathode discharges, dielectric-barrier discharges, corona discharges, RF capacitively coupled plasmas, RF inductively coupled plasmas, and microwave plasmas. In another embodiment the inventive atmospheric-pressure plasma source with radial-flow surface and confined impingement jet is an atmospheric-pressure micro-plasma source wherein the micro-plasma source is selected from at least one of the following micro-plasma source types: DC- and hollow-cathode discharges, dielectric-barrier discharges, corona discharges, RF capacitively coupled plasmas, RF inductively coupled plasmas, and microwave plasmas. In one embodiment, RF capacitively coupled micro-plasmas are preferred sources for the atmospheric-pressure micro-plasma source with integrated radial-flow surface and confined impingement jet. In another embodiment, dielectric barrier discharges are preferred micro-plasma sources for the atmospheric-pressure micro-plasma source with integrated radial-flow surface and confined impingement jet.

U.S. Pat. No. 8,328,982 by Babayan and Hicks titled "Low-Temperature, converging reactive gas source and method of use" describes the construction of atmospheric-pressure plasma sources with a shaped gas chamber that produces a converging gas flow in the plasma generating region and produce "direct impingement of reactive gas of the plasma on a workpiece". The term "direct impingement" means only that the reactive gas flows in some undefined manner towards a surface upon which the reactive gas impinges. The use of convergent inward radial flow of gas in the gas chamber of the reactive gas source with convergence of the flow through the gas chamber outlet is described as a method to bring the plasma generating zone closer to the workpiece. All gas flow pathways disclosed in U.S. Pat. No. 8,328,982 are convergent inward flow paths that are internal to the reactive gas source itself. U.S. Pat. No. 8,328,982 discloses slot sources that produce a "linear beam" or curtain of reactive gas (column 3 line 35). U.S. Pat. No. 8,328,982 discusses and discloses various "electrode shapes" for two adjacent electrodes in order to provide convergent flow of gas through a plasma generating volume between the electrodes. U.S. Pat. No. 8,328,982 discloses and teaches specific electrode configurations that are useful for atmospheric-pressure plasma sources. U.S. Pat. No. 8,329,982 teaches that the plasma source, regardless of electrode configuration or source design must be at least 0.1 to 5 mm from a workpiece. U.S. Pat. No. 8,328,982 discloses "a plasma device of claim 1, wherein the first electrode and the second electrode form a nozzle for accelerating the gas flow out of the single outlet" (claim 9, col 14, lines 52-54). There is little information disclosed in U.S. Pat. No. 8,328,982 concerning dimensions for the gas outlet. There is no information disclosed in U.S. Pat. No. 8,328,982 concerning dimensions for circular gas outlets or nozzles, U.S. Pat. No. 8,328,982 shows a lack of recognition and a lack of teaching of the critical factors required to produce either free jet impingement or confined jet impingement. It can be concluded that Babayan et al in U.S. Pat. No. 8,328,982 do not teach or anticipate an atmospheric-pressure plasma source with an integrated radial-flow surface for confined jet impingement.

As is apparent to those skilled in the art, U.S. Pat. No. 8,328,982 does not anticipate, disclose, or teach any specific fluid impingement method of reactive gas, free jet impingement, confined jet impingement, or teach the useful advantages of outward radial flow of fluids. Furthermore, U.S. Pat. No. 8,328,982 does not anticipate, disclose, suggest, or teach the integration of a radial-flow surface in an atmospheric-pressure plasma source, the advantages of outward divergent radial gas expansion after a plasma-excited reactive gas with plasma-generated gas species impinges on an impingement surface, or any method for accelerating gas flow that does not require a first and second electrode to form a nozzle. Moreover, U.S. Pat. No. 8,328,982 does not anticipate, disclose, or teach an atmospheric-pressure plasma system with an integrated radial-flow surface for confined jet impingement of plasma-excited reactive gases.

A distinguishing feature of the inventive atmospheric-pressure micro-plasma source with confined impingement jet is the integrated radial-flow surface that allows confined jet impingement when the atmospheric-pressure plasma source is proximate to the surface of an object. When a jet that is impinging on an impingement surface is confined the radial spread of the wall jet is affected so that the wall jet is restricted to a narrow channel between the impingement surface of an object and opposing radial-flow surface containing the jet nozzle from which the jet emanates. The integrated radial-flow surface is also called a confinement surface that affects the radial spread of the wall jet so that the wall jet is restricted to a narrow channel between the impingement surface of an object and the opposing radial-flow surface.

In one embodiment the atmospheric-pressure micro-plasma source with radial-flow surface is positioned proximate to and opposing the surface of an object to be plasma processed. In one embodiment, the radial-flow surface is electrically conducting and has a different electrical potential than the object being treated. In another embodiment the radial-flow surface is electrically conducting and has the same electrical potential as the object being treated. In one embodiment, the radial-flow surface has the same electrical potential as the surface of the object being treated. In another embodiment the radial-flow surface has a different electrical potential than the surface of the object being treated.

In one embodiment, the radial-flow surface of an atmospheric-pressure micro-plasma source is planar, has a circular shape that is continuous except for a jet nozzle in the center wherein the radius of the circular surface is greater than or equal to 10 times the diameter of the jet nozzle. In another embodiment, the radial-flow surface of an atmospheric-pressure micro-plasma source is nonplanar, has a spherical shape extending outwards from a jet nozzle and is continuous except for the jet nozzle wherein the effective minimum radius is an arc of minimum length along the spherical surface of the radial-flow surface between the jet nozzle in the spherical surface and the edge of the spherical surface and is greater than or equal to ten times the diameter of the jet nozzle. In another embodiment, the radial-flow surface of an atmospheric-pressure micro-plasma source is nonplanar, has an arbitrary shape extending outwards from a jet nozzle and is continuous except for the jet nozzle wherein the effective minimum radius is a length of a line along the surface that is of minimum length running between the jet nozzle in the surface and the edge of the surface and is greater than or equal to ten times the diameter of the jet nozzle.

In another embodiment the radial-flow surface of an atmospheric-pressure micro-plasma source is an exposed planar surface of a disk with a jet nozzle that is continuous except for the jet nozzle in the center of the disc, the jet nozzle being in fluid communication with the gas chamber of the atmospheric-pressure micro-plasma source, the radial-flow surface of the disk having a circular shape with a jet nozzle in the center wherein the radius of the circular surface is greater than or equal to ten times the diameter of the jet nozzle.

In a further embodiment an atmospheric-pressure micro-plasma source with a radial-flow surface the radial-flow surface is separated from a treatment surface or impingement surface of an object by a substantially constant gap that is less than or equal to two times the impingement jet nozzle diameter in the radial-flow surface so that the gas flows radially outward from the jet nozzle and between the radial-flow surface and the treatment surface.

In a further embodiment, the surface area of the radial-flow surface of the atmospheric-pressure micro-plasma source with integrated radial-flow surface is less than or equal to the opposing surface area of the impingement surface or treatment surface of an object and the two opposing confinement surfaces are separated by a substantially constant gap that is less than or equal to two times the impingement jet nozzle diameter in the radial-flow surface. The impinging jet of gas or plasma-excited reactive gas emanating from the radial-flow surface is confined between the two opposing confinement surfaces and the gas flows radially outward from the jet nozzle and between the radial-flow surface and the treatment surface.

In a further embodiment an atmospheric-pressure plasma source with an integrated radial-flow surface, the radial-flow surface of the plasma source is separated from a treatment surface or impingement surface of an object by a substantially constant gap that is less than or equal to two times the impingement jet nozzle diameter in the radial-flow surface so that the gas flows radially outward from the jet nozzle and between the radial-flow surface and the treatment surface such that the confined jet impingement has a gas flow characterized by a convergent-divergent flow path such that the gas flows through a convergent flow path from the gas chamber to the jet nozzle and subsequent follows a divergent flow path with radially symmetric gas expansion after exiting the jet nozzle. This flow configuration is also called confined jet impingement with a convergent-divergent radial flow path.

In contrast to the present invention, remote atmospheric-pressure plasma sources generally rely on free jet impingement as a method of transporting with plasma-generated gas species in the plasma-excited reactive gas to the surface of an object to be treated. Free jet impingement is hindered by ambient gas entrainment into the gas jet which leads to chemical contamination of the atmospheric-pressure plasma excited gas jet. Contamination of the plasma-excited reactive gas from an atmospheric-pressure plasma device is a problem that limits the utility of all known atmospheric-pressure plasma sources. Reuter et al (S. Reuter, J. winter, A. Schmidt-Bleker, H. Tresp, M. U. Hammer, and K-D Weltmann, IEEE Trans. Plasma Science 40 (11) November 2012, 2788) have studied the entrainment of atmospheric gasses into an argon plasma jet. Reuter et al also studied the use of shielding gas curtains around the plasma jet to minimize the impact of ambient air on the reactive species in the plasma and demonstrated that the emission from the second positive system of molecular nitrogen that is excited by metastable high energy argon atoms produced by the plasma is a sensitive probe for gas entrainment from ambient air into the argon plasma jet. When gas entrainment occurs then emission from the second positive system of molecular nitrogen is observed. The use of gas shrouds and gas shields to minimize gas entrainment of ambient air into gas jets is well known to those skilled in the art of atmospheric-pressure plasma processing. The use of a gas shields or gas shrouds introduces additional complexity into the operation of an atmospheric-pressure plasma device has disadvantages of increasing the overall size of the plasma device as well as increasing the operational complexity of the equipment.

Example 1

Example 1 demonstrates an advantage of an atmospheric-pressure plasma source with an integrated radial-flow surface and confined jet impingement by demonstrating that a gas shield is not required to eliminate the entrainment of ambient atmospheric impurities into the plasma jet of the present invention.

Figure 4A:
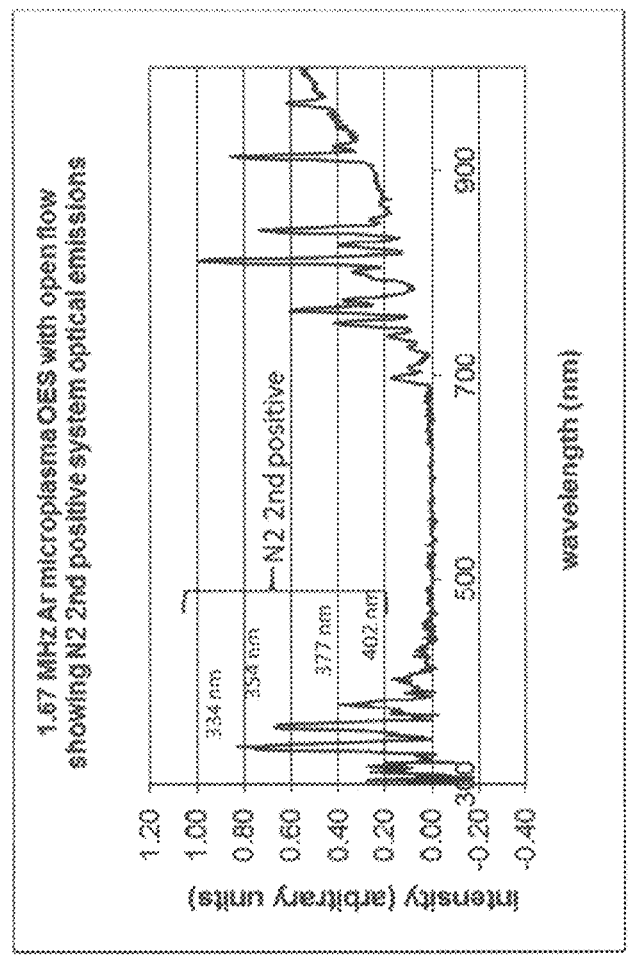
FIGS. 4A-4B are graphs illustrating attributes of radial flow in embodiments of the present invention.
Figure 4B:
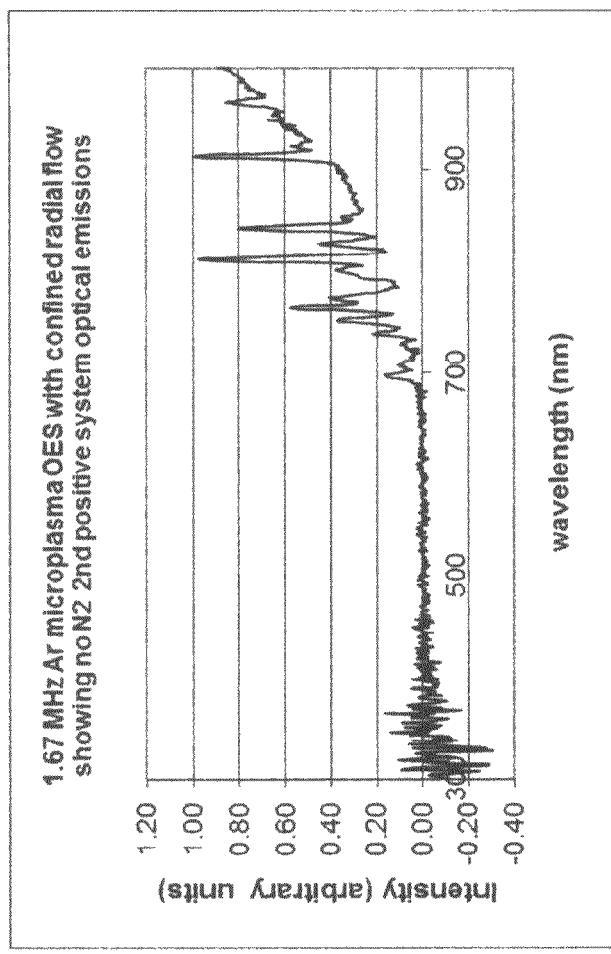

A coaxial atmospheric-pressure micro-plasma source similar to that shown in FIG. 3A was constructed using titanium metal as the construction material for electrodes 306 and 308. Electrode 306 was the driven high-voltage electrode and differed from FIG. 3A in that a sharpened tip was machined in place of the rounded tip on the end of electrode 306 that was located nearest nozzle 316. The insulator sheath 310 covering electrode 306 was fabricated from a vitreous quartz capillary having an outer diameter of 0.112" (2.84 mm). The outside diameter of the gas chamber 314 was 0.2" (5.08 mm). The gap through which the gas in the gas chamber flowed had a radial dimension of 1.1 mm. The capacitively coupled plasma generated in the gas chamber is, therefore, a micro-plasma because one of its dimensions—the annular thickness of the plasma layer between the electrodes—is, at all times, less than two mm. The nozzle diameter 312 of nozzle 316 was 0.031 inches (0.787 mm) and the radius 322 of the disc shaped radial-flow surface was 21.9 mm. The radial-flow surface radius is greater than ten times the diameter of the jet nozzle. The plasma source was load matched to an ENI power amplifier through a custom-built isolation transformer. The driving waveform for the plasma source was supplied by a Keithley waveform generator. The plasma source was used to generate an argon plasma at 1.67 MHz. The argon flow was 5 slpm. The optical emission spectrum (OES) of the plasma plume was measured using a Licor portable spectrometer in the wavelength range from 300 nm to 1000 nm. The spectrometer fiber-optic probe was positioned perpendicular to the radial-flow surface of the plasma source to look directly up the jet nozzle. The distance between the spectrometer fiber optic and the plasma-source nozzle was held constant during all optical emission measurements. Power measurements during cell operation were done with a Tektronix model TDS 2024B digital oscilloscope. Secondary voltage at the high-voltage electrode was measured using a Tektronix model P6015A high voltage probe (1000:1 step down probe) and the secondary current in the cell was measured with an inductive current transformer (Pearson wide band current monitor model 4100, 1V/1 A output, Pearson Electronics, Palo Alto, Calif.). The dissipated power in the plasma was measured by calculating the mean value of the instantaneous product of secondary current and secondary voltage over several waveform cycles. The digital oscilloscope was used to do the calculation in real time using the oscilloscope functions to calculate the mean value of the math waveform generated by the product of the instantaneous voltage and the instantaneous current. As is customary with digital oscilloscope (DOSC) dissipated-power measurements, the time base of the DOSC was adjusted so that a sufficient number of waveforms were used to obtain a good estimate of the dissipated power. The dissipated power in the plasma was held constant at 35 watts for all optical emission measurements. The OES of the micro-plasma was measured in two different configurations: 1) an open flow configuration that is equivalent to a free jet and 2) a confined jet impingement configuration with a separation distance between the two confining surfaces of approximately 300 microns. The 300 micron separation distance between the transparent quartz confining surface and the radial-flow surface is less than twice the jet nozzle diameter. In the confined jet impingement configuration one of the confining surfaces was the radial-flow surface 320 of the plasma source and the other confining surface was the surface of a 150 mm 150 mm 1.5 mm vitreous quartz plate. The surface area of the quartz plate is at least as large as the surface area of the radial-flow surface. FIGS. 4A and 4B show the optical emission spectra acquired for the two conditions of free jet impingement and confined jet impingement. FIG. 4A shows the OES of the atmospheric-pressure argon plasma effluent and, consistent with Reuter et al. (loc cit), shows evidence of gas entrainment as indicated by the presence of emission from the second positive system of molecular nitrogen at wavelengths less than 500 nm. The optical emission from just the argon plasma is identified by the strong emission lines at wavelengths greater than 600 nm. FIG. 4B shows the optical emission spectrum measured for the same argon plasma at the same dissipated power and flow rate except that the effluent gas flow from the cell is configured for confined jet impingement onto the surface of a vitreous quartz plate. The optics for acquisition of the emission spectrum are identical to 4A except for the presence of the quartz plate which is transparent from 200 nm to greater than 1200 nm. FIG. 4B shows only optical emission lines that are attributed to the atmospheric-pressure argon plasma. The low-wavelength noise below 500 nm in FIG. 4B is an artifact of the detector response in the spectrometer. There is little if any evidence for gas entrainment of ambient air into the impingement zone of the confined jet impingement as indicated by the absence of any emission lines at wavelength less than 500 nm that might be associated with either the second positive system of molecular nitrogen or other excited gas phase species. The comparison of FIG. 4A to 4B demonstrates that confined jet impingement can effectively eliminate ambient gas entrainment into the plasma-excited reactive gas jet emanating from the radial-flow surface of the atmospheric-pressure plasma source—eliminating the need for more complex gas shrouding apparatuses.

The level of ambient gas entrainment that occurs during confined jet impingement from a gas jet emanating from the radial-flow surface of an atmospheric-pressure plasma source is related to several factors. One of the important factors determining ambient gas entrainment during confined jet impingement is the distance between the jet nozzle and the opposing confining surface. A second factor is the distance between the two opposing confining surfaces. Gas entrainment is reduced in confined jet impingement when the distance separating the jet nozzle from the opposing surface is less or equal to two times the diameter of the jet nozzle. Similarly, gas entrainment is reduced in confined jet impingement when the ratio of the distance separating opposing confinement surfaces is less or equal to two times the diameter of the jet nozzle.

A third factor affecting ambient gas entrainment is related to the ratio of the effective minimum radius of the radial-flow surface to the jet nozzle diameter. For all the embodiments of atmospheric-pressure plasma sources with integrated radial-flow surface it is preferred that the effective minimum radius of the radial-flow surface be at least five times greater and more preferably ten times larger than the jet nozzle diameter. Additionally, for the embodiments given in example 1 it is preferred that the surface area of the largest circular surface area on be at least as large as the surface area of the radial-flow surface when the opposing surface areas are aligned so that a surface normal located at the center of the largest circular area on the opposing confinement surface passes directly through the center of the jet nozzle on the radial-flow surface.

Example 2

Example 2 shows that an atmospheric-pressure plasma source with an integrated radial-flow surface and confined jet impingement generates a sub-atmospheric-pressure zone adjacent to the jet when the distance between the confining surfaces defined by the radial-flow surface and the impingement surface is less than two times the jet nozzle diameter and the confining surfaces each have an effective minimum radius at least ten times greater than the jet nozzle diameter.

The pressure distribution during confined jet impingement of the fluid from the jet in the confinement channel between the radial-flow surface of the atmospheric-pressure micro-plasma source with a 43.7 mm diameter circular radial-flow surface of Example 1 above and an aluminum plate of dimension 4"×0.5" (101.6 mm×101.6 mm×12.7 mm) was measured as a function of the spacing between the two opposing confinement surfaces. The confining surface of the aluminum plate was equipped with a 0.025" ID pressure tap connected to either a vacuum or a pressure gauge. The vacuum and pressure gauges employed were either a Cecomp model DL1000 or a Cecomp model DL1000L, respectively. The spacing between the atmospheric-pressure micro-plasma source radial-flow surface and the aluminum plate surface was measured using a micrometer and adjusted to give the desired spacing between the two confinement surfaces so that a substantially uniform gas was maintained between the two jet confinement surfaces. All pressure and vacuum measurements were taken after the desired gas flow was initiated. Once the gas flow was initiated, the aluminum plate was translated relative to the atmospheric-pressure micro-plasma source so that the pressure tap followed a path along the diameter of the radial-flow surface, including passing directly underneath the 0.031" (0.787 mm) ID jet nozzle thereby enabling a direct measurement of the jet pressure at the opposing confining surface. At each position the 4-20 mA signal from the gauge was converted to a voltage signal using a termination resistor and the voltage signal, which is proportional to pressure or vacuum, was digitized using a Datataker DT80. The voltage data was processed and rescaled to produce a plot of a relative pressure in kPa as a function of distance where zero pressure is defined as the prevailing ambient pressure. Pressures lower than prevailing ambient pressure (sub-atmospheric pressures) are assigned negative values whilst pressures greater than ambient are assigned positive values. FIGS. 5A through 5D show the pressure profiles measured for four different spacings between the confinement surfaces while using a constant fluid flow of 7 slpm argon through the atmospheric-pressure micro-plasma source. The Reynolds number of the flow was in excess of 100,000. The greatest pressure measured was identified as the center of the jet nozzle position on the radial-flow surface of the atmospheric-pressure micro-plasma source and was assigned a distance value of 0 mm. The radial-flow surface of the atmospheric-pressure micro-plasma source extends approximately 21.9 mm in the positive and negative directions relative to the jet nozzle center.

Figure 5A:
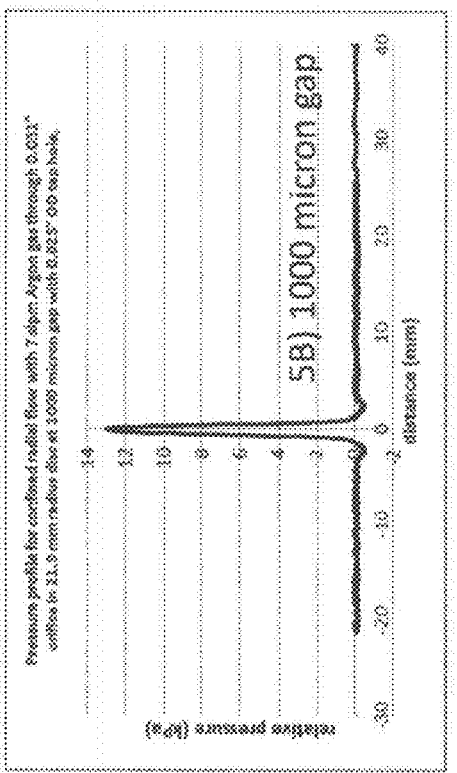
FIGS. 5A-5D are graphs illustrating attributes of radial flow in embodiments of the present invention.
Figure 5B:
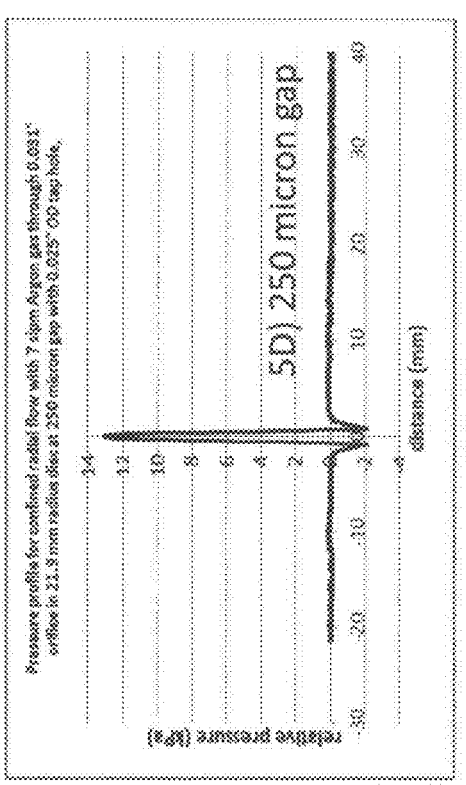
Figure 5C:
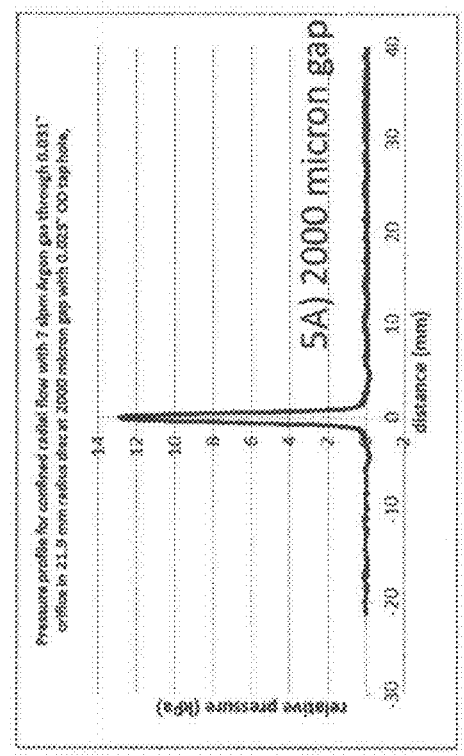
Figure 5D:
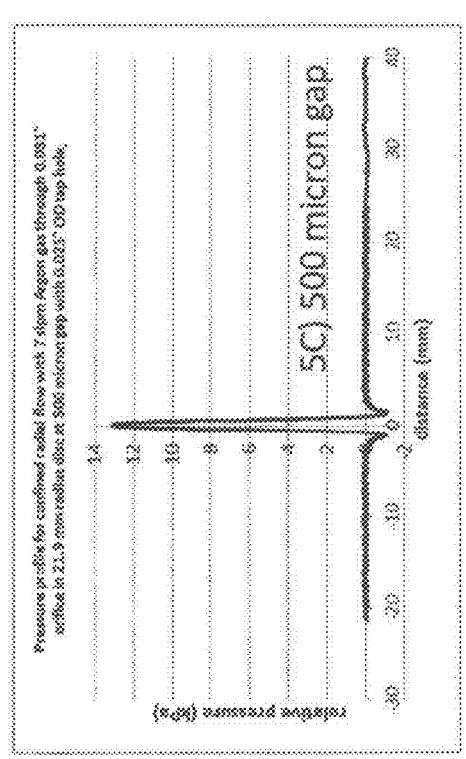

FIG. 5A shows that the 2000 micron or 2 mm confinement surface spacing behaves like a free jet impingement with little or any sub-atmospheric-pressure zones formed adjacent to the jet. In contrast, FIGS. 5B, 5C, and 5D with confinement spacings all less than 1.574 mm (i.e. less than 2 times the jet nozzle diameter of 0.787 mm) all show an annular sub-atmospheric-pressure zone adjacent to and surrounding the jet that is characteristic of confined jet impingement. The pressure profiles of the fluid taken at different spacings of the opposing confinement surfaces during confined jet impingement show that when the confinement surfaces are spaced less than two jet nozzle diameters apart there is a characteristic sub-atmospheric-pressure annular zone that is formed in the narrow confinement channel where the confined wall jet is radially expanding. The magnitude of the vacuum in the sub-atmospheric-pressure zone is related to the spacing between the confinement surfaces: at constant flow rate, the smaller the confinement surface spacing the lower the measured sub-atmospheric pressure in the sub-atmospheric-pressure zone. The sub-atmospheric-pressure zone surrounding the confined impinging jet is a characteristic of confined jet impingement when the spacing between the fluid confining surfaces is less than or equal to 2 jet nozzle diameters. The presence of a sub-atmospheric-pressure zone adjacent to the impingement zone in confined jet impingement is important because there is enhanced mass transport to the opposing confinement surface in the sub-atmospheric-pressure zone. The enhanced mass transport improves the efficiency of plasma treatment at the opposing confinement surface.

In Example 2 an object with its surface, namely the aluminum plate with its surface and pressure tap, is translated relative to the atmospheric-pressure micro-plasma source with radial-flow surface in a confined jet impingement configuration to measure the pressure in the confinement zone as a function of position. In another embodiment, the atmospheric-pressure micro-plasma source can be translated relative to the surface of the object for the purpose of localized plasma treatment with a micro-plasma source.

Figure 6:
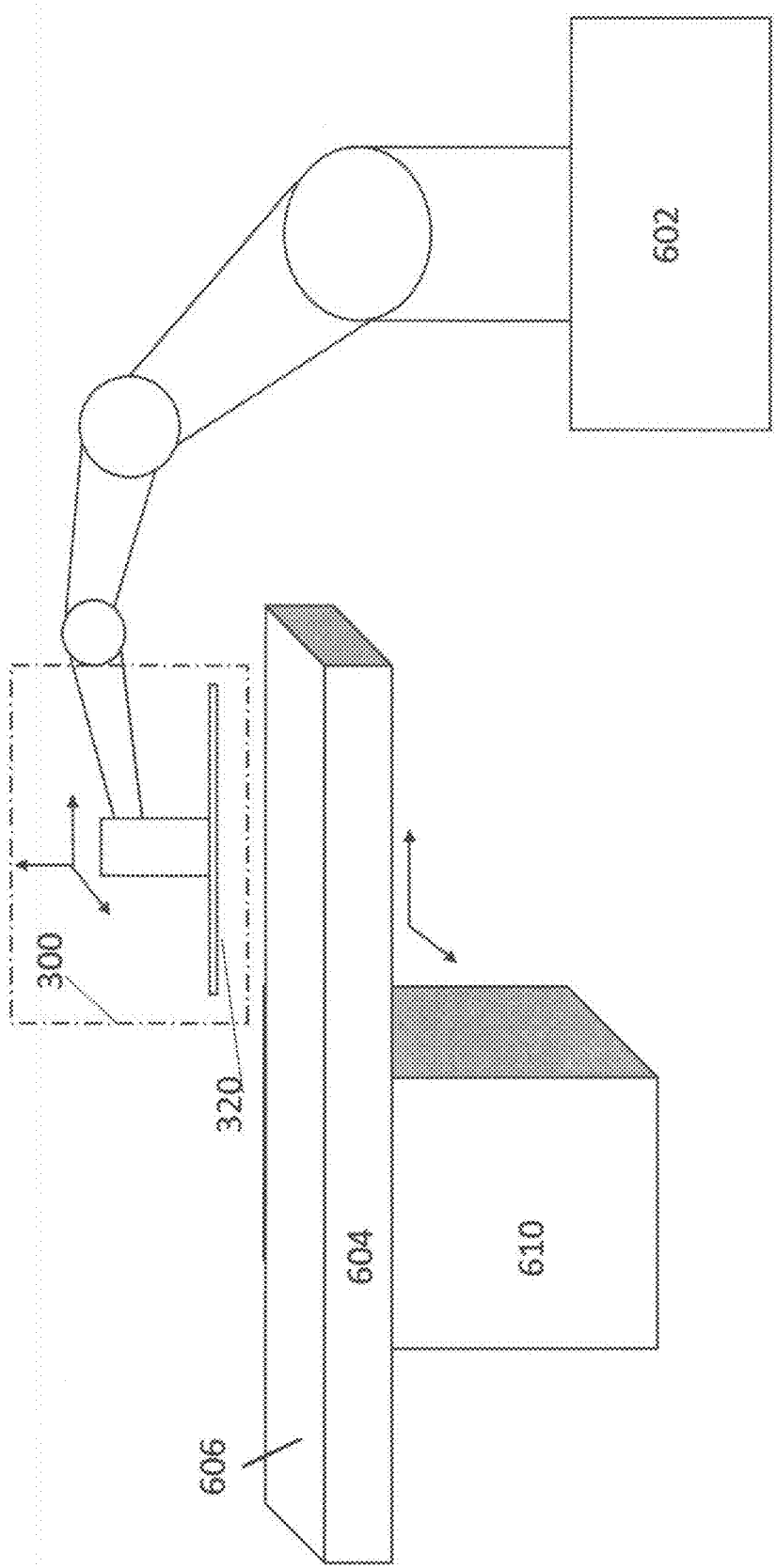
FIG. 6 is a perspective illustrating an embodiment of the present invention.

FIG. 6 shows an atmospheric-pressure micro-plasma source 300 with radial-flow surface 320 mounted on a robot 602 that provides a means for translating the atmospheric-pressure micro-plasma source over the surface of an object 604. The surface of the object 606 provides a confinement surface opposing the radial-flow surface 320 of the atmospheric-pressure micro-plasma source that allows confined jet impingement of the plasma-excited reactive gas on the surface 606 of object 604. The arrows under object 604 indicate that object 604 can be translated in two directions relative to micro-plasma source 300 by –y translation unit 610 thereby providing a means for providing regions of localized atmospheric-pressure micro-plasma treatment on the surface of object 604. Atmospheric-pressure micro-plasma source 300 is attached to robot 602 and robot 602 can translate the micro-plasma source in three different directions—, y, and z—as indicated by the three arrows in order to appropriately position the atmospheric-pressure micro-plasma source 300 at a desired position and height relative to the object surface 606, thereby allowing confined jet impingement of a plasma-excited reactive gas from atmospheric-pressure micro-plasma source at a desired location. The arrangement shown in FIG. 6 is advantageous for patterned micro-plasma processing of objects. The object 604 is shown with a planar surface 606; however, in another embodiment, the surface of object 604 can be non-planar and the radial-flow surface of atmospheric-pressure micro-plasma source 300 can be formed in a complementary non-planar fashion so that the two opposing confining surfaces that are brought proximate to each other during confined jet impingement are topographically conformal and have a substantially constant gap between them. FIG. 6 is an embodiment of an atmospheric-pressure micro-plasma source with a radial-flow surface further comprising a first translation device that translates the object in a first direction and a second translation device that translates the plasma source in a second direction different from the first direction.

In the embodiment shown in FIG. 13, a planar wafer shaped object 1302 is mounted on a rotating pedestal 1304 that is linearly translated by stage 1306 underneath atmospheric-pressure plasma source 300. Rotating pedestal 1304 is a rotation device that moves object 1302 relative to the plasma source. In one embodiment the atmospheric-pressure plasma source 300 is a micro-plasma source. The plasma source 300 is attached to robot 602 and robot 602 can translate the micro-plasma source in three different directions as indicated by the three arrows in order to appropriately position the atmospheric-pressure plasma source 300 at a desired location and height relative to the surface of planar wafer shaped object 1302, thereby allowing confined jet impingement of a plasma-excited reactive gas with plasma-generated gas species from atmospheric-pressure micro-plasma source at a desired location. Programmed translation of linear translation stage 1306 that takes into account the rotational speed of pedestal 1304 is used to produce constant exposure time of confined jet impingement over the surface of object 1302. The configuration disclosed in FIG. 13 is advantageous for atmospheric-pressure processing of wafer-shaped substrates with an atmospheric-pressure plasma source having an integrated radial-flow surface.

FIG. 7 shows a cross-sectional view of an embodiment of an atmospheric-pressure plasma source 750 with non-planar radial-flow surface 706 with confined jet impingement where jet nozzle 700 with jet nozzle diameter 712 is positioned proximate to a non-planar impingement surface 702 of non-planar object 704 at a jet nozzle separation distance 710. The confinement surfaces 702 and 706 are separated by non-planar confinement gap 716 that is essentially equal to 710. In one embodiment the plasma in plasma source 750 is a micro-plasma. Fluid flows through jet nozzle 700 to form a fluid jet that impinges on non-planar treatment surface 702 of non-planar object 704 at the impingement zone 104 and flows radially outward along a distance 714. In one embodiment the nonplanar treatment surface 702 of object 704 includes a polymer. In one embodiment the nonplanar treatment surface 702 of object 704 is electrically conductive or the nonplanar conformal radial-flow surface 706 is electrically conducting. The radially spreading wall jet that flows outward from impingement zone 104, follows the topographical contours of non-planar surface 702, and is constricted to flow in the narrow channel between non-planar impingement surface 702 and non-planar radial-flow surface 706 that are separated by confinement surface gap 716. In one embodiment the confinement surface gap 716 is substantially constant at all locations within a radial distance of 10 times the jet nozzle diameter, for example within 10%, 5%, or 1%. The non-planar radial-flow surface 706 is also a confinement surface. In the embodiment of confined jet impingement shown in FIG. 7 the confinement surface gap 716 is essentially equal to the nozzle separation distance 710 and the two non-planar confinement surfaces 706 and 702 are topographically conformal. The fluid from the jet cannot interact with fluid outside the confinement surfaces until the fluid flow leaves the confinement surface boundary 118. The confinement surface boundary 118 is typically the edge of one of the confinement surfaces like, for example, the edge of an orifice plate or the edge of an impingement surface. In the embodiment of confined jet impingement shown in FIG. 7 the jet nozzle 700 is shown positioned so that the free jet impinges perpendicular to surface 702; however, those skilled in the art of jet impingement recognizes and understand that in another embodiment of confined jet impingement the confined free jet emanating from nozzle 700 can impinge on surface 702 at angles other than 90 degrees. In FIG. 7 the confinement surfaces 702 and 706 are non-planar topographically conformal confinement surfaces. In other words, the radial flow surface 706 has a surface profile that conforms to a non-planar treatment surface 702 of an object 704. In a further embodiment of confined jet impingement (not shown) the confinement surface 702 and 706 are non-conformal confinement surface that do not contact each other and are separated by a variable confinement surface gap 716 with the provision that the confinement surface gap is always less than two times the jet nozzle diameter. In the embodiment of FIG. 7, jet nozzle 700 is in fluid communication with the gas chamber outlet of atmospheric-pressure micro-plasma source 700, surface 706 is a non-planar radial-flow surface, and surfaces 702 and 706 are opposing conformal non-planar confining surface producing confined jet impingement of a plasma-excited reactive gas jet, which is a collimated flow of gas with plasma-generated gas species, emanating from nozzle 700. The atmospheric-pressure micro-plasma source 750 with non-planar topographically conformal radial-flow surface 706 can be translated with respect to topographically conformal confinement surface 702 in at least one direction to generate regions of localized plasma exposure on the surface of object 704.

Topographically conformal radial-flow surfaces can be rigid or non-rigid. Topographically conformal radial-flow surfaces can be flexible. A flexible radial-flow surface has the advantage that it is moldable and topographically compliant. A flexible radial-flow surface that is moldable can be shaped to meet the exact requirements for topographic compliance between the two confining surfaces used for confined jet impingement and thus ensures a substantially equal gap at all positions between the confinement surfaces. An example of a flexible radial-flow surface is a surface consisting of a very dense grid of movable pins that displace in one direction upon contact with a surface to form an impression of a surface that is topographically conformal.

Figure 8C:
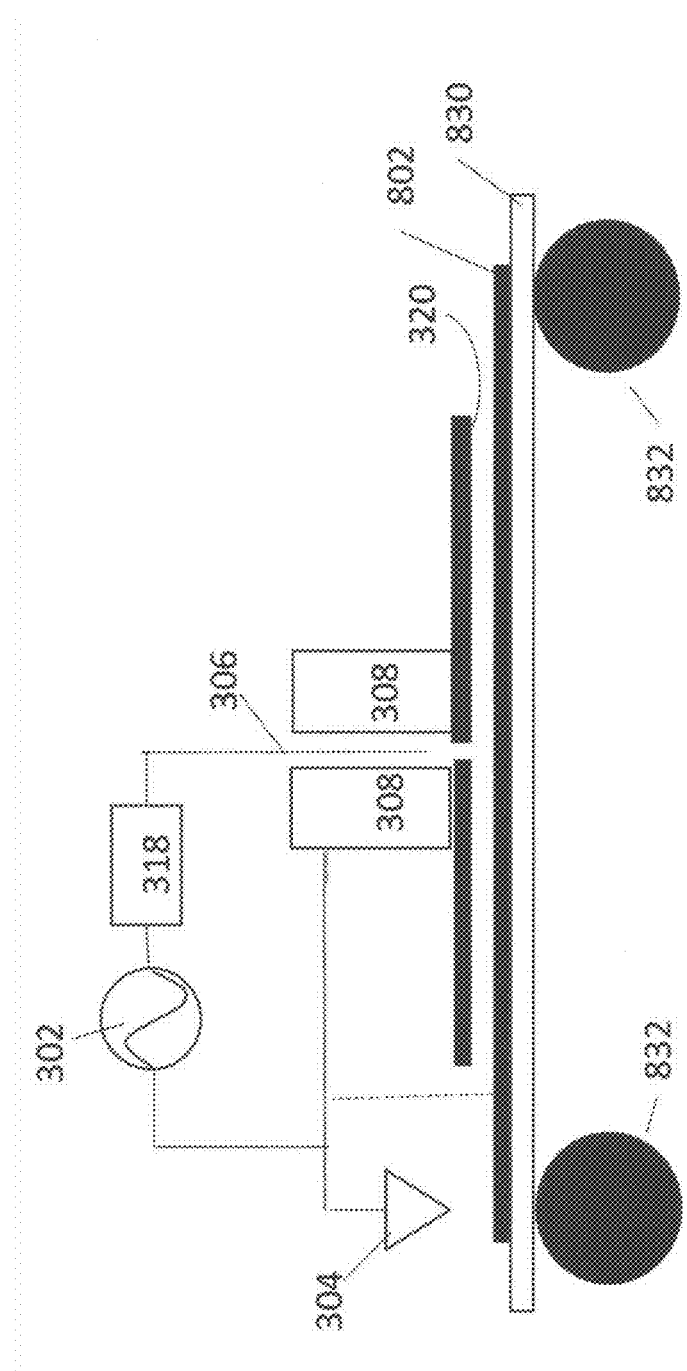

FIGS. 8A, 8B, and 8C illustrate three embodiments of plasma processing using an atmospheric-pressure plasma source with integrated radial-flow surface. In one embodiment of the configurations shown in FIGS. 8A, 8B, and 8C the plasma source is a micro-plasma source. FIG. 8A shows atmospheric-pressure plasma source 300 with power supply 302, matching network 318, electrodes 306 and 308, earth ground potential point 304, and radial-flow surface 320. Radial-flow surface 320 is proximate and opposing the electrically conducting surface of conductor 802. Conductor 802 is a conductor on a side of object 810 that is opposite the radial-flow surface 320. Conductor 802 is located between object 810 and radial-flow surface 320. The dashed line between the ground potential 304 and conductor 802 indicates an optional electrical communication between conductor 802 and ground potential. In one embodiment, conductor 802 is on the surface on the side of object 810 that is not opposed to radial-flow surface 320. In another embodiment, conductor 802 is part of the surface of object 810. In a further embodiment, object 810 is in electrical communication with conductor 802 and has the same electrical potential as conductor 802. In a further embodiment, object 810 is not in electrical communication with conductor 802 and has a different electrical potential than the electrical potential of conductor 802. In one embodiment, conductor 802 has the same common electrical potential as radial-flow surface 320. In another embodiment, conductor 802 has an electrical potential that is different from the electrical potential of radial-flow surface 320. In one embodiment, the conductor 802 is in electrical communication with object 810 and both the conductor 802 and the object 810 are at the same potential as the radial-flow surface 320. In a further embodiment, the conductor 802 is in electrical communication with object 810 and both the conductor 802 and the object 810 are at ground potential as is the radial-flow surface. In another embodiment, the electrical potential of object 810 is different from both the conductor 802 and the radial-flow surface 320, the potential of object 810 being in between the electrical potentials of the conductor and the radial-flow surface, greater than the electrical potentials of both the conductor and the radial-flow surface, or less than the electrical potential of both the conductor and the radial-flow surface.

FIG. 8B shows an atmospheric-pressure micro-plasma source 300 with power supply 302, matching network 318, electrodes 306 and 308, and radial-flow surface 320. Radial-flow surface 320 is proximate to and opposing the surface of conductor 802. The dashed line between the ground potential and conductor 802 indicates an optional electrical communication between conductor 802 and earth ground potential 304. In one embodiment, conductor 802 is on the surface on the side of object 810. In another embodiment, conductor 802 is part of the surface of object 810. In a further embodiment, object 810 is in electrical communication with conductor 802 and has the same electrical potential as conductor 802. In an embodiment, conductor 802 and object 810 are translated by conveyor belt 820 underneath atmospheric-pressure micro-plasma source 300 to cause localized plasma treatment of conductor 802 and object 810. Conveyor belt 820 supports object 810 and is an object support for object 810. In one embodiment conveyor belt 820 is electrically non-conducting. In an embodiment conveyor belt 820 is electrically conducting. In one embodiment conveyor belt and object support 820 are electrically conducting and at the same electrical potential as object 810. In one embodiment the electrical potential of conveyor belt 820 is different from the electrical potential of object 810 or conductor 802.

FIG. 8C shows an atmospheric-pressure plasma source 300 with power supply 302, matching network 318, electrodes 306 and 308, and radial-flow surface 320. Radial-flow surface 320 is proximate and opposing the surface of an object that is not rigid. The object is a web 830 that is made of polymer for example. In one embodiment, web 830 has a conductor 802 on the surface and the dashed line between the ground potential and conductor 802 indicates an optional electrical communication between conductor 802 and ground potential. In one embodiment, conductor 802 is on the surface on the side of web 830. In another embodiment, conductor 802 is a portion of the surface of web 830. In a further embodiment, web 830 is in electrical communication with conductor 802 and has the same electrical potential as conductor 802. In an embodiment, conductor 802 and web 830 are translated by any means known in the art of web transport underneath atmospheric-pressure plasma source 300 to cause localized plasma treatment of conductor 802 and web 830. In one embodiment shown in FIG. 8C, web 830 is supported and translated by means of rollers 832. In one embodiment rollers 832 are at the same electrical potential as web 830 or conductor 802. In another embodiment rollers 832 are at an electrical potential that is different from the electrical potential of web 830 or conductor 802. In one embodiment web 830 is comprised essentially of a polymer. In one embodiment web 830 is comprised essentially of metal. In one embodiment web 830 is comprised essentially of carbon fibers. In one embodiment web 830 is comprised of a composite wherein two or more chemically distinguishable materials are intermingled to form a mechanically stable web. In one embodiment atmospheric-pressure plasma source 300 can be translated in a direction perpendicular to the transport direction of the web to enable localized plasma treatment of the web surface opposing the radial-flow surface 320 of atmospheric-pressure plasma source 300. The embodiment shown in FIG. 8C is particularly useful for the surface treatment of webs of various compositions.

Figure 9:
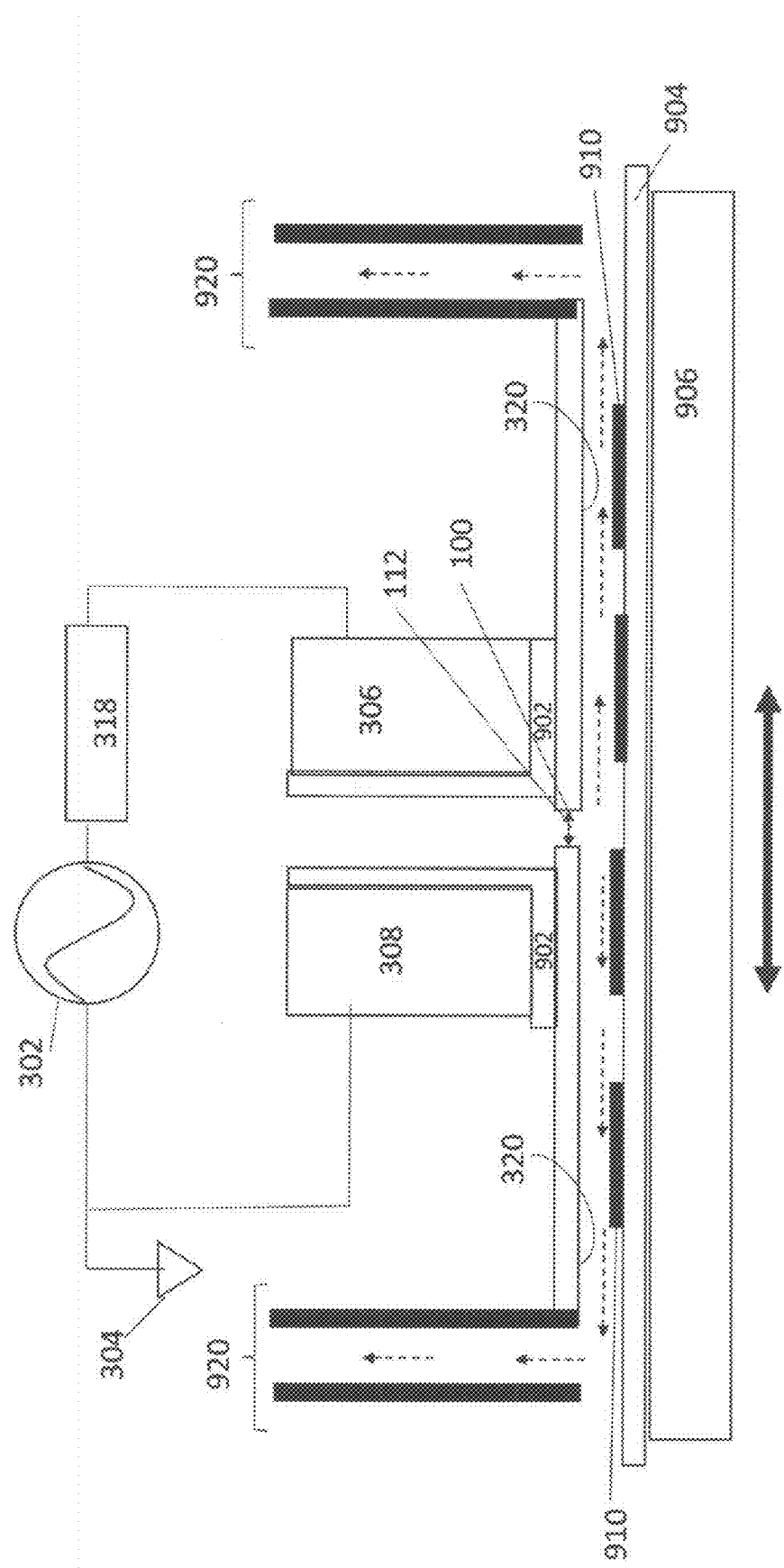
FIGS. 9 and 10 are schematic cross sections illustrating an embodiment of the present invention.

FIG. 9 shows a schematic representation of an atmospheric-pressure plasma source 300 with power supply 302, matching network 318, electrodes 306 and 308 covered by dielectric layers 902, and radial-flow surface 320 fabricated from an insulating dielectric material. In one embodiment the radial-flow surface 320 has a surface area and a jet nozzle 100 through which gas passes having a diameter 112 and cross sectional area, and the effective minimum radius of the radial-flow surface area is at least ten times greater than the diameter of the corresponding jet nozzle in the radial-flow surface. Radial-flow surface 320 is proximate and opposing the surface of web 906 with conductor 904. In one embodiment conductor 904 covers a portion of the surface of web 906. In another embodiment, there are features 910 patterned on the surface of conductor 904 or web 906. In another embodiment, features 910 are patterned on both the surface of the conductor 904 and the surface of web 906. Features 910 can be produced using either additive or subtractive processes and can be comprised of any material suitable for the intended patterning application. Examples of useful materials are polymers, composite materials, inks of all types including conductive metallic inks, photo-curable resins, electron beam curable resins and the like, curable inks forming semiconducting materials when printed, and inorganic composites like sol-gels and the like. Features 910, conductor 904 and web 906 are translated underneath the atmospheric-pressure micro-plasma source with radial-flow surface. In one embodiment a reciprocating motion is used to translate the web with its additional layers and features underneath the plasma source. In an additional embodiment, a linear motion is used to translate the web with its additional layers and features underneath the plasma source. In an embodiment the web 906, conductor 904 and features 910 can be linearly translated, the atmospheric-pressure plasma source with integrated radial-flow surface can be linearly translated, and the translation direction of the web is perpendicular to the translation direction of the plasma source. In FIG. 9 the path of the confined jet impingement of the plasma-excited reactive gas with plasma-generated gas species from the atmospheric-pressure micro-plasma source is shown by the dashed arrows. The plasma-excited reactive gas radially expands in the narrow channel defined by the radial-flow surface 320 of the atmospheric-pressure micro-plasma source and the web 906 with its conductor and features and is exhausted out two or more gas exhaust ports 920. In one embodiment the exhaust ports are connected to a sub-atmospheric-pressure source such as a manifold with an exhaust fan (not shown) that collects the plasma-excited reactive gas as it exhausts out the confinement surface boundaries. In another embodiment the exhaust ports are passive and remain at the prevailing atmospheric pressure and collect the exhaust with plasma-generated gas species in a passive fashion. In an additional embodiment, there is an additional gas flow opposing the exhaust gas from the confined jet impingement that mixes with the exhaust gas from the confined jet impingement at the confinement surface boundary and then is collected by the exhaust port 920.

Figure 10:
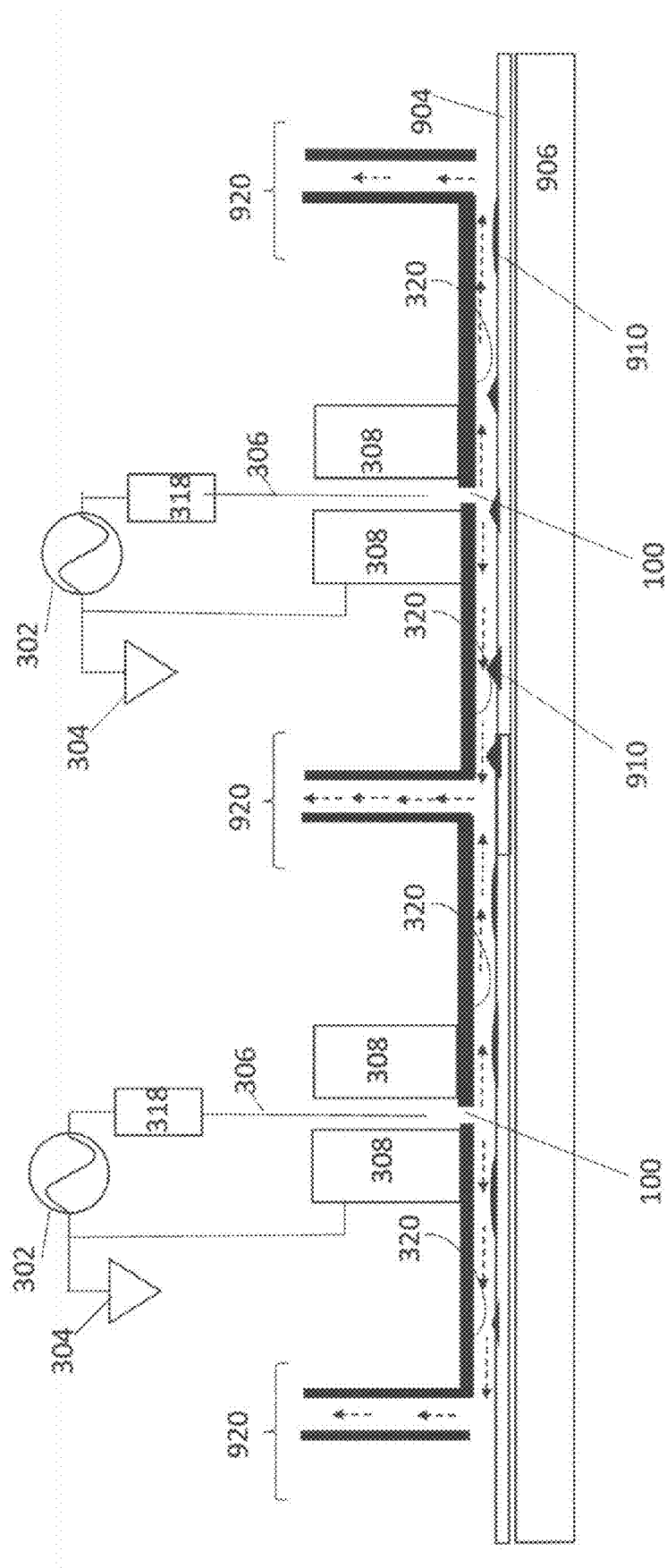

FIG. 10 is a schematic showing a plurality of atmospheric-pressure micro-plasma sources each of the plurality of plasma sources having a radial-flow surface with a surface area through which gas passes and a jet nozzle having a cross sectional area, and the effective minimum radius of the radial-flow surface area of each of the plurality of plasma sources is at least ten times greater than the diameter of the corresponding jet nozzle in each of the plurality of plasma sources; and wherein each of the plurality of plasma sources has a radial flow surface that is located adjacent to and is conforming to a different portion of the nonplanar treatment surface. In an embodiment the plurality of radial-flow surfaces have a common electrical potential. In one embodiment the distance between any of the plurality of jet nozzles and a corresponding adjacent one of the plurality of nozzles is less than or equal to two times the effective radial flow distance of any of the plurality of plasma sources. The effective radial flow distance is the distance from the jet nozzle to the confinement boundary. The embodiment shown in FIG. 10 includes two atmospheric-pressure micro-plasma sources 300 with power supplies 302, matching networks 318, electrodes 306 and 308 with electrode 306 being covered by a dielectric layer (not shown), and radial-flow surfaces 320. In one embodiment the power supplies of the plasma sources include a piezoelectric element and an AC power supply operating with a voltage amplitude less than or equal to 50 V. Radial-flow surface 320 is proximate and opposing the surface of web 906 with conductor 904. The radial-flow surfaces are held at a distance less than or equal to two times the nozzle diameter of the plasma source from the closest impingement surface, the impingement surface being either a feature 910, a portion of conductor 904, or a portion of web 906. In one embodiment conductor 904 covers a portion of the surface of web 906. In another embodiment, there are features 910 patterned on the surface of conductor 904 or web 906. In another embodiment, features 910 are patterned on both the surface of the conductor 904 and the surface of web 906. Plasma-excited reactive gas with plasma-generated gas species emanates from nozzles 100 in each plasma source and confined jet impingement occurs on features 910, conductor 904 and web 906. The plasma-excited reactive gas expands radially in the narrow confinement channel between the radial-flow surfaces 320 and the impingement surface comprised of features 910, conductor 904 and web 906. The plasma-excited reactive gas is exhausted through a plurality of gas exhaust ports 920 located between any two of the plurality of plasma sources. In an embodiment the substrate comprised of web 906 with features 910 and conductor 904 is translated with respect to the plurality of atmospheric-pressure micro-plasma sources to cause plasma treatment or plasma processing at the surface of either features 910, conductor 904, or web 906.

In another embodiment, an atmospheric-pressure plasma treatment system has a first plasma source with power supply, matching network, electrodes, dielectric layers, and integrated radial-flow surface with a first jet nozzle, the first radial-flow surface being proximate to a first surface of an object and separated from the surface of the object by a distance less than two times the diameter of the first jet nozzle wherein the treatment surface is a first treatment surface; and the object has a second treatment surface proximate to a second atmospheric-pressure micro-plasma source with power supply, matching network, electrodes, dielectric layers, and second integrated radial-flow surface with a second jet nozzle; the second radial-flow surface being proximate to a second treatment surface of the object and separated from the second surface of the object by a distance less than two times the diameter of the second jet nozzle or less than or equal to 2 mm wherein the treatment surface is a second treatment surface. In a further embodiment, each object surface is nonplanar and each plasma source has a radial-flow surface conforming to a different portion of the non-planar treatment surfaces. The embodiment disclosed above is useful for treating more than one surface simultaneously while retaining the advantages of confined jet impingement conferred by an atmospheric-pressure plasma system with an integrated radial-flow surface.

U.S. Pat. No. 8,328,982 by Babayan and Hicks titled "Low-temperature, converging reactive gas source and method of use" describes the construction of atmospheric-pressure plasma sources with a shaped gas chamber that produces a converging gas flow in the plasma generating region. U.S. Pat. No. 8,328,982 further discloses the use of a precursor distributor located at the gas outlet of the reactive gas source that is used for feeding one or more precursor chemicals to decompose and deposit a film on a workpiece placed downstream.

Figure 11A:
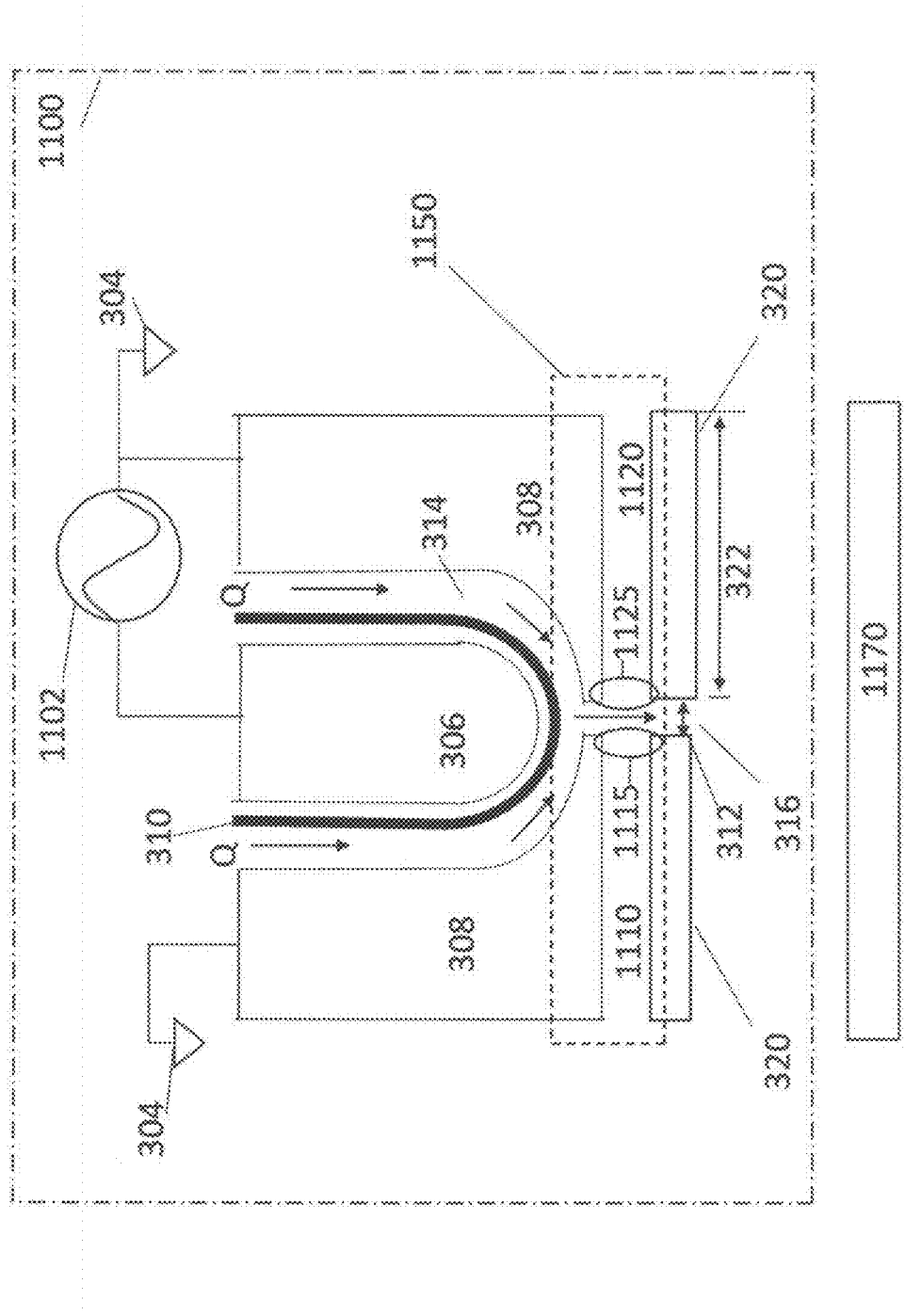
FIGS. 11A-11B are schematic cross sections illustrating an embodiment of the present invention.
Figure 11B:
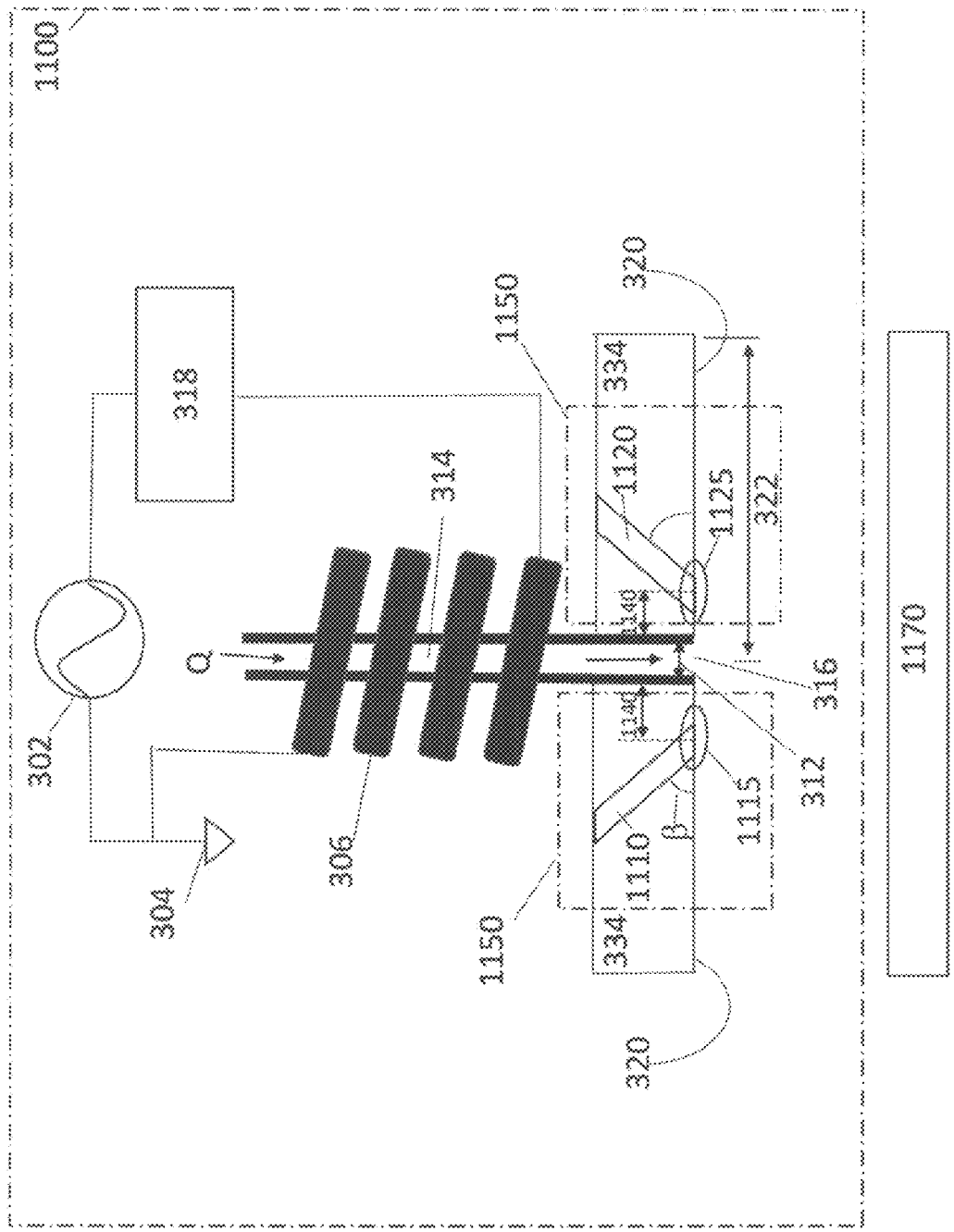

FIGS. 11A and 11B show cross-sectional views of two embodiments of an atmospheric-pressure plasma source 1100 with a radial-flow surface and a precursor distributor 1150 with a gas chamber 314 for feeding one or more precursor chemicals into the plasma-excited reactive gas flow. FIG. 11A shows one embodiment of an atmospheric-pressure plasma source 1100 with a precursor distributor 1150 and an integrated radial-flow surface for producing confined jet impingement during plasma processing. AC power supply 1102 that includes a matching network is connected to two conducting electrodes 306 and 308. In an embodiment the AC power supply is an AC power supply having a voltage amplitude that is less than or equal to 50 V and is coupled to a piezoelectric element that is a voltage multiplying transformer. Electrode 308 is grounded at earth contact 304. Electrode 306 is encapsulated by dielectric coating 310. A gas chamber 314 through which gas flow Q can flow is formed by the volume space located between electrode 306 with dielectric coating 310 and grounded electrode 308. Ground electrode 308 has a radial-flow surface 320 with a jet nozzle 316 having nozzle diameter 312. Gas chamber 314 is in fluid communication with nozzle 316. The gas flow Q is sufficient to produce a gas jet which is a collimated flow of gas with a Reynolds number greater than or equal to 2700 as the gas flows out of jet nozzle 316. In one embodiment the gas is inert. In another embodiment the gas is reactive. Radial-flow surface 320 of ground electrode 308 extends radially outward over distance 322 from the center of nozzle 316 to the confinement boundary edge of radial-flow surface 320. Radial-flow surface 320 functions as a confinement surface when atmospheric-pressure plasma source 1100 is separated from an impingement surface 1170 by distance that is less than two times the diameter of nozzle 316. The radial distance 322 (i.e. the effective minimum radius) is at least ten times the jet nozzle diameter 312. The embodiment shown in FIG. 11A shows a precursor distributor 1150 with gas chambers called tubular injectors 1110 and 1120 that are integrated directly into the ground electrode 308. The tubular injectors 1110 and 1120 can have a circular cross-section in some embodiments, but they can alternatively have a noncircular cross-section. The tubular injectors 1110 and 1120 of the precursor distributor are in fluid communication with jet nozzle 316 by means of precursor outlets 1115 and 1125 that are located upstream of the nozzle exit. The precursor distributor is also in fluid communication with at least one volatile precursor source (not shown) and a means for metering at least one volatile precursor into the precursor distributor (not shown). A gas controller is a suitable means for metering a volatile precursor into a precursor distributor. The precursor distributor 1150 allows a flow of precursor molecules to mix with the plasma-excited reactive gas flow and with the plasma-generated gas species from gas chamber outlet so the precursor molecules can decompose and interact with the opposing impingement surface 1170 during confined jet impingement. The gas chambers called tubular injectors 1110 and 1120 in ground electrode 308 are shown as normal to the jet nozzle 316 in FIG. 11A. In another embodiment of atmospheric-pressure micro-plasma source 1100, the precursor distributors are in fluid communication with jet nozzle 316 and the tubular injector gas chamber of the precursor distributors intersect nozzle 316 at the precursor outlets 1115 and 1125 at a position upstream of the nozzle exit at an angle that is different from 90 degrees. In one embodiment of the precursor distributor there is a plurality of tubular injectors and precursor outlet uniformly and radially distributed around jet nozzle 316.

In a further embodiment of an inductively coupled atmospheric-pressure micro-plasma source 1100 shown in FIG. 11B, the precursor outlets 1115 and 1125 of the precursor distributor 1150 are located in the radial-flow surface at a distance 1140 from the nozzle 316. FIG. 11B shows another embodiment of an atmospheric-pressure plasma source 1100 with a precursor distributor 1150 and an integrated radial-flow surface for producing confined jet impingement during plasma processing. Precursor distributor 1150 is integrated in block 334 along with radial-flow surface 320. AC power supply 302 is connected to a single, spiral wound conducting electrode 306 using a matching network 318. A gas chamber 314 through which gas flow Q can flow is located inside the spiral structure of electrode 306 so that the alternating electric field generated inside the spiral structure of electrode 306 can be used to excite a plasma in the flowing gas Q in gas chamber 314. The gas chamber 314 is in fluid communication with nozzle 316. The flowing gas Q exits the jet nozzle with a Reynolds number greater than or equal to 2700. Jet nozzle 316 with nozzle diameter 312 is located in radial-flow surface 320 of block 334, In one embodiment block 334 is made out of a dielectric material. In another embodiment block 334 is made out of an electrically conducting material. Radial-flow surface 320 extends radially outward over distance 322 from the center of nozzle 316 to the confinement boundary edge of surface 320 over an effective minimum radius that is at least ten times the jet nozzle diameter 312. The radial-flow surface 320 functions as a confinement surface when atmospheric-pressure plasma source 1100 is separated from an impingement surface 1170 by a distance that is less than two times the diameter of jet nozzle 316. FIG. 11B shows gas chambers called tubular injectors 1110 and 1120 that are integrated directly into block 334. In the embodiment shown in FIG. 11B, the precursor distributor has tubular injectors with precursor outlets 1115 and 1125 located in radial-flow surface 320 at a distance 1140 from the center of nozzle 316. FIG. 11B shows the tubular injectors of precursor distributor 1150 are an angle β with respect to the radial-flow surface 320. The tubular injector angle, which is β, can vary between 90 degrees and 5 degrees. The precursor distributor 1150 is also in fluid communication with at least one volatile precursor source (not shown) and has means for metering at least one volatile precursor into the precursor distributor (not shown), Unlike precursor distributors disclosed in the scientific literature, the precursor outlets of the tubular injectors of the precursor distributor are not located upstream of the jet producing jet nozzle 316 but rather are laterally positioned on the same radial-flow surface. Unlike U.S. Pat. No. 8,328,982, in the example shown in FIG. 11B the precursor outlets of the tubular injectors 1110 and 1120 of the precursor distributor 1150 are not located directly downstream of the jet producing jet nozzle 316 but rather are laterally positioned with respect to the jet nozzle 316 on the same radial-flow surface. In an embodiment, the tubular injectors with precursor outlets of the precursor distributor are positioned in such a way as to produce a precursor-containing gas jet (a collimated flow of gas) that is normal to the radial-flow surface with the tubular injector angle β that is equal to 90 degrees. In a further embodiment, the tubular injector gas chambers with precursor outlets of the precursor distributor are positioned in such a way as to produce a precursor-containing gas jet that is tilted with respect to the radial-flow surface with the tubular injector angle β that is not equal to 90 degrees.

The precursor distributor 1150 allows a flow of precursor molecules to mix with the plasma-excited reactive gas flow from gas chamber outlet so the precursor molecules can decompose and interact with the opposing confinement surface during confined jet impingement. Referring back to FIG. 5, it is clearly shown that a sub-atmospheric-pressure region is formed around the jet nozzle 316 during confined jet impingement when the effective minimum radius of the radial-flow surface of the atmospheric-pressure micro-plasma source with radial-flow surface is at least ten times larger than the jet diameter and the radial-flow surface used as a confining surface and the gap distance between the two confining surfaces is less than two times the diameter of nozzle 316. In one embodiment of the atmospheric-pressure micro-plasma source with integrated radial-flow surface and precursor distributor shown in FIG. 11B it is advantageous to locate the radial position 1140 of the precursor outlets 1115 and 1125 of the precursor distributor 1150 that are in the radial-flow surface of the atmospheric-pressure plasma source with integrated radial-flow surface so that the precursor outlets 1115 and 1125 of the precursor distributor 1150 are radially positioned within the sub-atmospheric-pressure zone produced during confined jet impingement. The sub-atmospheric-pressure zone produced during confined jet impingement improves the cleanliness and ease of precursor chemical injection through the precursor distributor because of the reduced pressure and the recirculation flows proximate to the radial-flow surface combined with the increased fluid velocity in the sub-atmospheric-pressure zone result in rapid mixing and transport of the precursor chemicals and plasma-excited reactive gas to the opposing impingement surface. Referring to FIG. 4, where it is demonstrated that confined jet impingement with an atmospheric-pressure plasma source with integrated radial-flow surface minimizes atmospheric contamination during processing, it is also clear that there is a further improvement in atmospheric-pressure plasma processing with volatile precursors during confined jet impingement because atmospheric contamination due to entrainment of the surrounding ambient environment during plasma processing is eliminated during confined jet impingement. Thus, an atmospheric-pressure plasma source with integrated radial-flow surface and precursor distributor offers significant advantages over the existing art.

The apparatuses of FIG. 11A and FIG. 11B are useful for plasma-enhanced or plasma-assisted surface modification of an impingement surface using confined jet impingement. In one embodiment, an atmospheric-pressure plasma treatment system is comprised of a plasma source including an AC power supply, at least one electrode, and a gas in a gas chamber, a jet nozzle through which the gas flows and is directed to a radial-flow surface, and a pre-cursor distributor for feeding one or more precursor chemicals into the gas flow with a precursor outlet. In one embodiment the precursor outlet is upstream of the jet nozzle. The gas that is used with the atmospheric-pressure plasma treatment system and flows through the gas chamber can be inert or reactive.

In one embodiment a reactive gas is formed in-situ inside a gas chamber proximate to at least one electrode when a plasma is lit in the region of the gas chamber that is proximate to at least one electrode. In another embodiment, the atmospheric-pressure plasma treatment system further includes first and second gases and the gas chamber includes a gas flow controller—like, for example, a gas mass flow controller apparatus—that controls the flow of the first gas and the flow of the second gas. In one embodiment the first gas is different from the second gas. In an embodiment the first gas is an inert gas and the second gas is a reactive gas. In an embodiment the second gas is a gas mixture. The means of gas flow control can be used to vary the gas in the gas chamber. In a further embodiment of the atmospheric-pressure plasma treatment system with integrated radial-flow surface the gas-flow controller controls the first gas to flow through the jet nozzle in the radial-flow surface at a first time and then controls the second gas to flow through the jet nozzle in the radial-flow surface at a second time after the first time or vice versa. In one embodiment of the atmospheric-pressure plasma treatment system with integrated radial-flow surface the first gas is an inert gas and the second gas is a reactive gas. In another embodiment, the first gas that is reactive is a plasma-excited reactive gas and the second gas is a reactive gas that reacts with the first gas. In an embodiment the second gas is fed to a precursor distributor. In one embodiment the precursor distributor for feeding one or more precursor chemicals into the gas flow is downstream of the plasma zone in the atmospheric-pressure plasma source and upstream of the jet nozzle in the radial-flow surface. In another embodiment the atmospheric-pressure plasma treatment system with integrated radial-flow surface and precursor distributor includes a first gas chamber for a first gas and a second gas chamber for a second gas. In a further embodiment the second gas chamber for the second gas is part of the precursor distributor. In another embodiment the second gas chamber is a tubular injector. In yet another embodiment of the atmospheric-pressure plasma treatment system with integrated radial-flow surface the gas-flow controller controls the first and second gases to form a bubble of the second gas within the first gas. In a different embodiment of the atmospheric-pressure plasma treatment system with integrated radial-flow surface the system includes including a gas mixing chamber in the gas chamber and wherein the gas-flow controller controls the first gas to mix with the second gas within the gas mixing chamber. In another embodiment, of the atmospheric-pressure plasma treatment system with integrated radial-flow surface and precursor distributor the gas-flow controller controls the first gas to mix with the second gas within a jet nozzle in the radial-flow surface and in a further embodiment the flow of gas from the jet nozzle is a collimated flow of gas that is used for confined jet impingement. In an embodiment of the atmospheric-pressure plasma treatment system with integrated radial-flow surface and precursor distributor the gas-flow controller controls the first gas to mix with the second gas in a narrow confinement channel between the radial-flow surface and the opposing impingement surface of the object to be treated. In a further embodiment, the precursor outlet of the second gas chamber is on the radial-flow surface. In yet a further embodiment, the precursor outlet of the second gas chamber is located on the radial-flow surface within the sub-atmospheric-pressure zone produced during confined jet impingement. In a further embodiment of the atmospheric-pressure plasma treatment system with integrated radial-flow surface and precursor distributor has a plasma source that includes a piezoelectric transformer element and the AC power supply operating at the transformer resonant frequency has a peak-to-peak voltage that is less than or equal to 50 volts in amplitude or less than or equal to 100 volts peak-to-peak.

In another embodiment, an atmospheric-pressure plasma treatment system has multiple atmospheric-pressure plasma sources with integrated radial-flow surfaces and precursor distributors wherein there is a first plasma source with a first radial-flow surface and a first jet nozzle, and a gas that is a first gas. The system further includes a second plasma source having a second radial-flow surface having a second jet nozzle through which a second gas passes. The first and second gasses can be the same or different. In one embodiment the first gas is different from the second gas. In one embodiment of an atmospheric-pressure plasma treatment system having multiple atmospheric-pressure plasma sources with integrated radial-flow surfaces and precursor distributors a first plasma source is located to provide a first plasma with confined jet impingement to a first side of an object and the second plasma source is located to provide a second plasma with confined jet impingement to a second side of the object.

Example 3

Figure 12A:
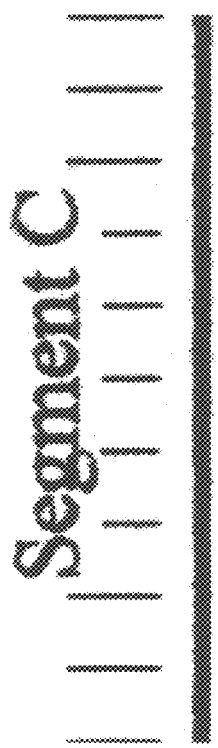
FIGS. 12A-12D are graphs illustrating quality improvements in systems incorporating embodiments of the present invention.

Example 3 demonstrates etching and sterilization of surfaces using an atmospheric-pressure plasma source with a micro-plasma and a radial-flow surface with confined jet impingement. In a useful application and demonstration of the present invention, an atmospheric-pressure micro-plasma system with confined jet impingement is used to clean residue from an object. The object in this example is a continuous inkjet printhead having a non-planar surface similar to non-planar surface 702 in FIG. 7. This example illustrates the use of an atmospheric-pressure micro-plasma source with an integrated radial-flow surface to clean a failed printhead from a Kodak Prosper™ continuous inkjet printer so that the printhead could be reused. A continuous inkjet printhead is also called a jetting module and the two terms are used interchangeably. The Kodak Prosper™ printhead in these examples was a commercially available jetting module that had been run for over 4000 hours and was removed from the printing press because the accuracy of the print drop placement had degraded to an unacceptable level. The jetting module had previously been extensively flushed and swabbed with no improvement in printing quality and so was submitted for plasma cleaning. Optical examination of the printhead showed a large amount of residue around the printhead nozzles that was influencing the straightness of the fluid jets used to make print drops. A test pattern print was made on a print stand with ink to record the state of the print head before plasma cleaning. The test pattern print showing the initial state of the jetting module is shown in FIG. 12A. After the test pattern print the printhead was flushed with a commercial flushing fluid (Kodak FF8602) to remove residual ink in the printhead before cleaning the printhead nozzle plate with an atmospheric-pressure plasma system equipped with a micro-plasma source using confined jet impingement of the present invention. After each cleaning fluid flushing operation the excess fluid on the nozzle plate and surrounding surface was removed by exposing the surfaces to a 30 psig high purity filtered nitrogen gas jet to blow off the excess fluid.

The printhead was placed in a holder with the nozzle plate facing upwards. The holder, in turn was mounted to a translation stage enabling the jetting module to be translated underneath the radial-flow surface of an atmospheric-pressure micro-plasma source. Mild reduced pressure (1" Hg) was applied to the ink exit port of the printhead and the internal cavities of the printhead were held at sub-atmospheric pressure during the plasma cleaning process. The printhead surface facing upwards is a non-planar surface including an underlying steel support section bonded to a silicon nozzle plate that, in turn, includes an array of encapsulated wired bonds that provide electrical connection to a flexible electrical interface. The non-planar top surface of the jetting module is a reproducible topography from jetting module to jetting module.

An atmospheric-pressure micro-plasma source similar to that shown in FIG. 3A was constructed using titanium metal as the construction material for electrodes 306 and 308. Electrode 306 was the driven high-voltage electrode and differed from FIG. 3A in that a sharpened tip was machined in place of the rounded tip on the end of electrode 306 that was located nearest nozzle 316. The insulator sheath 310 covering electrode 306 was fabricated from a vitreous quartz capillary having an OD of 0.112" (2.84 mm). The outside diameter of the gas chamber 314 was 0.2" (5.08 mm). The gap through which the gas in the gas chamber flowed had a radial dimension of 1.1 mm. The capacitively coupled plasma generated in the gas chamber is, therefore, a micro-plasma because one of its dimensions—the annular thickness of the plasma layer between the electrodes—is, at all times, less than 2 mm. The nozzle diameter 312 of nozzle 316 was 0.031 inches (0.787 mm) and the minimum radius from the center of the nozzle to the outside edge of the radial-flow confinement surface was 21.9 mm. The silicon nozzle plate of the jetting module has an array of inkjet nozzles that are between 9 and 10 microns in diameter and the inkjet nozzles in the jetting module nozzle plate are much smaller than the plasma-jet nozzle diameter of 787 microns and so have little or no effect on the flow characteristic of confined jet impingement. The radial-flow surface of the atmospheric-pressure micro-plasma source was machined to follow the contours of the jetting module surface topography so that the top surface of the jetting module and the radial-flow surface of the plasma source were topographically conformal. The cross-sectional view shown in FIG. 7 is similar to the cross-sectional topography of the inkjet printhead and the topographically conformal radial-flow surface of the atmospheric-pressure micro-plasma source. The radial-flow surface effective minimum radius is greater than ten times the diameter of the jet nozzle. The atmospheric-pressure plasma treatment system used here is an embodiment of a plasma treatment system wherein the radial flow is radially symmetric along at least a portion of the nonplanar treatment surface and the radial-flow surface.

The plasma source was load-matched to an ENI power amplifier (model 350L) through a custom-built powdered iron ring core transformer. The sinusoidal driving waveform for the plasma source was supplied by a Keithley model 3390 waveform generator. The plasma source was used to generate an argon-oxygen plasma at 1.58 MHz. Power measurements during cell operation were done with a Tektronix model TDS 2024B digital oscilloscope. Secondary voltage at the high-voltage electrode was measured using a Tektronix model P6015A high-voltage probe (1000:1 step down probe) and the secondary current in the cell was measured with an inductive current transformer (Pearson wide-band current monitor model 4100, 1V/1 A output, Pearson Electronics, Palo Alto, Calif.). The dissipated power in the plasma was measured by calculating the mean value of the instantaneous product of secondary current and secondary voltage over several waveform cycles. The digital oscilloscope was used to do the calculation in real time using the oscilloscope functions to calculate the mean value of the waveform generated by the product of the instantaneous voltage and the instantaneous current. As is customary with DOSC dissipated-power measurements, the time base of the DOSC was adjusted so that a sufficient number of waveforms were used to obtain a good estimate of the dissipated power. In practice, the DOSC timebase should be adjusted so that at least five complete waveforms are used for the dissipated-power calculation. The dissipated power in the plasma was held constant between 25 and 35 watts during all cleaning examples. The gas flow to the plasma cell was controlled by mass flow controllers (a Tylan RO-28 4 channel-control unit equipped with Tylan model 260 series mass-flow controllers). The gas mixture flowing into the gas chamber of the atmospheric-pressure plasma source was 1% oxygen in argon. The argon (99.9% industrial grade) flow rate was 7 slpm and the oxygen (industrial grade) flow rate was 70 sccm.

The plasma source was aligned relative to the inkjet nozzles on the jetting module so that the plasma jet nozzle in the radial-flow surface of the plasma source was sitting directly over the inkjet nozzles in the jetting module nozzle array of 2560 nozzles to within +−100 microns. A micrometer was used to set a gap height of 250 microns between the jetting module surfaces and the conformal radial-flow surface of the atmospheric-pressure plasma source. The 250 micron gap height is less than 2 times the jet nozzle diameter (2 times 787 microns) of the radial-flow surface nozzle.

A plasma cleaning sequence was executed as follows: The internal cavities of the jetting module were placed under sub-atmospheric pressure of 1" Hg; The gas flow was initiated in the atmospheric-pressure micro-plasma source; power was applied to light the plasma and the plasma power was adjusted to between 25 and 35 W dissipated secondary power; the jetting module was translated underneath the radial-flow surface with a confinement surface spacing of 250 microns so that the confined jet impingement of the plasma excited reactive argon-oxygen gas occurred on the nozzle plate of the jetting module around the location of the inkjet nozzles on the jetting module. The translation speed of the jetting module under the atmospheric-pressure plasma source was 0.4 mm/sec and the jetting module was translated underneath the radial-flow surface of the atmospheric-pressure plasma source so that the entire length of the jetting module nozzle array was exposed to confined jet impingement of the argon-oxygen plasma jet 4 times during each confined jet impingement plasma cleaning sequence. In other words, the atmospheric-pressure argon-oxygen plasma source with confined jet impingement was scanned over the jetting module nozzle array a total of four times. At the end of each plasma cleaning step the jetting module surface was sterile because of exposure to the plasma generated reactive oxygen species and visual examination of the jetting module surface with optical microscopy showed clear evidence that material was being etched off the surface. After each cleaning sequence the jetting module was reflushed with a commercial jetting module cleaning fluid (Kodak FF8602) and a qualitative assessment of the straightness of the fluid jets was made before determining whether to proceed with making a print to determine print quality. If the straightness of the fluid jets was unacceptable then the jetting module was subjected to another plasma cleaning sequence.

Figure 12B:
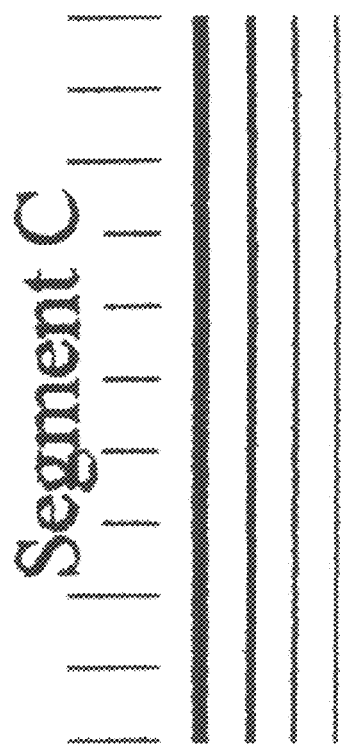
Figure 12C:
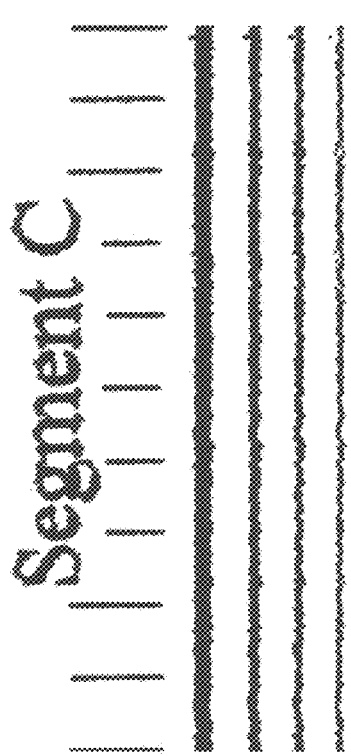
Figure 12D:
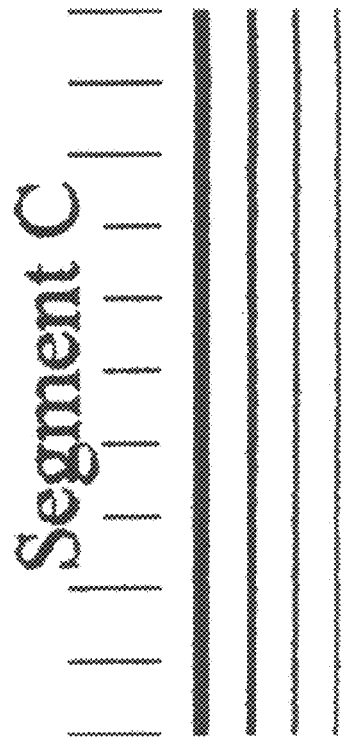

After three plasma cleaning and flushing sequences a test pattern was printed with the jetting module to determine whether the printing performance of the printhead had improved. The second test-pattern print is shown in FIG. 12B. The printhead was then resubmitted for two additional plasma cleaning sequences and a new test-pattern print was made. The third test pattern thus obtained is shown in FIG. 12C. After the third test-pattern print the jetting module was again resubmitted for two additional plasma cleaning sequences and another test-pattern print was made to give a total of 4 test-pattern prints. The last test-pattern print in the plasma cleaning sequence is shown in FIG. 12D. FIGS. 12A to 12D show the improvement in drop placement that was achieved by plasma cleaning the jetting module with an argon oxygen plasma using an atmospheric-pressure micro-plasma source with an integrated radial-flow surface and confined jet impingement. An examination of the straightness of the horizontal lines in FIGS. 12B, 12C, and 12D in comparison to 12A shows a dramatic improvement in the ability of the jetting module to print straight lines after the flushing and plasma cleaning of the nozzle plate. Optical examination of the nozzle plate surface of the jetting module with a microscope showed that virtually all of the organic residues on the jetting module surface had been removed and that the surface appeared nearly identical to a jetting module nozzle plate surface that had never been exposed to ink. The quality of the plasma cleaned jetting module was judged to be good enough to allow return of the jetting module to a printing press for further evaluation.

Biocompatible Surfaces

Mikhopadhyay, Roy, D'sa, Mathur, Holmes, and McLaughlin (S. Mikhopadhyay, S. S. Roy, R. A D'sa, A. Mathur, R. J. Holmes, and J. A. McLaughlin, Nanoscale Research Letters, 2011, 6:411) discuss the importance of surface modification to control capillary wetting and capillary flow in microfluidic devices. Their work demonstrates that the introduction of oxygen and nitrogen surface modification into the channels of a microfluidic device improves the overall fluid throughput by reducing the contribution of the fluid-surface contact angle that determines the capillary pressure in the device. The authors conclude that this effect is useful for bioengineering of devices. Iza et al (F. Iza, G. J. Kim, S. M. Lee, J. K. Lee, J. L Walsh, Y. T. Zhang, and M. G. Kong, Plasma Processes and Polymers, 2008, 5, 322-344) discuss the use of micro-plasma sources for biomedical applications focusing specifically on the use of micro-plasma technology for decontamination and sterilization because the plasma-produced species are both bactericidal as well as virucidal and points out that atmospheric-pressure micro-plasmas are also useful for blood coagulation, tissue ablation, apoptic induction of cancer cells, DNA extraction, cell adhesion control, DMA transfection, and wound healing. The atmospheric-pressure micro-plasma source with integrated radial-flow surface can be used to produce reactive oxygen species for etching and sterilization has already been disclosed in example 3.

Siow, Britcher, Kumar, and Griesser (Plasma Processes and Polymers, 2006, 3, 392-418) have discussed plasma methods for the generation of chemically reactive surfaces for biochemical applications and pointed out that amine functional groups find wide-spread biological application because of their utility in bio-interfacial applications. Amine functional groups are not easily formed using atmospheric-pressure plasma discharges on polymers except when the discharge is completely enclosed in an inert atmosphere. Example 4 below demonstrates that the use of confined jet impingement of a plasma jet containing atomic nitrogen can generate nitrogen containing functional groups on a polymer surface, thereby improving the biocompatibility of the surface. The nitrogen surface modification can be accomplished without any supplemental enclosure of the substrate, thereby simplifying equipment required for the generation of biocompatible surfaces. The example 4 below discloses an atmospheric-pressure micro-plasma source with integrated radial-flow surface used to produce reactive nitrogen species for surface modification to prepare biocompatible surfaces.

Example 4

Example 4 illustrates surface modification of a polymer substrate to generate biocompatible functional groups using an atmospheric-pressure plasma system with a micro-plasma and a radial-flow surface and confined jet impingement.

A piece of amorphous polyethylene naphthalate (A-PEN) polymer substrate was place on a vacuum chuck that was translated underneath the atmospheric-pressure micro-plasma source of example 1 using a gap of 300 microns. The flow rate of argon was 7 slpm and the flow rate of oxygen or nitrogen was 70 sccm giving a gas mixture of 1% nitrogen or oxygen in argon. The plasma was lit and the frequency was adjusted to 1.67 MHz with a dissipated secondary power of 15 W. The polymer substrate was translated underneath the micro-plasma source and the sample was immediately removed and transferred into an -ray photoelectron spectrometer for changes in surface elemental concentration. -ray photoelectron spectroscopy survey scans showed that new surface chemistry was introduced into the surface of the polymer substrate during confined jet impingement of the substrate surface with the plasma excited reactive nitrogen-argon or oxygen-argon gas mixture. The results are shown in table 1 below:

TABLE ONE

| Sample ID | % ATOMIC CONCENTRATION | | |
| --- | --- | --- | --- |
| | % Carbon | % Oxygen | % Nitrogen |
| 4A Ref | 73.01 | 22.90 | 0.41 |
| 4B (Argon + Oxygen) | 46.57 | 44.21 | 0.72 |
| 4C (Argon) | 56.53 | 37.26 | 0.58 |
| 4D (Argon + Nitrogen) | 52.73 | 24.56 | 13.68 |

Sample 4B shows oxygen enrichment relative to the untreated reference surface 4A. Sample 4D shows nitrogen enrichment relative to the untreated reference surface 4A. The changes in surface composition of the polymer web suggest that the atmospheric-pressure plasma system with integrated radial-flow surface can be used to generate hydrophilic biocompatible surfaces. In another embodiment the inventive plasma system with confined radial flow can be used with treatment surfaces that are biocompatible for cleaning and sterilization or alternatively with treatment surfaces like polypropylene that become biocompatible after treatment. Sterilization, cleaning, and etching can be accomplished using an oxygen based atmospheric-pressure plasma while retaining biocompatibility of the surface. The UV emissions of nitrogen-based argon-nitrogen atmospheric plasmas are also useful for their virucidal properties in addition to retaining biocompatibility of surfaces that are susceptible to nitrogen functionalization.

An exhaustive set of all possible embodiments of the invention herein disclosed is impractical. Other embodiments of the present invention and disclosed inventive concepts that have not been disclosed herein are within the scope and spirit of the present invention. Thus, the invention has been described in detail with particular reference to certain preferred embodiments thereof, but it will be understood that variations and modifications can be effected within the spirit and scope of the invention.

PARTS LIST 100 nozzle
102 impingement surface
104 impingement zone
106 confinement surface
110 separation distance
112 nozzle diameter
114 radial distance
116 confinement surface gap
118 confinement boundary
203 stagnation zone
204 jet wall 206 transition zone
208 laminar flow zone
250 effective minimum radius
255 circular area
260 radial distance
270 radial distance
300 plasma source
302 power supply
304 contact
306 electrode
308 electrode
310 dielectric coating
312 nozzle diameter
314 gas chamber
316 jet nozzle
318 network
320 radial-flow surface
322 distance
330 AC power supply
334 block
340 piezo-electric transformer
360 housing
602 robot
604 object
606 planar surface
610 translation unit
700 jet nozzle
702 non-planar surface
704 non-planar object
706 radial-flow surface
710 separation distance
712 jet nozzle diameter
714 distance
716 surface gap
802 conductor
810 object
820 conveyor belt
830 web
832 rollers
902 dielectric layers
904 conductor
906 web
910 features
920 exhaust port
1100 atmospheric-pressure plasma source
1102 AC power supply
1110 tubular injector
1115 Precursor outlet
1120 tubular injector
1125 precursor outlet
1140 distance
1150 precursor distributor
1170 impingement surface
1302 object
1304 pedestal
1306 translation stage

The invention claimed is:

1. An atmospheric-pressure plasma treatment system, comprising:
    a plasma source including at least one electrode, a gas in a gas chamber, and an AC power supply that supplies power to the at least one electrode to form a plasma in the gas; and
    a radial-flow surface having a jet nozzle through which the gas flows, the jet nozzle having a nozzle diameter, wherein the radial-flow surface has a surface profile that conforms to a nonplanar treatment surface of an object, the radial-flow surface separated from the nonplanar treatment surface by a gap that is less than two times the nozzle diameter so that the gas flows radially outward from the nozzle and between the radial-flow surface and the nonplanar treatment surface.

2. The atmospheric-pressure plasma treatment system of claim 1, wherein the radial-flow surface is an electrode.

3. The atmospheric-pressure plasma treatment system of claim 1, wherein the radial-flow surface is flexible and topographically compliant.

4. The atmospheric-pressure plasma treatment system of claim 1, wherein the AC power supply is a tunable power supply.

5. The atmospheric-pressure plasma treatment system of claim 4, wherein the tunable power supply operates between 1 kHz and 1 GHz.

6. The atmospheric-pressure plasma treatment system of claim 1, wherein the electrode is a first electrode and the plasma source further includes a second electrode.

7. The atmospheric-pressure plasma treatment system of claim 6, wherein either the first electrode or the second electrode is covered by a dielectric coating.

8. The atmospheric-pressure plasma treatment system of claim 1, wherein the gas includes one or more of helium, neon, argon, krypton, nitrogen, oxygen or a mixture thereof.

9. The atmospheric-pressure plasma treatment system of claim 1, wherein the object is an inkjet printhead.

10. The atmospheric-pressure plasma treatment system of claim 1, wherein the object is not rigid.

11. The atmospheric-pressure plasma treatment system of claim 1, wherein the object includes a web.

12. The atmospheric-pressure plasma treatment system of claim 1, wherein the nonplanar treatment surface includes a polymer.

13. The atmospheric-pressure plasma treatment system of claim 1, further including a plurality of plasma sources, each plasma source having a radial-flow surface conforming to a different portion of the nonplanar treatment surface.

14. The atmospheric-pressure plasma treatment system of claim 1, wherein the gas includes plasma-generated gas species.

15. The atmospheric-pressure plasma treatment system of claim 14, wherein the confined radial flow of gas extends over only a portion of the nonplanar treatment surface.

16. The atmospheric-pressure plasma treatment system of claim 14, wherein the nonplanar treatment surface is electrically conductive or the radial-flow surface is electrically conductive.

17. The atmospheric-pressure plasma treatment system of claim 1, wherein the plasma source is a first plasma source, the radial-flow surface is a first radial-flow surface, the jet nozzle is a first nozzle, and the gas is a first gas; and
    further including a second plasma source having a second radial-flow surface having a second jet nozzle through which a second gas passes.

18. The atmospheric-pressure plasma treatment system of claim 17, wherein the first plasma source is located to provide a first confined jet impingement to a first side of an object and the second plasma source is located to provide a second confined jet impingement to a second side of the object.

19. The atmospheric-pressure plasma treatment system of claim 17, wherein the first gas is a different gas than the second gas.

20. The atmospheric-pressure plasma treatment system of claim 1, wherein the plasma source includes three electrodes.

21. The atmospheric-pressure plasma treatment system of claim 1, wherein the radial flow is radially symmetric along at least a portion of the nonplanar treatment surface and the radial-flow surface.

22. The atmospheric-pressure plasma treatment system of claim 1, wherein the gap is substantially constant.

23. The atmospheric-pressure plasma treatment system of claim 1, wherein the radial-flow surface has a minimum radius of greater than five times the nozzle diameter of the jet nozzle.

24. The atmospheric-pressure plasma treatment system of claim 1, wherein the radial-flow surface has a minimum radius of greater than ten times the nozzle diameter of the jet nozzle.

25. The atmospheric-pressure plasma treatment system of claim 1, wherein gas flow exiting the jet nozzle has a Reynolds number of greater than 2700.

26. An atmospheric-pressure plasma treatment system, comprising:

a plasma source including at least one electrode, a gas in a gas chamber, and an AC power supply that supplies power to the at least one electrode to form a plasma in the gas; and a radial-flow surface having a jet nozzle through which the gas flows, the jet nozzle having a nozzle diameter, wherein the radial-flow surface has a surface profile that conforms to a nonplanar treatment surface of an object, the radial-flow surface separated from the nonplanar treatment surface by a gap that is less than two times the nozzle diameter so that the gas flows radially outward from the nozzle and between the radial-flow surface and the nonplanar treatment surface;

wherein the plasma source includes a piezoelectric element and the AC power supply has a voltage amplitude that is less than or equal to 50 volts.

* * * * *